(12) United States Patent
Yamazaki et al.

(10) Patent No.: US 9,705,003 B2
(45) Date of Patent: Jul. 11, 2017

(54) SEMICONDUCTOR DEVICE INCLUDING FIRST AND SECOND GATE ELECTRODES AND STACK OF INSULATING LAYERS

(71) Applicant: Semiconductor Energy Laboratory Co., Ltd., Atsugi-shi, Kanagawa-ken (JP)

(72) Inventors: Shunpei Yamazaki, Setagaya (JP); Takayuki Abe, Shimotsuga (JP); Hideaki Shishido, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/677,071

(22) Filed: Apr. 2, 2015

(65) Prior Publication Data

US 2015/0214379 A1 Jul. 30, 2015

Related U.S. Application Data

(63) Continuation of application No. 12/730,288, filed on Mar. 24, 2010, now Pat. No. 9,012,918.

(30) Foreign Application Priority Data

Mar. 27, 2009 (JP) .................................. 2009-080202

(51) Int. Cl.
*H01L 27/14* (2006.01)
*H01L 29/786* (2006.01)
(Continued)

(52) U.S. Cl.
CPC ...... *H01L 29/7869* (2013.01); *H01L 27/1225* (2013.01); *H01L 27/3248* (2013.01);
(Continued)

(58) Field of Classification Search
CPC ............... H01L 27/124; H01L 27/1214; H01L 27/1225; H01L 29/7869; H01L 27/1222;
(Continued)

(56) References Cited

U.S. PATENT DOCUMENTS 5,079,606 A   1/1992   Yamamura et al.
5,371,398 A   12/1994  Nishihara
(Continued)

FOREIGN PATENT DOCUMENTS

CN   001328270 A   12/2001
CN   001886770 A   12/2006
(Continued)

OTHER PUBLICATIONS

Takahashi.K et al., "4p-N-10 Back-channel control in amorphous In—Ga—Zn—O TFTs", 69th Japan Society of Applied Physics, Sep. 1, 2008, No. 2, p. 851.
(Continued)

*Primary Examiner* — Cory Eskridge
(74) *Attorney, Agent, or Firm* — Robinson Intellectual Property Law Office; Eric J. Robinson

(57) ABSTRACT

The threshold voltage is shifted in a negative or positive direction in some cases by an unspecified factor in a manufacturing process of the thin film transistor. If the amount of shift from 0 V is large, driving voltage is increased, which results in an increase in power consumption of a semiconductor device. Thus, a resin layer having good flatness is formed as a first protective insulating film covering the oxide semiconductor layer, and then a second protective insulating film is formed by a sputtering method or a plasma CVD method under a low power condition over the resin layer. Further, in order to adjust the threshold voltage to a desired value, gate electrodes are provided over and below an oxide semiconductor layer.

27 Claims, 28 Drawing Sheets

(51) Int. Cl.
   *H01L 27/12* (2006.01)
   *H01L 27/32* (2006.01)
   *H01L 29/423* (2006.01)

(52) U.S. Cl.
   CPC .. *H01L 29/42376* (2013.01); *H01L 29/42384* (2013.01); *H01L 29/78606* (2013.01); *H01L 29/78645* (2013.01); *H01L 29/78648* (2013.01)

(58) Field of Classification Search
   CPC ......... H01L 29/78696; H01L 29/42384; H01L 29/4908; H01L 21/02565; H01L 29/78693; H01L 27/3244; H01L 27/3248; H01L 27/3262
   See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 5,859,677 | A | 1/1999 | Watanabe et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,730,970 | B1 | 5/2004 | Katoh et al. |
| 6,734,505 | B2 | 5/2004 | Suzuki et al. |
| 6,864,508 | B2 | 3/2005 | Yamazaki et al. |
| 6,952,023 | B2 | 10/2005 | Yamazaki et al. |
| 7,002,181 | B2 | 2/2006 | Suzuki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,075,614 | B2 | 7/2006 | Izumi et al. |
| 7,094,684 | B2 | 8/2006 | Yamazaki et al. |
| 7,105,868 | B2 | 9/2006 | Nause et al. |
| 7,157,321 | B2 | 1/2007 | Arao et al. |
| 7,211,825 | B2 | 5/2007 | Shih et al. |
| 7,259,045 | B2 | 8/2007 | Dejima |
| 7,265,390 | B2 | 9/2007 | Yamazaki et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,435,633 | B2 | 10/2008 | Todorokihara et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,485,896 | B2 | 2/2009 | Yamazaki et al. |
| 7,501,293 | B2 | 3/2009 | Ito et al. |
| 7,528,410 | B2 | 5/2009 | Arao et al. |
| 7,564,058 | B2 | 7/2009 | Yamazaki et al. |
| 7,566,904 | B2 | 7/2009 | Ishii |
| 7,585,698 | B2 | 9/2009 | Ishii |
| 7,585,761 | B2 | 9/2009 | Yamazaki et al. |
| 7,633,090 | B2 | 12/2009 | Ishii |
| 7,674,650 | B2 | 3/2010 | Akimoto et al. |
| 7,732,251 | B2 | 6/2010 | Hoffman et al. |
| 7,732,819 | B2 | 6/2010 | Akimoto et al. |
| 7,763,490 | B2 | 7/2010 | Dejima |
| 7,772,021 | B2 | 8/2010 | Lee et al. |
| 7,781,964 | B2 | 8/2010 | Hara et al. |
| 7,829,444 | B2 | 11/2010 | Yabuta et al. |
| 7,910,490 | B2 | 3/2011 | Akimoto et al. |
| 7,932,521 | B2 | 4/2011 | Akimoto et al. |
| 7,939,822 | B2 | 5/2011 | Maekawa et al. |
| 7,960,730 | B2 | 6/2011 | Lee et al. |
| 7,982,215 | B2 | 7/2011 | Inoue et al. |
| 8,030,195 | B2 | 10/2011 | Inoue et al. |
| 8,064,003 | B2 | 11/2011 | Ohmi et al. |
| 8,067,775 | B2 | 11/2011 | Miyairi et al. |
| 8,133,749 | B2 | 3/2012 | Eguchi |
| 8,134,156 | B2 | 3/2012 | Akimoto |
| 8,143,115 | B2 | 3/2012 | Omura et al. |
| 8,148,721 | B2 | 4/2012 | Hayashi et al. |
| 8,158,464 | B2 | 4/2012 | Akimoto |
| 8,203,144 | B2 | 6/2012 | Hoffman et al. |
| 8,212,953 | B2 | 7/2012 | Hosoya |
| 8,274,077 | B2 | 9/2012 | Akimoto et al. |
| 8,354,674 | B2 | 1/2013 | Kimura |
| 8,368,079 | B2 | 2/2013 | Akimoto |
| 8,466,463 | B2 | 6/2013 | Akimoto et al. |
| 8,525,165 | B2 | 9/2013 | Akimoto |
| 8,566,502 | B2 | 10/2013 | Vaghani |
| 8,647,031 | B2 | 2/2014 | Hoffman et al. |
| 8,976,308 | B2 | 3/2015 | Hosoya |
| 9,029,851 | B2 | 5/2015 | Miyairi et al. |
| 9,318,512 | B2 | 4/2016 | Miyairi et al. |
| 9,437,623 | B2 | 9/2016 | Hosoya |
| 2001/0046027 | A1 | 11/2001 | Tai et al. |
| 2001/0048489 | A1 | 12/2001 | Izumi et al. |
| 2002/0014624 | A1* | 2/2002 | Yamazaki ............ G02B 27/017 257/57 |
| 2002/0056838 | A1 | 5/2002 | Ogawa |
| 2002/0132454 | A1 | 9/2002 | Ohtsu et al. |
| 2002/0149053 | A1* | 10/2002 | Tsunoda ............ H01L 27/1214 257/347 |
| 2003/0025166 | A1 | 2/2003 | Yamazaki et al. |
| 2003/0038288 | A1 | 2/2003 | Suzuki et al. |
| 2003/0189401 | A1 | 10/2003 | Kido et al. |
| 2003/0218222 | A1 | 11/2003 | Wager, III et al. |
| 2004/0021786 | A1* | 2/2004 | Nakamura ............ G06K 9/0004 348/294 |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2005/0199960 | A1 | 9/2005 | Hoffman et al. |
| 2005/0275038 | A1* | 12/2005 | Shih .................. H01L 29/78633 257/382 |
| 2006/0027804 | A1 | 2/2006 | Yamazaki et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1* | 5/2007 | Akimoto ............ H01L 29/41733 257/61 |
| 2007/0152217 | A1 | 7/2007 | Lai et al. |
| 2007/0172591 | A1 | 7/2007 | Seo et al. |
| 2007/0187678 | A1* | 8/2007 | Hirao ................ H01L 21/02422 257/43 |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |

(56) References Cited

U.S. PATENT DOCUMENTS

| | | |
|---|---|---|
| 2008/0035919 A1 | 2/2008 | Shin et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2008/0315193 A1 | 12/2008 | Kim et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186445 A1 | 7/2009 | Akimoto |
| 2009/0189155 A1 | 7/2009 | Akimoto |
| 2009/0206332 A1 | 8/2009 | Son et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0003783 A1 | 1/2010 | Akimoto |
| 2010/0051935 A1 | 3/2010 | Lee et al. |
| 2010/0051937 A1 | 3/2010 | Kaji et al. |
| 2010/0065844 A1 | 3/2010 | Tokunaga |
| 2010/0079169 A1 | 4/2010 | Kim et al. |
| 2010/0084651 A1 | 4/2010 | Yamazaki et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0163876 A1 | 7/2010 | Inoue et al. |
| 2010/0193785 A1 | 8/2010 | Kimura |
| 2010/0244020 A1 | 9/2010 | Sakata et al. |
| 2010/0267198 A1 | 10/2010 | Yabuta et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2012/0295399 A1 | 11/2012 | Kim et al. |
| 2016/0197166 A1 | 7/2016 | Miyairi et al. |

FOREIGN PATENT DOCUMENTS

| | | |
|---|---|---|
| CN | 001930692 A | 3/2007 |
| CN | 101123265 A | 2/2008 |
| CN | 101283444 A | 10/2008 |
| CN | 101335304 A | 12/2008 |
| CN | 102197490 A | 9/2011 |
| EP | 0380122 A | 8/1990 |
| EP | 0725301 A | 8/1996 |
| EP | 1624333 A | 2/2006 |
| EP | 1691340 A | 8/2006 |
| EP | 1737044 A | 12/2006 |
| EP | 1770788 A | 4/2007 |
| EP | 1887630 A | 2/2008 |
| EP | 1933293 A | 6/2008 |
| EP | 1983499 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2264770 A | 12/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-091120 A | 4/1989 |
| JP | 02-109341 A | 4/1990 |
| JP | 02-188720 A | 7/1990 |
| JP | 04-111322 A | 4/1992 |
| JP | 04-119331 A | 4/1992 |
| JP | 04-139828 A | 5/1992 |
| JP | 05-053147 A | 3/1993 |
| JP | 05-136419 A | 6/1993 |
| JP | 05-251705 A | 9/1993 |
| JP | 07-312426 A | 11/1995 |
| JP | 08-201773 A | 8/1996 |
| JP | 08-264794 A | 10/1996 |
| JP | 09-186335 A | 7/1997 |
| JP | 10-135479 A | 5/1998 |
| JP | 2776083 | 7/1998 |
| JP | 11-505377 | 5/1999 |
| JP | 11-251427 A | 9/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-069022 A | 3/2003 |
| JP | 2003-086000 A | 3/2003 |
| JP | 2003-086808 A | 3/2003 |
| JP | 2003-218110 A | 7/2003 |
| JP | 2004-103957 A | 4/2004 |
| JP | 2004-134788 A | 4/2004 |
| JP | 2004-273614 A | 9/2004 |
| JP | 2004-273732 A | 9/2004 |
| JP | 2004-281687 A | 10/2004 |
| JP | 2004-296654 A | 10/2004 |
| JP | 2005-123360 A | 5/2005 |
| JP | 2006-080494 A | 3/2006 |
| JP | 2006-100760 A | 4/2006 |
| JP | 2006-108169 A | 4/2006 |
| JP | 2006-165531 A | 6/2006 |
| JP | 2006-191127 A | 7/2006 |
| JP | 2006-245031 A | 9/2006 |
| JP | 2006-344849 A | 12/2006 |
| JP | 2007-096055 A | 4/2007 |
| JP | 2007-096242 A | 4/2007 |
| JP | 2007-115902 A | 5/2007 |
| JP | 2007-123861 A | 5/2007 |
| JP | 2007-150158 A | 6/2007 |
| JP | 2007-165861 A | 6/2007 |
| JP | 2007-212699 A | 8/2007 |
| JP | 2007-529119 | 10/2007 |
| JP | 2007-299913 A | 11/2007 |
| JP | 2007-310352 A | 11/2007 |
| JP | 2008-083171 A | 4/2008 |
| JP | 2009-033145 A | 2/2009 |
| KR | 2001-0051675 A | 6/2001 |
| KR | 2006-0132720 A | 12/2006 |
| KR | 2007-0068261 A | 6/2007 |
| KR | 2008-0048936 A | 6/2008 |
| KR | 2008-0112877 A | 12/2008 |
| TW | 200520604 | 6/2005 |
| TW | 200534369 | 10/2005 |
| TW | 200603234 | 1/2006 |
| TW | 200730985 | 8/2007 |
| TW | 200845397 | 11/2008 |
| TW | 200847441 | 12/2008 |
| WO | WO-2004/114391 | 12/2004 |
| WO | WO-2005/093847 | 10/2005 |
| WO | WO-2005/093850 | 10/2005 |
| WO | WO-2006/025609 | 3/2006 |
| WO | WO-2006/093029 | 9/2006 |
| WO | WO-2006/132439 | 12/2006 |
| WO | WO-2007/058329 | 5/2007 |

(56) References Cited

FOREIGN PATENT DOCUMENTS

| | | |
|---|---|---|
| WO | WO-2008/069056 | 6/2008 |
| WO | WO-2008/069255 | 6/2008 |
| WO | WO-2008/105250 | 9/2008 |
| WO | WO-2010/047217 | 4/2010 |

OTHER PUBLICATIONS

Ting.H et al., "Process Development of Amorphous Indium-Gallium-Zinc-Oxide Thin-Film Transistors for Large Size AMOLED Applications", IDW '10 : Proceedings of the 17th International Display Workshops, Dec. 1, 2010, pp. 629-630.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg—Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H at al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn—Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composits for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

(56) References Cited

OTHER PUBLICATIONS

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008. vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of SOL-Gel-Derived Zinc Oxide Films by Irradiation With Ultraviolet Lamp", Journal of SOL-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nakamura.M et al., "Syntheses and crystal structures of new homologous compounds, indium iron zinc oxides (InFeO3(ZnO)m) (m natural number) and related compounds", KOTAI BUTSURI (Solid State Physics), 1993, vol. 28, No. 5, pp. 317-327.
Chinese Office Action (Application No. 201010156982.5) Dated Nov. 27, 2013.
Korean Office Action (Application No. 2013-0084627) Dated May 1, 2014.
Korean Office Action (Application No. 2013-0084628) Dated May 23, 2014.
Korean Office Action (Application No. 2013-0084627) Dated Sep. 26, 2014.
Taiwanese Office Action (Application No. 099108507) Dated Dec. 16, 2014.
Chinese Office Action (Application No. 201010156982.5) Dated Feb. 16, 2015.
Korean Office Action (Application No. 2015-0177194) Dated Feb. 17, 2016.
Taiwanese Office Action (Application No. 102127951) Dated Apr. 15, 2015.
Chinese Office Action (Application No. 201310329571.5) Dated Aug. 17, 2016.
Korean Office Action (Application No. 2010-0027433) Dated Oct. 27, 2016.

(56) References Cited

OTHER PUBLICATIONS

Korean Office Action (Application No. 2015-0177194) Dated Mar. 9, 2017.

* cited by examiner

FIG. 11
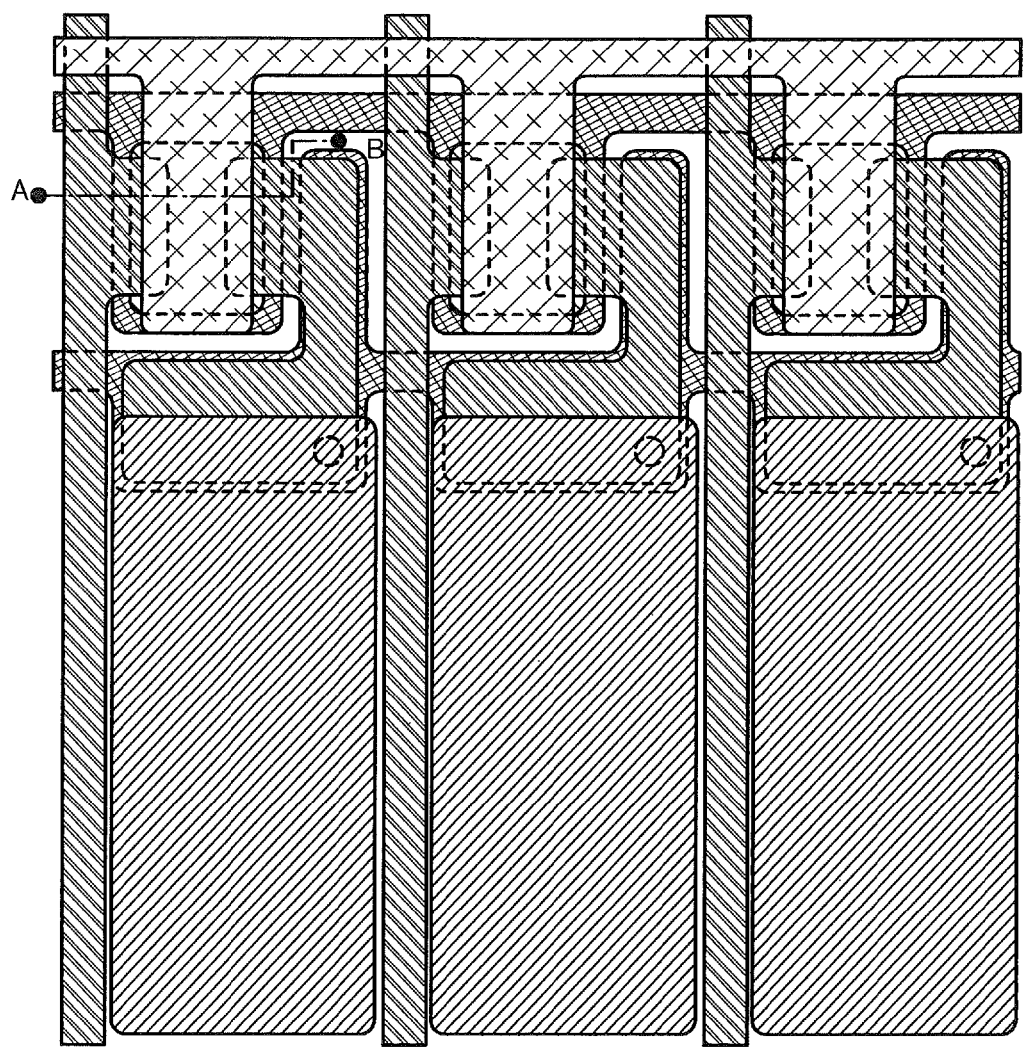
 1101
 1104
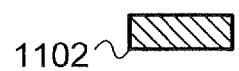 1102
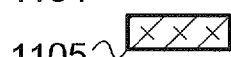 1105
 1103
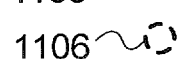 1106

FIG. 12
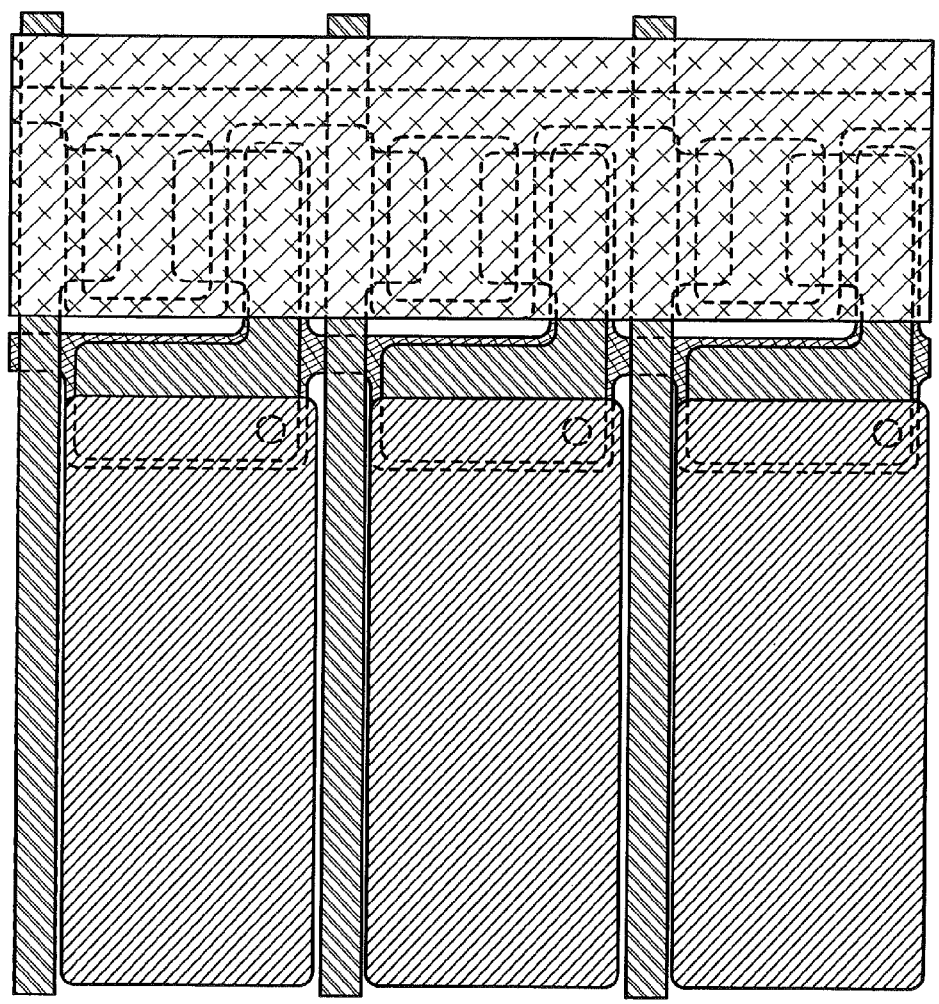
1101 
1102 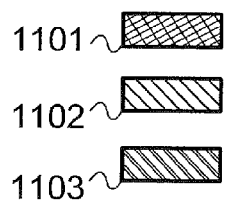
1103 
1104 
1105 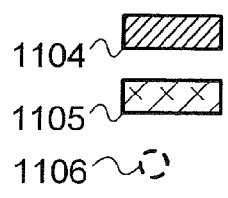
1106 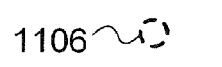

FIG. 16
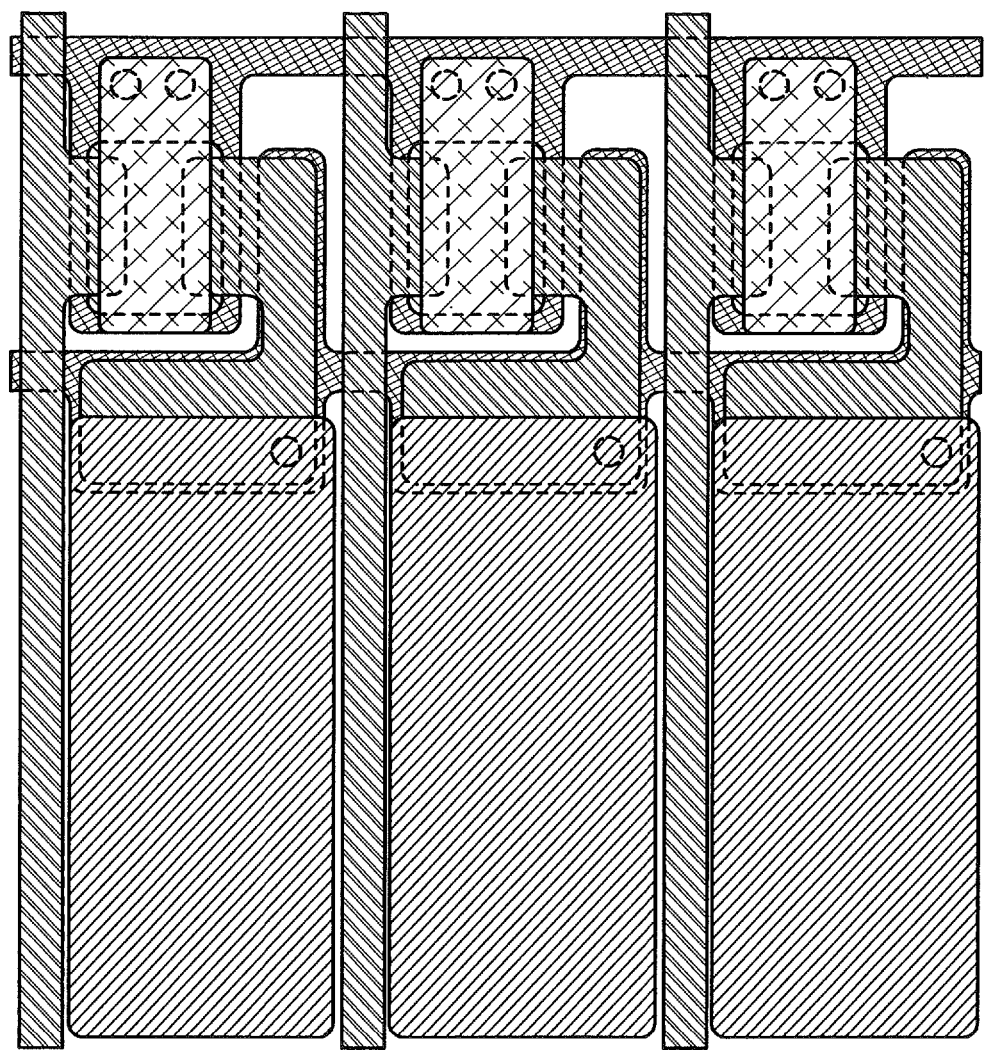
1101 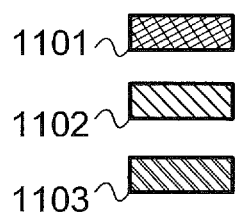
1102 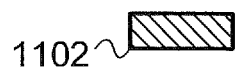
1103 
1104 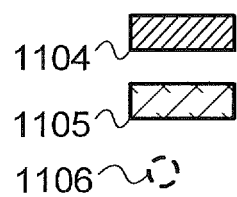
1105 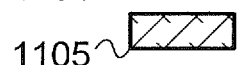
1106 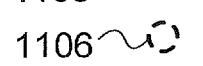

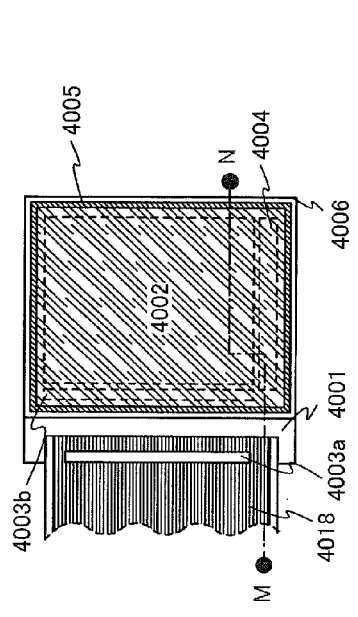
FIG. 24A1
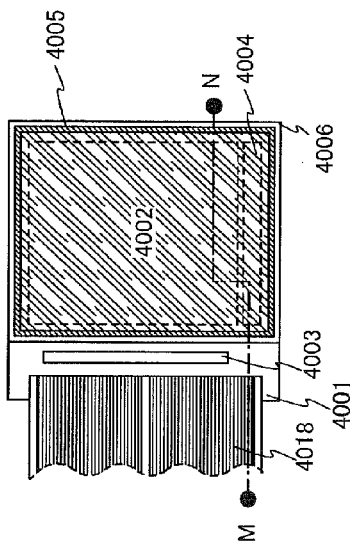
FIG. 24A2
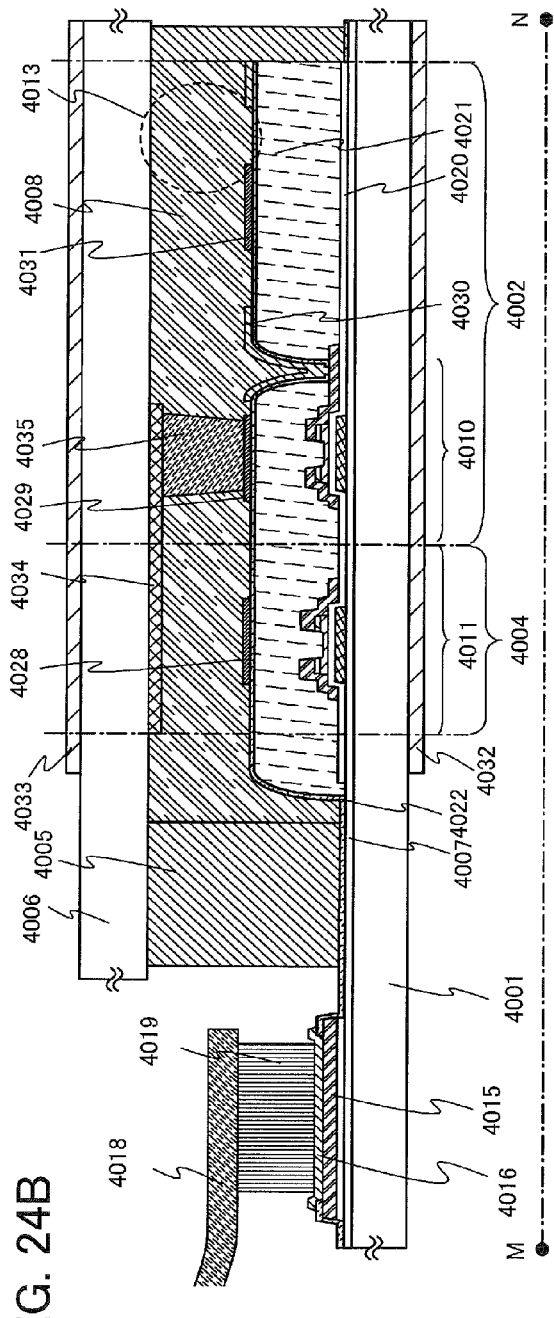
FIG. 24B

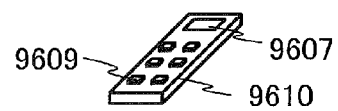
FIG. 27B
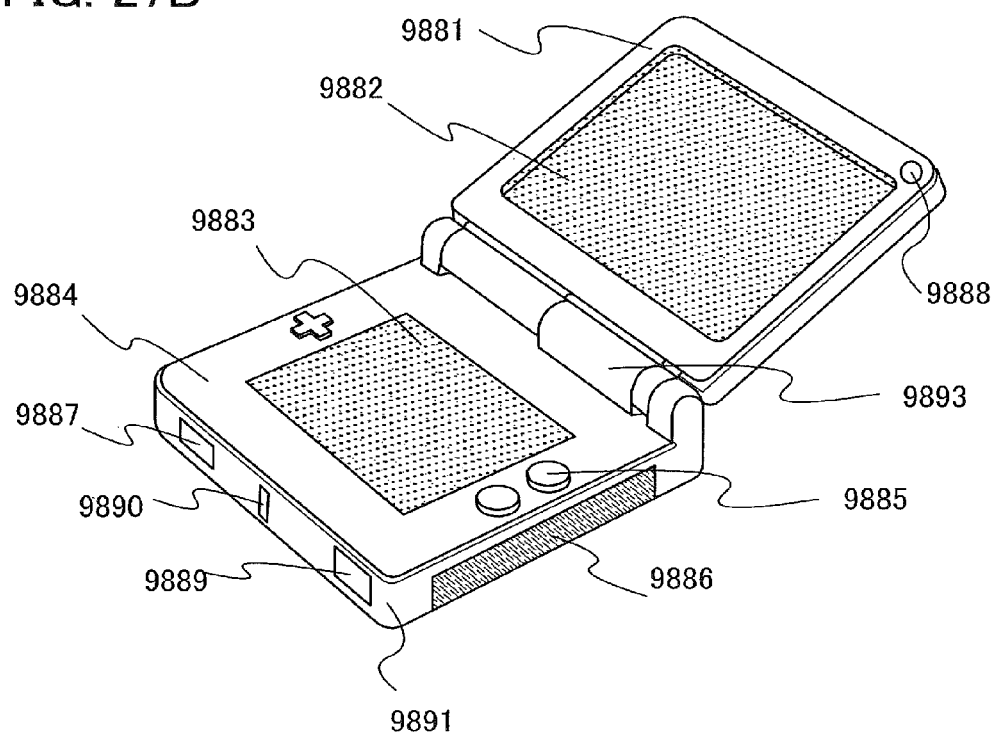

SEMICONDUCTOR DEVICE INCLUDING FIRST AND SECOND GATE ELECTRODES AND STACK OF INSULATING LAYERS

BACKGROUND OF THE INVENTION

1. Field of the Invention

The present invention relates to a semiconductor device having a circuit formed using a thin film transistor (hereinafter referred to as a TFT) and a manufacturing method thereof. For example, the present invention relates to an electronic appliance in which an electro-optical device typified by a liquid crystal display panel or a light-emitting display device including an organic light-emitting element is mounted as its component.

Note that the semiconductor device in this specification refers to all the devices which can operate by using semiconductor characteristics. An electro-optical device, a semiconductor circuit, and an electronic appliance are all semiconductor devices.

2. Description of the Related Art

Various metal oxides are used for a variety of applications. Indium oxide is a well-known material and is used as a transparent electrode material which is necessary for liquid crystal displays and the like.

Some metal oxides have semiconductor characteristics. As metal oxides having semiconductor characteristics, for example, tungsten oxide, tin oxide, indium oxide, zinc oxide can be given. References disclose a thin film transistor in which such a metal oxide having semiconductor characteristics is used for a channel formation region (Patent Documents 1 to 4 and Non-Patent Document 1).

Further, not only single-component oxides but also multi-component oxides are known as metal oxides. For example, $InGaO_3(ZnO)_m$ (m is a natural number), which is a homologous compound, is known as a multi-component oxide semiconductor including In, Ga, and Zn (Non-Patent Documents 2 to 4).

Furthermore, it is confirmed that an oxide semiconductor including such an In—Ga—Zn-based oxide is applicable to a channel layer of a thin film transistor (Patent Document 5 and Non-Patent Documents 5 and 6).

PATENT DOCUMENT

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

NON-PATENT DOCUMENT

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Homologous Series, Synthesis and Crystal Structure of $InFeO_3(ZnO)m$ (m: natural number) and its Isostructural Compound", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", NATURE, 2004, Vol. 432, pp. 488-492

SUMMARY OF THE INVENTION

A thin film transistor is a switching element that is turned on when a certain amount of voltage (referred to as a threshold voltage ($V_{th}$)) is applied to a gate electrode and is turned off when a voltage less than the certain amount is applied. This threshold voltage ($V_{th}$) corresponds to the amount of voltage at a starting point of rising of a curve obtained by measuring a current-voltage characteristic of the thin film transistor. As the threshold voltage ($V_{th}$) is closer to 0 V, the thin film transistor is better; it can be said that a thin film transistor with a threshold voltage ($V_{th}$) of 0 V is an ideal switching element.

The threshold voltage is shifted in a negative or positive direction in some cases by an unspecified factor in a manufacturing process of the thin film transistor. If the amount of shift from 0 V is large, driving voltage is increased, which results in an increase in power consumption of a semiconductor device.

Also in the thin film transistor using an oxide semiconductor layer for a channel, the threshold voltage is shifted in a negative or positive direction in some cases by an unspecified factor.

An object according to one embodiment of the present invention is to provide a semiconductor device including thin film transistors which include an oxide semiconductor layer for a channel and have superior electric characteristics; specifically, to provide a semiconductor device including thin film transistors in which changes and variations in threshold voltages are reduced.

Another object according to one embodiment of the present invention is to provide a semiconductor device including thin film transistors which include an oxide semiconductor layer for a channel and in which a channel length is small.

Another object according to one embodiment of the present invention is to provide a semiconductor device including thin film transistors which include an oxide semiconductor layer for a channel and are highly reliable.

In order to adjust a threshold voltage to a desired value, gate electrodes are provided over and below an oxide semiconductor layer. A gate electrode under the oxide semiconductor layer (which can be referred to as a first gate electrode) has the same potential as a gate wiring, while a gate electrode over the oxide semiconductor layer (which can be referred to as a second gate electrode or a back gate electrode) has a potential equal to or lower than a source potential of the thin film transistor. In the case where the first gate electrode and the second gate electrode have different potentials, electric characteristics of a TFT, such as a threshold voltage, can be controlled. For example, by setting a second gate electrode potential as a ground potential (GND), electrostatic can be blocked. Further, if the first gate electrode and the second gate electrode are electrically connected and set to be the same potential, gate voltage can be applied to the oxide semiconductor layer from both the first gate electrode and the second gate electrode over and below the oxide semiconductor layer.

In addition, in order to form an ohmic contact, a buffer layer (a source and drain regions) whose carrier concentration is higher than that of the oxide semiconductor layer is intentionally formed between the oxide semiconductor layer and the source electrode layer (or the drain electrode layer). Note that the buffer layer has n-type conductivity and can be referred to as $n^+$-type regions. In the case where the source and drain regions are referred to as the $n^+$-type regions ($N^+$-type regions), an IGZO semiconductor layer which functions as a channel formation region can also be referred to as an i-type region (an I-type region) in contrast to the $n^-$ regions. An NI junction is formed by provision of the buffer layer, so that a semiconductor device provided with a thin film transistor having a short channel length of 5 μm or less and high field effect mobility can be obtained.

In addition, in the case where ions, in particular, hydrogen radicals are included in plasma generated in a process after formation of the oxide semiconductor layer, there is a possibility that a surface of the oxide semiconductor layer which is exposed to plasma is damaged. Further, there is a possibility that the oxide semiconductor layer is also damaged by electric charge of plasma generated in a process after formation of the oxide semiconductor layer.

In particular, in the case where the buffer layer (the source and drain regions) whose carrier concentration is higher than that of the oxide semiconductor layer is intentionally provided between the oxide semiconductor layer and the source electrode layer (or the drain electrode layer), there is a possibility that the buffer layer is also damaged by electric charge of plasma generation and resistance of the buffer layer is increased; and thus, the buffer layer cannot exhibit its own function.

Further, there is a possibility that characteristics of the oxide semiconductor layer are changed or reliability is reduced due to reaction of the oxide semiconductor layer with moisture, hydrogen ions, OH$^-$, or the like.

Thus, a resin layer having good flatness is formed as a first protective insulating film covering the oxide semiconductor layer, and then a second protective insulating film is formed by a sputtering method or a plasma CVD method under a low power condition over the resin layer. By forming a stack of different protective insulating films, plasma damage to the oxide semiconductor layer is reduced. Thus, a semiconductor device having long-term reliability and an excellent sealing property can be obtained.

Further, the second gate electrode which covers the oxide semiconductor layer has a blocking function against moisture, hydrogen ions, OH$^-$, or the like. In the case where a conductive film which blocks light is used as the second gate electrode, the second gate electrode has an effect of preventing electric characteristics of the thin film transistor from changing due to photosensitivity of the oxide semiconductor and thus stabilizes the electric characteristics of the thin film transistor.

One embodiment of the present invention disclosed in this specification includes a semiconductor device including a first gate electrode over an insulating surface, a first insulating layer over the first gate electrode, an oxide semiconductor layer over the first insulating layer, a source electrode layer and a drain electrode layer over the oxide semiconductor layer, a first buffer layer between the oxide semiconductor layer and the source electrode layer, and a second buffer layer between the oxide semiconductor layer and the drain electrode layer, a resin layer which covers the source electrode layer and the drain electrode layer, and a second gate electrode over the resin layer. In the semiconductor device, the oxide semiconductor layer includes a region with a small thickness compared to a region of the oxide semiconductor layer which overlaps with the source electrode layer or the drain electrode layer, and the resin layer is in contact with the region with the small thickness of the oxide semiconductor layer.

With the above structure, at least one of the above problems can be resolved.

In the above structure, a second protective insulating film may be formed over and in contact with the resin layer, which serves as the first protective insulating film, and the second gate electrode may be formed over the second protective insulating film. The resin layer can be formed without a pinhole and is good in terms of step coverage because the resin layer can be formed to have a flat surface regardless of unevenness of a surface over which the resin layer is formed.

Further, in the above structure, as the second protective insulating film, an inorganic insulating film is formed by a sputtering method or a plasma CVD method under a low power condition (or at a low substrate temperature of 200° C. or lower, preferably from a room temperature to 100° C.). Specifically, a silicon nitride film, a silicon oxide film, or a silicon nitride oxide film is used. These films have an effect of blocking moisture, hydrogen ions, OH$^-$, and the like. The second protective insulating film can serve as an etching stopper when the second gate electrode is selectively etched so that a top surface thereof has a desired shape. In addition, the first protective insulating film and the second protective insulating film can also serve as a second gate insulating layer.

Further, in the above structure, in the case where the second gate electrode is provided over and in contact with the resin layer, which serves as the first protective insulating film, the second gate electrode may be provided between the resin layer and the second protective insulating film. If the second gate electrode is provided between the second protective insulating film and the resin layer, the second gate electrode as well as the resin layer has an effect of reducing plasma damage to the oxide semiconductor layer. In this case, the resin layer serves as a second gate insulating layer.

Further, in the above structure, the region having a small thickness of the oxide semiconductor layer is a channel formation region overlapping with the first gate electrode and the second gate electrode. In the region with the small thickness of the oxide semiconductor layer, a region close to the second gate electrode is referred to as a back channel. When film formation using plasma including moisture, hydrogen, OH$^-$, or the like is performed to form a film in contact with the back channel, electric charge may be accumulated and negative charge or OH$^-$ of the plasma may enter an oxygen-deficiency-type defect portion in the buffer layer, which may prevent formation of an NI junction which is intended to be formed. A lack of oxygen in the oxide semiconductor layer increases Zn which is easy to receive negative charges in the oxide semiconductor layer. When negative charge of the plasma enters the oxygen-deficiency-type defect portion in the buffer layer, the buffer layer (an $N^+$-type region) is changed to an N-type region and further, changed to an $N^+$-type region or an I-type region. As a result, an NI junction provided at an interface of the buffer layer disappears. This possibly causes disappearance of a depletion layer and an unstable value of Vg-Id characteristics of a thin film transistor.

Further, a base film is preferably formed over the insulating surface of a glass substrate or the like. For example, a silicon nitride film or a silicon nitride oxide film is provided. These films can function as an etching stopper which prevents the glass substrate from being etched when a first gate electrode is selectively etched so that a top surface thereof has a desired shape. In addition, the base film has a blocking function against moisture, hydrogen ions, $OH^-$, or the like. In this manner, when the films having a blocking function against moisture, hydrogen ions, $OH^-$, or the like are formed above, below, and around the oxide semiconductor layer so as to encapsulate the oxide semiconductor layer, a semiconductor device having an excellent sealing property and long-term reliability can be obtained.

Although an example of the channel-etch type thin film transistor which is one kind of a bottom-gate thin film transistor is described above, there is no particular limitation on the structure of the thin film transistor. For example, a bottom-contact thin film transistor may be employed. An oxide semiconductor layer of a bottom-contact type structure is formed after the source and drain electrode layers are formed by selectively etching a conductive film; therefore, the number of steps after formation of the oxide semiconductor layer is small and the number of exposure of the oxide semiconductor layer to plasma is also small as compared to the case of a channel-etch type TFT. As the number of exposure to plasma is small, plasma damage to the oxide semiconductor layer can be reduced.

In the case where a thin film transistor has a bottom-contact type structure, a semiconductor device according to one embodiment of the present invention includes a first gate electrode over an insulating surface, a first insulating layer over the first gate electrode, a source electrode layer and a drain electrode layer over the first insulating layer, an oxide semiconductor layer over the source electrode layer and the drain electrode layer, a resin layer which covers the oxide semiconductor layer, and a second gate electrode over the resin layer. In the semiconductor device, the oxide semiconductor layer is formed over the first insulating layer and overlaps with the first gate electrode, at least a part of the oxide semiconductor layer is located between the source electrode layer and the drain electrode layer, and the second gate electrode overlaps with the oxide semiconductor layer and the first gate electrode.

In the above bottom-contact type structure, a first buffer layer is preferably provided between the oxide semiconductor layer and the source electrode layer, and a second buffer layer is preferably provided between the oxide semiconductor layer and the drain electrode layer. By providing the first and second buffer layers, an NI junction is formed, so that a semiconductor device having a thin film transistor with a small channel length of 5 µm or less and high field-effect mobility can be realized. Alternatively, in the bottom-contact type structure, the first buffer layer is preferably provided between the first insulating layer and the source electrode layer and the second buffer layer is preferably provided between the first insulating layer and the drain electrode layer in a manner such that side surfaces of the first and second buffer layers are in contact with the oxide semiconductor layer. In the case where the first buffer layer is provided between the first insulating layer and the source electrode layer and the second buffer layer is provided between the first insulating layer and the drain electrode layer, the first buffer layer (or the second buffer layer) is provided under the source electrode layer (or the drain electrode layer) and the source electrode layer (or the drain electrode layer) has an effect of reducing plasma damage to the first buffer layer (or the second buffer layer). Thus, as a blocking layer for reducing plasma damage to the buffer layers, two layers (i.e., the source electrode layer (or the drain electrode layer) and the second gate electrode) are formed over the buffer layers; therefore, plasma damage to the buffer layers is reduced.

Further, a thin film transistor having a channel-stop type structure which is one type of a bottom-gate thin film transistor may be employed. In the case where a thin film transistor has a channel-stop type structure, a semiconductor device according to one embodiment of the present invention includes a first gate electrode over an insulating surface, a first insulating layer over the first gate electrode, an oxide semiconductor layer over the first insulating layer, a channel protective layer over and in contact with the oxide semiconductor layer, a source electrode layer and a drain electrode layer over the oxide semiconductor layer, a resin layer which covers the source electrode layer and the drain electrode layer, a second gate electrode over the resin layer, and a second insulating layer over the resin layer. In the semiconductor device, the resin layer is in contact with the channel protective layer.

In the above channel-stop type structure, first and second buffer layers are provided over and in contact with the channel protective layer and the oxide semiconductor layer. The first buffer layer is provided between the oxide semiconductor layer and the source electrode layer, and the second buffer layer is provided between the oxide semiconductor layer and the drain electrode layer. By providing the first buffer layer (or the second buffer layer), contact resistance between the source electrode layer (or the drain electrode layer) and the oxide semiconductor layer can be reduced.

In the above channel-stop type structure, by making the width of the second gate electrode larger than the width of the oxide semiconductor layer, gate voltage can be applied from the second gate electrode to the whole oxide semiconductor layer. In addition, in the case where the thickness of the resin layer is 1 µm or more and parasitic capacitance does not cause a problem, the second gate electrode layer may cover a plurality of thin film transistors in the driver circuit to be a common second gate electrode and the area of the second gate electrode layer may be approximately the same as or larger than that of the driver circuit.

If the parasitic capacitance causes a problem, in the above channel-stop type structure, it is preferable that the width of the second gate electrode is set to be smaller than the width of the first gate electrode so that an area of the second gate electrode which overlaps with the source electrode layer or the drain electrode layer is reduced, whereby the parasitic capacitance is reduced. Further, the width of the first gate electrode may be set to be larger than the width of the channel protective layer and smaller than the width of the second gate electrode so that the first gate electrode does not overlap with the source or drain electrode layer, whereby more parasitic capacitance can be reduced.

In the above channel-stop type structure, as the channel protective layer, an inorganic insulating film or a film of amorphous silicon or a compound thereof which is formed by a sputtering method is used. In a region of the oxide semiconductor layer which overlaps with the first gate electrode, a region close to the second gate electrode is referred to as a back channel. The channel protective layer is provided in contact with the back channel. As an inorganic insulating film used as the channel protective layer, a silicon oxide film, a silicon nitride film, or a silicon oxynitride film is used. A compound of an amorphous silicon film used for the channel protective layer refers to a p-type amorphous silicon film including a p-type impurity element such as boron which is formed by a sputtering method, or an n-type amorphous silicon film including an n-type impurity element such as phosphorus which is formed by a sputtering method. In particular, in the case of using a p-type amorphous silicon film for the channel protective layer, an effect of reducing leakage current in an off state and cancelling carriers (electrons) generated in the oxide semiconductor layer provided in contact with the p-type amorphous silicon film is obtained. The channel protective layer formed of an amorphous silicon film has a blocking function against moisture, hydrogen ions, OH$^-$, and the like. In addition, the channel protective layer formed of an amorphous silicon film also functions as a light-blocking layer which blocks incidence of light to the oxide semiconductor layer.

Also in the above channel-etch type structure, the channel protective layer in contact with the region with a small thickness of the oxide semiconductor layer may be formed of amorphous silicon or a compound thereof by a sputtering method to cover the source electrode layer and the drain electrode layer. The channel protective layer has a blocking function against moisture, hydrogen ions, OH$^-$, and the like. In addition, the channel protective layer formed of an amorphous silicon film also functions as a light-blocking layer which blocks incidence of light to the oxide semiconductor layer. Further, in the case of using a p-type amorphous silicon film for the channel protective layer, an effect of reducing leakage current in an off state and cancelling carriers (electrons) generated in the oxide semiconductor layer provided in contact with the p-type amorphous silicon film is obtained.

In the above channel-etch type structure, by making the width of the second gate electrode larger than the width of the oxide semiconductor layer, gate voltage can be applied from the second gate electrode to the whole oxide semiconductor layer. In addition, in the case where parasitic capacitance does not cause a problem, the second gate electrode layer may cover a plurality of thin film transistors to be a common second gate electrode in the driver circuit and the area of the second gate electrode layer may be approximately the same as or larger than that of the driver circuit. If the parasitic capacitance causes a problem, it is preferable that the width of the second gate electrode is set to be smaller than that of the first gate electrode so that an area of the second gate electrode which overlaps with the source electrode layer or the drain electrode layer is reduced, whereby the parasitic capacitance is reduced.

Further, in the above bottom-contact type structure, the channel protective layer may be formed of amorphous silicon or a compound thereof by a sputtering method over and in contact with a top surface or a side surface of the oxide semiconductor layer. The channel protective layer has a blocking function against moisture, hydrogen ions, OH$^-$, and the like. In addition, the channel protective layer formed of an amorphous silicon film also functions as a light-blocking layer which blocks incidence of light to the oxide semiconductor layer. Further, in the case of using a p-type amorphous silicon film for the channel protective layer, an effect of reducing leakage current in an off state and cancelling carriers (electrons) generated in the oxide semiconductor layer provided in contact with the p-type amorphous silicon film is obtained.

In the above bottom-contact type structure, by making the width of the second gate electrode larger than the width of the second oxide semiconductor layer, gate voltage can be applied from the second gate electrode to the whole oxide semiconductor layer. In addition, in the case where parasitic capacitance does not cause a problem, the second gate electrode layer may cover a plurality of thin film transistors to be a common second gate electrode in the driver circuit and the area of the second gate electrode layer may be approximately the same as or larger than that of the driver circuit. If the parasitic capacitance causes a problem, it is preferable that the width of the second gate electrode is set to be smaller than the width of the first gate electrode so that an area of the second gate electrode which overlaps with the source electrode layer or the drain electrode layer is reduced, whereby the parasitic capacitance is reduced.

As the resin layer used in the above structures, photosensitive or non photosensitive organic material (polyimide, acrylic, polyamide, polyimideamide, resist, or benzocyclobutene), or a stack of any of these materials can be used. For example, in the case where positive photosensitive acrylic is used as a material for the resin layer, a side surface of an opening of the resin layer preferably has a curved surface with a radius of curvature. As the resin layer, either a negative type, which becomes insoluble to an etchant by light irradiation, or a positive type, which becomes soluble to an etchant by light irradiation, can be used. It is effective to use a photosensitive organic material for the resin layer because an opening can be formed without etching using plasma or forming a resist mask; therefore, the number of steps and the number of exposure of the oxide semiconductor layer and the buffer layer to plasma can be reduced.

The source and drain electrode layers in the above structures are formed using any of an element selected from Al, Cr, Ta, Ti, Mo, and W, an alloy including any of the elements as a component, an alloy film including a combination of any of the elements, and the like. Alternatively, the source and drain electrode layers can be formed using aluminum doped zinc oxide (AZO) or gallium doped zinc oxide (GZO). By adding an element to be a trivalent ion such as $Al_2O_3$ or $Ga_2O_3$ to zinc oxide by a small amount (e.g., at a few wt %), the resistance of the source and drain electrode layers can be lowered.

The oxide semiconductor layer including a channel formation region in the thin film transistor having any of the above structures can be formed using a Zn—O-based non-single-crystal film, an In—Ga—Zn—O-based non-single-crystal film, an In—Sn—Zn—O-based, Ga—Sn—Zn—O-based, In—Zn—O-based, Sn—Zn—O-based, In—Sn—O-based, or Ga—Zn—O-based oxide semiconductor. Note that an oxide semiconductor typified by the In—Ga—Zn—O-based non-single-crystal film is a material having a wide energy gap (Eg); therefore, even if two gate electrodes are provided above and below an oxide semiconductor layer, an increase in off current can be suppressed.

Further, in the above structures, as the oxide semiconductor layer including a channel formation region of the thin film transistor, an oxide semiconductor layer including silicon oxide which is obtained by a sputtering method using an oxide semiconductor target including $SiO_x$ may be used. Typically, an oxide semiconductor target including $SiO_2$ at 0.1 wt % to 20 wt % inclusive, preferably at 1 wt % to 6 wt % inclusive may be used to form a film so that the oxide semiconductor layer includes $SiO_x$ (X>0) which inhibits crystallization. Thus, a thin film transistor can be realized in which a channel is formed when a gate of the thin film transistor is supplied with a positive threshold voltage which is set to be as close to 0 V as possible.

Further, in the above structures, as the buffer layer (also referred to as $N^+$-type region, $n^+$-type layer, or a source region or drain region) of the thin film transistor, a degenerate oxide semiconductor is preferably used. In addition, the degenerate oxide semiconductor preferably has a light-transmitting property. As for the oxide semiconductor layer, a Zn—O-based oxide semiconductor, an In—Ga—Zn—O-based oxide semiconductor, an In—Zn—O-based oxide semiconductor, and Sn—Zn—O-based oxide semiconductor, an In—Sn—O-based oxide semiconductor, an Al—Zn—O-based oxide semiconductor, or a Ga—Zn—O-based oxide semiconductor is used. Alternatively, an In—Ga—Zn—O-based non-single-crystal film including nitrogen, that is, an In—Ga—Zn—O—N-based non-single-crystal film (also referred to as an IGZON film) may be used as the buffer layer. Alternatively, a Ga—Zn—O-based non-single-crystal film or a Ga—Zn—O-based non-single-crystal film including nitrogen, that is, a Ga—Zn—O—N-based non-single-crystal film may be used as the buffer layer. Alternatively, an Al—Zn—O-based non-single-crystal film or an Al—Zn—O-based non-single-crystal film including nitrogen, that is, an Al—Zn—O—N-based non-single-crystal film may be used as the buffer layer. Note that each of a Ga—Zn—O-based oxide semiconductor and a Ga—Zn—O—N-based oxide semiconductor preferably includes gallium at 1 wt % to 10 wt % inclusive, and each of an Al—Zn—O-based oxide semiconductor and an Al—Zn—O—N-based oxide semiconductor preferably includes aluminum at 1 wt % to 10 wt % inclusive. Further alternatively, a Zn—O—N-based non-single-crystal film, which includes nitrogen, or a Sn—Zn—O—N-based non-single-crystal film, which includes nitrogen, may be used.

A term indicating a direction such as "on", "over", "under", "below", or "side" in this specification is based on the assumption that a device is provided over a substrate surface.

By forming a stack of different protective insulating films, plasma damage to the oxide semiconductor layer is reduced. Thus, a semiconductor device having long-term reliability and an excellent sealing property can be obtained.

Further, a semiconductor device including a thin film transistor with a small channel length of 5 μm or less can be realized. Further, in an electro-optical device typified by a liquid crystal display device, a light-emitting device including an EL element, a display device in which an electrophoretic display element is used and which is also referred to as an electronic paper, and a semiconductor device, higher definition (increase in number of pixels), miniaturization of each display pixel pitch accompanying reduction in size of the light-emitting device, and higher integration of a driver circuit for driving a pixel portion can be further advanced.

Note that the ordinal numbers such as "first" and "second" in this specification are used for convenience and do not denote the order of steps and the stacking order of layers. In addition, the ordinal numbers in this specification do not denote particular names which specify the present invention.

BRIEF DESCRIPTION OF THE DRAWINGS

FIG. 11 shows a layout of pixels.

FIG. 12 shows a layout of pixels.

FIG. 16 shows a layout of pixels.

FIGS. 24A1, 24A2, and 24B are top views and a cross-sectional view of a semiconductor device of one embodiment of the present invention.

FIGS. 27A and 27B illustrate electronic appliances of one embodiment of the present invention.

DETAILED DESCRIPTION OF THE INVENTION

Hereinafter, embodiments of the present invention will be described in detail with reference to the accompanying drawings. Note that the present invention is not limited to the following description and it will be readily appreciated by those skilled in the art that modes and details can be modified in various ways. Accordingly, the present invention should not be construed as being limited to the description of the embodiments to be given below.

(Embodiment 1)

Figure 1A:
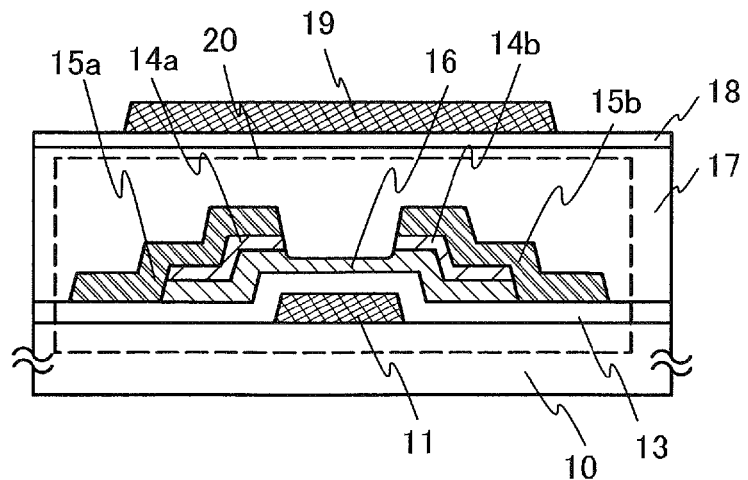
FIGS. 1A to 1C are cross-sectional views of one embodiment of the present invention.

FIG. 1A is an example of a cross-sectional view of a thin film transistor in which an oxide semiconductor layer is sandwiched between two gate electrodes provided over and below the oxide semiconductor layer. This embodiment describes an example of a manufacturing method by which a thin film transistor used for a pixel portion and a driver circuit is provided over a substrate having an insulating surface.

First, a first gate electrode 11 is formed over a substrate 10 having an insulating surface. As the substrate 10 having an insulating surface, any glass substrate used in the electronics industry (also called an alkali-free glass substrate) such as an aluminosilicate glass substrate, an aluminoborosilicate glass substrate, or a barium borosilicate glass substrate, a plastic substrate with heat resistance which can withstand a process temperature in this manufacturing process, or the like can be used. In the case where the substrate 10 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

For the first gate electrode 11, a conductive layer having a single-layer structure or a stacked-layer structure can be formed using a metal material such as molybdenum, titanium, chromium, tantalum, tungsten, aluminum, copper, neodymium, or scandium, or an alloy material including any of these materials as a main component. After the conductive layer is formed over the entire surface of the substrate 10, a photolithography step is performed to form a resist over the conductive layer. Then, unnecessary portions are removed by etching and wirings and electrodes (a gate wiring including the first gate electrode 11, a capacitor wiring, a terminal electrode, and the like) are formed. In this embodiment, a single layer of tungsten having a thickness of 100 nm is used.

For example, in the case where the first gate electrode 11 has a stacked-layer structure, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. Alternatively, a stack including a copper layer including Ca and a copper oxide layer including Ca which serves as a barrier layer thereover; or a stack including a copper layer including Mg and a copper oxide layer including Mg, which serves as a barrier layer, thereover; can be employed. Further alternatively, as a three-layer structure, a stack of a tungsten layer or a tungsten nitride layer, a layer of an alloy of aluminum and silicon or an alloy of aluminum and titanium, and a titanium nitride layer or a titanium layer is preferable.

Next, the resist mask is removed and then a first gate insulating layer 13 covering the first gate electrode 11 is formed. The first gate insulating layer 13 is formed to a thickness of 50 nm to 400 nm by a sputtering method, a PCVD method, or the like. The first gate insulating layer 13 is formed to have a single-layer structure or a stacked-layer structure using an inorganic insulating film such as a silicon oxide film, a silicon oxynitride film, a silicon nitride oxide film, a silicon nitride film, or a tantalum oxide film. The first gate insulating layer 13 can be formed using a silicon oxide layer by a CVD method using an organosilane gas. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

In this embodiment, the first gate insulating layer 13 having a thickness of 100 nm is formed over the first gate electrode 11 as follows: a monosilane gas ($SiH_4$), nitrous oxide ($N_2O$), and a rare gas are introduced into a chamber of a high-density plasma apparatus as source gases, and high density plasma is generated under a pressure of 10 Pa to 30 Pa. The first gate insulating layer 13 is a silicon oxynitride film. In this embodiment, the high-density plasma apparatus refers to an apparatus which can realize a plasma density of $1 \times 10^{11}/cm^3$ or higher. For example, plasma is generated by applying a microwave power of 3 kW to 6 kW for formation of the insulating film. In the formation of the insulating film, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the first gate insulating layer 13 formed with the high-density plasma apparatus can have a uniform thickness, the first gate insulating layer 13 has excellent step coverage. Further, the thickness of a thin insulating film formed with the high-density plasma apparatus can be controlled precisely.

The insulating film obtained by the high-density plasma apparatus is greatly different from an insulating film formed with a conventional parallel plate PCVD apparatus. The insulating film obtained with the high-density plasma apparatus has an etching rate which is lower than that of the insulating film formed with the conventional parallel plate PCVD apparatus by 10% or more or 20% or more in the case where the etching rates with the same etchant are compared to each other. Thus, it can be said that the insulating film obtained by using the high-density plasma apparatus is a dense film.

Next, an oxide semiconductor film is formed over the first gate insulating layer 13. The thickness of the oxide semiconductor film is at least 30 nm, preferably 60 nm or more and 150 nm or less. In this embodiment, a first In—Ga—Zn—O-based non-single-crystal film is formed as the oxide semiconductor film. The first In—Ga—Zn—O-based non-single-crystal film is formed in an argon or oxygen atmosphere using an oxide semiconductor target having a diameter of 8 inches and containing indium (In), gallium (Ga), and zinc (Zn) ($In_2O_3:Ga_2O_3:ZnO=1:1:1$), with the distance between the substrate and the target set to 170 mm, under a pressure of 0.4 Pa, and with a direct-current (DC) power source of 0.5 kW. Note that a pulse direct current (DC) power supply is preferable because dust can be reduced and the film thickness can be uniform.

Note that in the case where a large-area glass substrate is used, manufacturing in which one large backing plate is attached to one large target material is difficult and costly. Therefore, a target material is divided and the divided target materials are bonded to a backing plate. A target is formed by attaching a target material to a backing plate (a plate for attaching a target thereto) and vacuum packing. In formation of the first In—Ga—Zn—O-based non-single-crystal film, in order to obtain excellent electrical characteristics of a thin film transistor, it is preferable that the backing plate including the target material attached thereto is set in a sputtering apparatus while being kept away from moisture and the like in air as much as possible. It is preferable that the target material is kept away from moisture and the like in air as much as possible not only at the time of setting the target to the sputtering apparatus, but also during the period up to vacuum-packing including manufacture of the target material, bonding of the target material to the backing plate, and the like.

In the case where the In—Ga—Zn—O-based oxide semiconductor film is formed by a sputtering method, the oxide semiconductor target including In, Ga, and Zn may include an insulating impurity such as silicon oxide. Inclusion of the insulating impurity in the oxide semiconductor facilitates amorphization of the oxide semiconductor film to be formed. In addition, when the oxide semiconductor layer is subjected to heat treatment in a later step, crystallization due to the heat treatment can be suppressed.

Next, an oxide semiconductor film (in this embodiment, a second In—Ga—Zn—O-based non-single-crystal film) which has lower resistance than the first In—Ga—Zn—O-based non-single-crystal film is formed by a sputtering method without exposure to air. In this embodiment, an oxynitride film including indium, gallium and zinc is formed using an oxide semiconductor target (ZnO) including indium (In), gallium (Ga), and zinc (Zn) ($In_2O_3:Ga_2O_3:ZnO=1:1:1$) in an atmosphere including a nitrogen gas by a sputtering method. This oxynitride film becomes an oxide semiconductor film which has lower resistance than the first In—Ga—Zn—O-based non-single-crystal by heat treatment performed later.

Next, a photolithography step is performed to form a resist mask over the second In—Ga—Zn—O-based non-single-crystal film. Then, the first and the second In—Ga—Zn—O-based non-single-crystal films are etched. Note that etching here is not limited to wet etching and dry etching may also be performed.

Next, the resist mask is removed and then a conductive film formed from a metal material is formed over the first and the second In—Ga—Zn—O-based non-single-crystal films by a sputtering method or a vacuum evaporation method. As a material for the conductive film, an element selected from Al, Cr, Ta, Ti, Mo, and W; an alloy including any of these elements as a component; an alloy including a combination of any of these elements; and the like can be given. Further, in the case where heat treatment is performed at 200° C. to 600° C., the conductive film preferably has heat resistance for such heat treatment. Since use of Al alone brings disadvantages such as low heat resistance and a tendency to be corroded, Al is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc), an alloy including any of these elements as a component, an alloy including a combination of any of these elements, and a nitride including any of these elements as a component.

Here, as the conductive film, a conductive film in which an Al film and a Ti film are stacked is used. Alternatively, the conductive film may be a single layer of a titanium film. Still alternatively, the conductive film may have a three-layer structure including a Ti film, an aluminum film including Nd (Al—Nd) which is stacked on the Ti film, and a Ti film formed on these films. The conductive film may have a single-layer structure of an aluminum film including silicon.

Next, a photolithography step is performed to form a resist mask over the conductive film. Then, unnecessary portions are removed by etching and a source and drain electrode layers 15a and 15b are formed. Wet etching or dry etching is employed as an etching method at this time. Here, dry etching is employed using a mixed gas of $SiCl_4$, $Cl_2$, and $BCl_3$ as a reactive gas to etch the conductive film in which the Ti film and the Al film are stacked. Thus, the source and drain electrode layers 15a and 15b are formed. In addition, in this etching, the second In—Ga—Zn—O-based non-single-crystal film is selectively etched using the same resist mask to form a source and drain regions 14a and 14b, and part of the first In—Ga—Zn—O-based non-single-crystal film is exposed.

Through the above etching step using the resist mask, the exposed first In—Ga—Zn—O-based non-single-crystal film is selectively etched. As a result, an oxide semiconductor layer 16 including a region with a smaller thickness than a region overlapping with the source electrode layer 15a or the drain electrode layer 15b is formed. The source and drain electrode layers 15a and 15b, the source and drain regions 14a and 14b, and the exposed first In—Ga—Zn—O-based non-single-crystal film are etched in one step. Therefore, edge portions of the source and drain electrode layers 15a and 15b and the source and drain regions 14a and 14b are aligned and continuous as illustrated in FIG. 1A. Note that the etching of the source and drain electrode layers 15a and 15b, the source and drain regions 14a and 14b, the exposed first In—Ga—Zn—O-based non-single-crystal film is not limited to the one-time etching, and the etching may be performed in a plurality of steps.

After the resist mask is removed, heat treatment at 200° C. to 600° C., typically 300° C. to 500° C., is preferably performed. Here, heat treatment is performed in a furnace at 350° C. for 1 hour in a nitrogen atmosphere including oxygen. Through this heat treatment, rearrangement at the atomic level occurs in the first In—Ga—Zn—O-based non-single-crystal film. Because strain which inhibits carrier movement is released by the heat treatment, the heat treatment (which may be optical annealing) is important. In addition, resistance of the second In—Ga—Zn—O-based non-single-crystal film is lowered and the source and drain regions 14a and 14b having low resistance are formed. There is no particular limitation on when to perform the heat treatment as long as it is performed after the formation of the second In—Ga—Zn—O-based non-single-crystal film.

Next, a resin layer 17 is formed with a thickness in the range of 0.5 μm to 3 μm to cover the source and drain electrode layers 15a and 15b and the oxide semiconductor layer 16 including the region having a small thickness. As a photosensitive or non-photosensitive organic material for the resin layer 17, polyimide, acrylic, polyamide, polyimideamide, resist, benzocyclobutene, or a stack of any of these materials is used. Here, photosensitive polyimide is formed by a coating method for the purpose of reduction of the number of steps. Exposure, development, and baking are performed and the resin layer 17 formed form polyimide having a thickness of 1.5 μm whose surface is flat is formed. The resin layer 17 functions as a first protective insulating layer which protects the oxide semiconductor layer 16 including the region having a small thickness and the source and drain regions 14a and 14b from plasma damage in a later step of formation of a second protective insulating layer. The resin layer 17 covering the exposed region having a small thickness of the oxide semiconductor layer 16 also has a function as the first protective insulating layer which blocks moisture, hydrogen, or the like from entering the oxide semiconductor layer 16.

In addition, before formation of the resin layer 17, the exposed region having a small thickness of the oxide semiconductor layer 16 may be subjected to oxygen radical treatment. By the oxygen radical treatment, an exposed surface and its vicinity of the oxide semiconductor layer can be modified into an oxygen-excess region. Oxygen radicals may be produced in a plasma generation apparatus with the use of a gas including oxygen, or in an ozone generation apparatus. By exposing a thin film to the produced oxygen radicals or oxygen, the surface of the film can be modified. The radical treatment is not limited to one using oxygen radicals, and may be performed using argon and oxygen radicals. The treatment using argon and oxygen radicals is treatment in which an argon gas and an oxygen gas are introduced to generate plasma, thereby modifying a surface of a thin film.

Then, a second protective insulating layer 18 is formed to a thickness of 50 nm to 400 nm by a PCVD method or a sputtering method under a low power condition (or at a low substrate temperature of 200° C. or lower, preferably from a room temperature to 100° C.). Alternatively, the second protective insulating layer 18 may be formed under a low power condition using a high-density plasma apparatus. The second protective insulating layer 18 obtained by a high-density plasma apparatus can be denser than that obtained by a PCVD method. The second protective insulating layer 18 is formed using a silicon nitride film, a silicon oxynitride film, or a silicon nitride oxygen film, and blocks moisture, hydrogen ions, OH$^-$, and the like. Here, a silicon nitride film having a thickness of 200 nm is formed by a PCVD method under the following conditions: the flow rate of a silane gas is 35 sccm, the flow rate of ammonia ($NH_3$) is 300 sccm, and the flow rate of a hydrogen gas is 800 sccm; the pressure is 60 Pa, the RF electric power is 300 W; and the power frequency is 13.56 MHz.

Then, a conductive layer is formed. After that, a photolithography step is performed to form a resist mask over the conductive layer and unnecessary portions are removed by etching so that wirings and electrodes (wirings including a second gate electrode 19 and the like) are formed. When the second gate electrode 19 is selectively etched so that a top surface thereof has a desired shape, the second protective insulating layer 18 can function as an etching stopper.

As the conductive layer formed over the second protective insulating layer 18, a metal material (an element selected from aluminum (Al), copper (Cu), titanium (Ti), tantalum (Ta), tungsten (W), molybdenum (Mo), chromium (Cr), neodymium (Nd), and scandium (Sc), or an alloy including any of these elements as a component) can be used. These films have a light-blocking property, and therefore can block light to the oxide semiconductor layer.

In the cross section of FIG. 1A, the width of the second gate electrode 19 is larger than that of the first gate electrode 11 and larger than that of the oxide semiconductor layer. It is effective that light is blocked by increasing the width of the second gate electrode 19 than that of the oxide semiconductor layer so that the second gate electrode 19 covers the top surface of the oxide semiconductor. Since the region having a small thickness of the oxide semiconductor layer 16 is not covered with the source or drain electrode layer, there is a possibility that the electric characteristics of the thin film transistor are changed due to light irradiation. Since the In—Ga—Zn—O-based non-single-crystal film formed by a sputtering method is sensitive to light having a wavelength of 450 nm or less, provision of the second gate electrode 19, which is a light-blocking layer blocking light having a wavelength of 450 nm or less, is useful.

Alternatively, the conductive layer formed over the second protective insulating layer 18 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added. In the case of using a light-transmitting conductive material, when the same material as that used for a pixel electrode is used, the second gate electrode and the pixel electrode can be formed using the same photomask. When the second gate electrode and the pixel electrode are formed using the same material, the number of steps can be reduced. In the case where the second gate electrode is formed using a light-transmitting conductive material, it is preferable that a light-blocking layer for shielding the oxide semiconductor layer 16 including the region having a small thickness from light be separately formed over the region with a small thickness of the oxide semiconductor layer 16. A material having a light transmittance of at least less than 50%, preferably less than 20% at a wavelength of 400 nm to 450 nm is used for the light-blocking layer. For example, a metal film of chromium or titanium nitride or a black resin can be used as a material of the light-blocking layer. In the case of using a black resin for blocking light, as the light intensity is higher, the film of the black resin needs to be thicker. Therefore, in the case where the film of the light-blocking layer needs to be thin, a metal film which has a high light-blocking property and can be subjected to a fine etching process and can be thinned is preferably used.

Through the above process, a thin film transistor 20 illustrated in FIG. 1A can be obtained.

A general photomask is used for the photolithography step in an example described above. When a resist mask having regions with a plurality of thicknesses (typically, two kinds of thicknesses), which is formed by a photolithography step using a multi-tone mask, is used, the number of resist masks can be reduced and therefore the process can be simplified and cost can be reduced. Note that in this specification, a gray-tone light-exposure mask and a half-tone light-exposure mask are collectively referred to as a multi-tone mask, for convenience. In the case of using a multi-tone mask, after a stack of the first In—Ga—Zn—O-based non-single-crystal film, the second In—Ga—Zn—O-based non-single-crystal film, and the conductive film is formed, a resist mask having regions with a plurality of thicknesses is formed. Then, by using the resist mask, the oxide semiconductor layer having the region with a small thickness, and the source and drain electrode layers are formed. In this case, edge portions of the source and drain electrode layers and edge portions of the oxide semiconductor layer are aligned and continuous, while side surfaces of the oxide semiconductor layer are exposed. Accordingly, when the resin layer is formed, the side surfaces and the region which does not overlap with the source or drain electrode layer (the region with a small thickness) of the oxide semiconductor layer are in contact with the resin layer.

In addition, when the second gate electrode 19 and the first gate electrode 11 are electrically connected to each other in order that the second gate electrode 19 and the first gate electrode 11 have the same potential, before the second gate electrode 19 is formed over the second protective insulating layer 18, a photolithography step is performed to form a resist mask over the second protective insulating layer 18, and unnecessary portions are removed by etching and an opening reaching the first gate electrode 11 is formed.

Note that in the case where the second gate electrode 19 and the first gate electrode 11 have different potentials, the opening for electrical connection of the second gate electrode 19 and the first gate electrode 11 is not required.

Figure 1B:
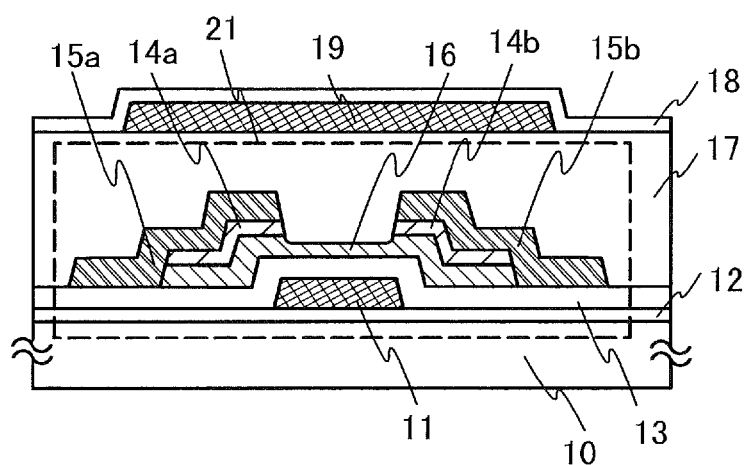

FIG. 1B is partly different from FIG. 1A. In FIG. 1B, the same portions as those of FIG. 1A other than different portions are denoted by the same reference numerals.

FIG. 1B illustrates an example in which the second gate electrode 19 and the second protective insulating layer 18 are formed in an order different from those in FIG. 1A.

As illustrated in FIG. 1B, the second gate electrode 19 of a thin film transistor 21 is formed over and in contact with the resin layer 17 that is the first protective insulating film and provided between the resin layer 17 and the second protective insulating layer 18. The second gate insulating layer of the thin film transistor 20 in FIG. 1A is a stack of the resin layer 17 and the second protective insulating layer 18, whereas the second gate insulating layer of the thin film transistor 21 is the resin layer 17 alone. In the case where the second gate electrode 19 is provided between the resin layer 17 and the second protective insulating layer 18, the second gate electrode 19 as well as the resin layer 17 has an effect of reducing plasma damage to the oxide semiconductor layer 16.

In addition, FIG. 1B illustrates an example in which a base insulating layer 12 is provided between the first gate electrode 11 and the substrate 10. In the case where a silicon oxynitride film, a silicon nitride oxide film, a silicon nitride film, or the like having a thickness of 50 nm to 200 nm is used as the base insulating layer 12, the base insulating layer 12 can block an impurity from the glass substrate, sodium for example, from diffusing into and entering an oxide semiconductor to be formed later over the base insulating layer 12. In addition, in the case where the base insulating layer 12 is provided, the substrate 10 can be prevented from being etched in the etching step for forming the first gate electrode 11.

Further, in a preferred structure, the base insulating layer 12 and the second protective insulating layer 18 are in contact with each other on the periphery of the substrate so that the thin film transistor 20 is sealed. In a structure in which the base insulating layer 12 and the second protective insulating layer 18 are in contact with each other on the periphery of the substrate, the protective layers such as a silicon nitride film lie above, below, and around the thin film transistor 20 to encapsulate the thin film transistor 20, whereby entry of impurity elements such as moisture from the outside can be prevented. In a structure in which the base insulating layer 12 and the second protective insulating layer 18 are in contact with each other on the periphery of the substrate, the reliability of the thin film transistor can be further improved.

Figure 1C:
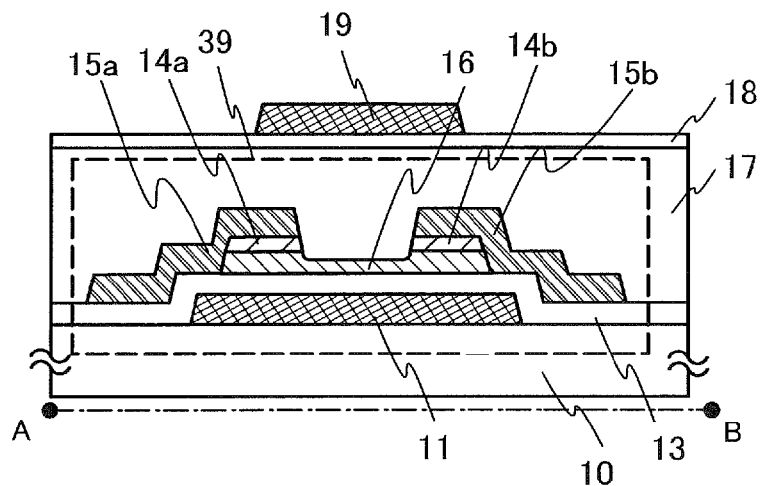

FIG. 1C is partly different from FIG. 1A. In FIG. 1C, the same portions as those of FIG. 1A other than different portions are denoted by the same reference numerals.

A thin film transistor 39 in FIG. 1C is given as an example in which the widths of the first gate electrode 11 and the second gate electrode 19 are different from those in FIG. 1A. In FIG. 1C, the width of the first gate electrode 11 in a channel length direction is larger than the width of the oxide semiconductor layer 16, and the width of the second gate electrode 19 in the channel length direction is smaller than the width of the oxide semiconductor layer. As shown in FIG. 1C, it is acceptable as long as the second gate electrode 19 has a width in the channel length direction which is at least the same or larger than the width of the region with a small thickness of the oxide semiconductor layer 16 (the region in contact with the resin layer 17) and overlaps with the region with a small thickness of the oxide semiconductor layer 16, whereby parasitic capacitance can be decreased.

(Embodiment 2)

Figure 2A:
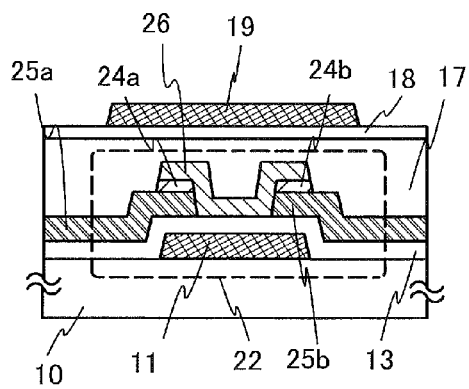
FIGS. 2A to 2D are cross-sectional views of one embodiment of the present invention.

FIG. 2A is an example of a cross-sectional view of a thin film transistor in which an oxide semiconductor layer is sandwiched between two gate electrodes provided over and below the oxide semiconductor layer. This embodiment describes an example of a manufacturing method by which a thin film transistor used for a pixel portion and a driver circuit is provided over a substrate having an insulating surface.

The same steps as Embodiment 1 are employed from formation of the first gate electrode 11 over the substrate 10 having an insulating surface up to formation of the first gate insulating layer 13 covering the first gate electrode 11. Therefore, detailed description is omitted here and the same portions as those of FIG. 1A are denoted by the same reference numerals.

A conductive film is formed from a metal material over the first gate insulating layer 13 by a sputtering method or a vacuum evaporation method. In this embodiment, a three-layer structure of a Ti film, an aluminum film including Nd, and a Ti film formed by a sputtering method is employed. As a material for the conductive film, an element selected from Al, Cr, Ta, Ti, Mo, and W; an alloy including any of these elements as a component; an alloy film including a combination of any of these elements; and the like can be given. Further, the conductive film may have a two-layer structure, and a titanium film may be stacked over an aluminum film. Alternatively, the conductive film may have a single-layer structure of an aluminum film including silicon or a single-layer structure of a titanium film.

Then, an oxide semiconductor film (a buffer layer) having low resistance is formed by a sputtering method without exposure to air. There is no particular limitation on a material of a buffer layer as long as the film has lower resistance than an oxide semiconductor layer 26 formed later. As the buffer layer, an oxynitride film including indium (In), gallium (Ga), and zinc (Zn) is formed over the conductive film by using an oxide semiconductor target including indium, gallium, and zinc ($In_2O_3:Ga_2O_3:ZnO=1:1:1$) in an atmosphere including a nitrogen gas by a sputtering method. Alternatively, as the butter layer, an In—Sn—O-based oxide semiconductor film including $SiO_x$ is formed over the conductive film by using an In—Sn—O-based oxide semiconductor target including $SiO_2$ at 5 wt % or more and 50 wt % or less by a sputtering method. In this embodiment, the buffer layer is formed to a thickness of 10 nm under the following conditions: an oxide semiconductor target ($In_2O_3:SnO_2:SiO_2=85:10:5$), that is, an oxide semiconductor target including $SiO_2$ at 5 wt %) is used, the flow rate of Ar is 72 sccm, the flow rate of oxygen is 3 sccm, the electric power is 3.2 kw, and the pressure is 0.16 Pa. Note that in order to reduce plasma damage to the buffer layer, the electric power may be reduced to 1 kw at the formation.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering method in which a voltage is also applied to a substrate during deposition.

The target is formed by attaching a target material to a backing plate (a plate for attaching a target thereto). As for the attachment of the target material to the backing plate, the target material may be divided and attached to one backing plate. A case where four target materials are attached to one backing plate is referred to as four divisions. Further, a case where nine target materials are attached to one backing plate is referred to as nine divisions. There is no particular limitation of the number of divisions of target materials. When the divided target materials are used, warpage of the target can be relaxed in the attachment of the target materials to the backing plate. In particular, when a thin film is formed over a large substrate, such divided targets can be suitably used for a target which is upsized in accordance with the size of the large substrate. Needless to say, one target material may be attached to one backing plate.

Next, a photolithography step is performed to form a resist mask over the buffer layer, and unnecessary portions are removed by etching and a source and drain electrode layers 25a and 25b are formed. The buffer layer whose top surface has the same shape as the source and drain electrode layers 25a and 25b remains over the source and drain electrode layers 25a and 25b. After that, the resist mask is removed.

Next, an oxide semiconductor film having a thickness of 5 nm to 200 nm is formed. In this embodiment, the oxide semiconductor film is formed to a thickness of 50 nm under the following formation conditions: an oxide semiconductor target including indium (In), gallium (Ga), and zinc (Zn) ($In_2O_3:Ga_2O_3:ZnO=1:1:1$) is used, the flow rate of Ar is 50 sccm, the flow rate of oxygen is 20 sccm, the electric power is 1 kw, and the pressure is 0.22 Pa.

In addition, before the oxide semiconductor film is formed, plasma treatment for removing dust attached to surfaces of the source and drain electrode layers 25a and 25b is preferably performed. For example, the plasma treatment is performed also on the exposed gate insulating layer by performing reverse sputtering in which plasma is generated by an RF power supply by introduction of an argon gas.

Next, a photolithography step is performed to form a resist mask over the oxide semiconductor film, and unnecessary portions are removed by etching and the oxide semiconductor layer 26 is formed. In addition, the buffer layer is selectively etched using the same resist mask and a source and drain regions 24a and 24b are formed.

After the resist mask is removed, heat treatment at 200° C. to 600° C., typically 300° C. to 500° C., is preferably performed. Here, heat treatment is performed in a furnace at 350° C. for 1 hour in a nitrogen atmosphere including oxygen. Through this heat treatment, rearrangement at the atomic level occurs in the In—Ga—Zn—O-based non-single-crystal film. Because strain which inhibits carrier movement is released by the heat treatment, the heat treatment (which may be optical annealing) is important.

Then, the resin layer 17 is formed with a thickness in the range of 0.5 µm to 3 µm to cover the source and drain electrode layers 25a and 25b and the oxide semiconductor layer 26. As a photosensitive or non-photosensitive organic material for the resin layer 17, polyimide, acrylic, polyamide, polyimideamide, resist, benzocyclobutene, or a stack of any of these materials is used.

Note that steps after formation of the resin layer 17 are the same as those of Embodiment 1 and therefore are briefly described here.

Then, the second protective insulating layer 18 is formed over the resin layer 17 to a thickness of 50 nm to 400 nm by a PCVD method or a sputtering method under a low power condition (or at a low substrate temperature of 200° C. or lower, preferably from a room temperature to 100° C.). Alternatively, the second protective insulating layer 18 may be formed under a low power condition using a high-density plasma apparatus.

Then, a conductive layer is formed. After that, a photolithography step is performed to form a resist mask over the conductive layer and unnecessary portions are removed by etching so that wirings and electrodes (wirings including the second gate electrode 19 and the like) are formed.

Through the above process, a thin film transistor 22 illustrated in FIG. 2A can be obtained. The thin film transistor 22 includes a region where parts of the source and drain electrode layers 25a and 25b overlap with parts of the oxide semiconductor layer 26. In that region, the source and drain regions 24a and 24b are provided to form an NI junction. The resin layer 17 is formed to protect the NI junction. The second protective insulating layer 18 is formed thereover by a PCVD method under a low power condition. A change of the oxide semiconductor layer 26 and the source and drain regions 24a and 24b can be prevented during formation of the second protective insulating layer 18, so that electric characteristics of the thin film transistor can be prevented from being changed and can be stabilized.

Figure 2B:
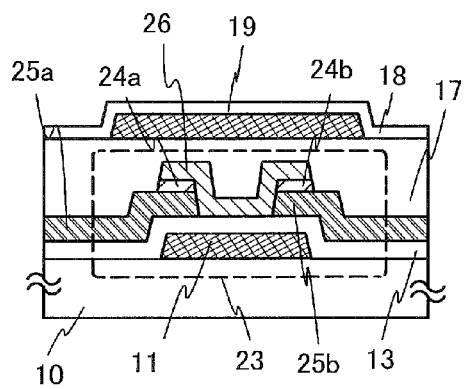

FIG. 2B is partly different from FIG. 2A. In FIG. 2B, the same portions as those of FIG. 2A other than different portions are denoted by the same reference numerals.

FIG. 2B illustrates an example in which the second gate electrode 19 and the second protective insulating layer 18 are formed in an order different from those in FIG. 2A.

As illustrated in FIG. 2B, the second gate electrode 19 of a thin film transistor 23 is formed over and in contact with the resin layer 17 that is the first protective insulating film and provided between the resin layer 17 and the second protective insulating layer 18. In the case where the second gate electrode 19 is provided between the resin layer 17 and the second protective insulating layer 18, the second gate electrode 19 as well as the resin layer 17 has an effect of reducing plasma damage to the oxide semiconductor layer 26.

Figure 2C:
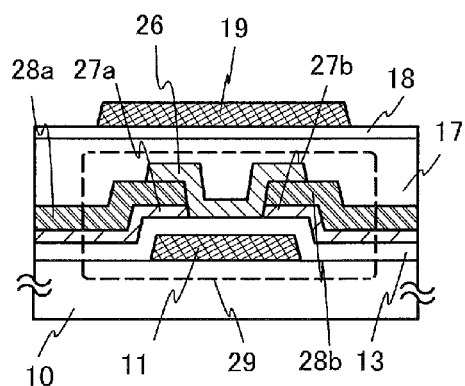

FIG. 2C is partly different from FIG. 2A. In FIG. 2C, the same portions as those of FIG. 2A other than different portions are denoted by the same reference numerals.

FIG. 2C illustrates an example which differs from FIG. 2A in positional relation between the source and drain regions and the source and drain electrode layers. A source region 27a (or a drain region 27b) is provided under a source electrode layer 28a (or a drain electrode layer 28b). The source electrode layer 28a (or the drain electrode layer 28b)

has an effect of reducing plasma damage to the source region 27a (or the drain region 27b).

In other words, as a blocking layer for reducing plasma damage to the source and drain regions 27a and 27b, three layers (the source and drain electrode layers 28a and 28b, the resin layer 17, and the second gate electrode 19) are formed over the source and drain regions 27a and 27b; therefore, plasma damage to the source and drain regions 27a and 27b is further reduced.

As for a thin film transistor 29 illustrated in FIG. 2C, an oxide semiconductor film having low resistance is formed over and in contact with the first gate insulating layer 13 and a conductive film is formed thereover. After that, the oxide semiconductor film having low resistance is etched using the same resist mask as that used for selectively etching the conductive film. Therefore, top surfaces of the source and drain regions 27a and 27b which are formed by etching the oxide semiconductor film having low resistance have approximately the same shape as top surfaces of the source and drain electrode layers 28a and 28b which are formed over the source and drain regions 27a and 27b. The top surfaces and side surfaces of the source and drain electrode layers 28a and 28b are formed in contact with the oxide semiconductor layer 26.

Figure 2D:
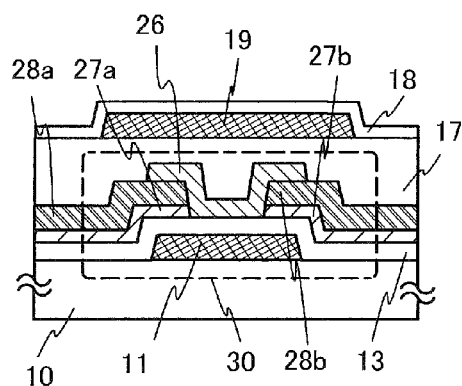

FIG. 2D is partly different from FIG. 2C. In FIG. 2D, the same portions as those of FIG. 2C other than different portions are denoted by the same reference numerals.

FIG. 2D illustrates an example in which the second gate electrode 19 and the second protective insulating layer 18 are formed in an order different from those in FIG. 2C.

As illustrated in FIG. 2D, the second gate electrode 19 of a thin film transistor 30 is formed over and in contact with the resin layer 17 that is the first protective insulating film and provided between the resin layer 17 and the second protective insulating layer 18. In the case where the second gate electrode 19 is provided between the resin layer 17 and the second protective insulating layer 18, the second gate electrode 19 as well as the resin layer 17 has an effect of reducing plasma damage to the oxide semiconductor layer 26.

This embodiment can be implemented in an appropriate combination with any of the structures described in Embodiment 1.

(Embodiment 3)

Figure 3A:
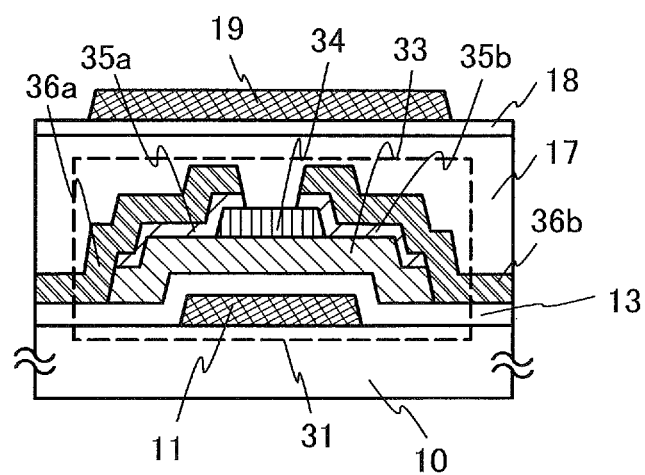
FIGS. 3A and 3B are cross-sectional views of one embodiment of the present invention.

FIG. 3A is an example of a cross-sectional view of a thin film transistor in which an oxide semiconductor layer is sandwiched between two gate electrodes provided over and below the oxide semiconductor layer. This embodiment describes an example of a manufacturing method by which a thin film transistor used for a pixel portion and a driver circuit is provided over a substrate having an insulating surface.

Note that steps in which the first gate electrode 11 is formed over the substrate 10 having an insulating surface, the first gate insulating layer 13 covering the first gate electrode 11 is formed, and an oxide semiconductor film is formed are the same as those of Embodiment 1. Therefore, detailed description is omitted here and the same portions as those of FIG. 1A are denoted by the same reference numerals.

In this embodiment, an oxide semiconductor film over the first gate insulating layer 13 is formed using a Zn—O-based oxide semiconductor target including $SiO_2$ at 5 wt % to 50 wt % inclusive, preferably 10 wt % to 30 wt % inclusive, so that a Zn—O-based oxide semiconductor film including $SiO_X$ (X>0) which inhibits crystallization is formed.

Then, a channel protective film is formed over the Zn—O-based oxide semiconductor film by a sputtering method without exposure to air. As a material of the channel protective film, an inorganic material (a silicon oxide film, a silicon nitride film, a silicon oxynitride film, a silicon nitride oxide film, or the like) can be used.

Note that a silicon oxynitride film refers to a film that includes more oxygen than nitrogen in the case where measurements are performed using Rutherford backscattering spectrometry (RBS) and hydrogen forward scattering (HFS). In addition, a silicon nitride oxide film refers to a film that includes more nitrogen than oxygen in the case where measurements are performed using RBS and HFS.

Next, a photolithography step is performed to form a resist mask over the channel protective film. Then, unnecessary portions are removed by etching and a channel protective layer 34 is formed. Note that the width of the first gate electrode 11 is larger than the width of the channel protective layer 34 (the width in the channel length direction).

As a material of the channel protective layer 34, not only an inorganic insulating material but also an amorphous semiconductor or a compound thereof, typically amorphous silicon, a film of which is obtained by a sputtering method can be used. A compound of an amorphous silicon film used for the channel protective layer refers to a p-type amorphous silicon film including a p-type impurity element such as boron which is formed by a sputtering method, or an n-type amorphous silicon film including an n-type impurity element such as phosphorus which is formed by a sputtering method. In particular, in the case of using a p-type amorphous silicon film for the channel protective layer 34, an effect of reducing leakage current in an off state and cancelling carriers (electrons) generated in the oxide semiconductor layer provided in contact with the p-type amorphous silicon film is obtained. In the case where an amorphous silicon film is used as the channel protective layer 34, the amorphous silicon film has a blocking function against moisture, hydrogen ions, $OH^-$, and the like. In addition, the channel protective layer formed of an amorphous silicon film also functions as a light-blocking layer which blocks incidence of light to the oxide semiconductor.

In this embodiment, an amorphous silicon film including boron obtained by a sputtering method using a target including boron is used as the channel protective layer 34. The amorphous silicon film including boron is formed in a low power condition or at a substrate temperature of less than 200° C. Since the channel protective layer 34 is formed in contact with the Zn—O-based non-single-crystal film, damage to the Zn—O-based non-single-crystal film at the time of forming and etching the channel protective layer 34 is preferably reduced as much as possible.

Next, an oxide semiconductor film (an In—Ga—Zn—O—N-based non-single-crystal film in this embodiment) having lower resistance than the Zn—O-based non-single-crystal film is formed over the Zn—O-based non-single-crystal film and the protective layer 34 by a sputtering method. In this embodiment, an oxynitride film including indium (In), gallium (Ga), and zinc (Zn) is formed by using an oxide semiconductor target including indium, gallium, and zinc ($In_2O_3$:$Ga_2O_3$:ZnO=1:1:1) in an atmosphere including a nitrogen gas by a sputtering method. The oxynitride film becomes the oxide semiconductor film having low resistance by heat treatment performed later.

Next, a photolithography step is performed to form a resist mask over the In—Ga—Zn—O—N-based non-single-crystal film. Then, the Zn—O-based non-single-crystal film and the In—Ga—Zn—O—N-based non-single-crystal film are etched. After the etching, a side surface of an oxide semiconductor layer 33 formed from the Zn—O-based non-single-crystal film is exposed. Note that etching here is not limited to wet etching and dry etching may be performed.

Next, the resist mask is removed and then a conductive film formed from a metal material is formed over the In—Ga—Zn—O—N-based non-single-crystal film by a sputtering method or a vacuum evaporation method. As a material for the conductive film, an element selected from Al, Cr, Ta, Ti, Mo, and W; an alloy including any of these elements as a component; an alloy including a combination of any of these elements; and the like can be given. Further, in the case where heat treatment is performed at 200° C. to 600° C., the conductive film preferably has heat resistance for such heat treatment.

A photolithography step is performed to form a resist mask over the conductive film. Unnecessary portions are removed by etching, and a source and drain electrode layers 36a and 36b are formed. In this etching, the channel protective layer 34 functions as an etching stopper of the oxide semiconductor layer 33. Therefore, the oxide semiconductor layer 33 is not etched. In addition, in this etching, the In—Ga—Zn—O—N-based non-single-crystal film is selectively etched using the same resist mask and a source and drain regions 35a and 35b are formed.

Because of the structure in which the channel protective layer 34 is provided over and in contact with a channel formation region of the oxide semiconductor layer 33, damage to the channel formation region of the oxide semiconductor layer 33 (for example, reduction in thickness due to plasma or an etchant in etching, or oxidation) in the manufacturing process can be prevented. Therefore, reliability of a thin film transistor 31 can be improved.

After the resist mask is removed, heat treatment at 200° C. to 600° C., typically 300° C. to 500° C., is preferably performed. Here, heat treatment is performed in a furnace at 350° C. for 1 hour in a nitrogen atmosphere or a nitrogen atmosphere including oxygen.

Then, the resin layer 17 is formed with a thickness in the range of 0.5 μm to 3 μm to cover the source and drain electrode layers 36a and 36b and the channel protective layer 34. As a photosensitive or non photosensitive organic material for the resin layer 17, polyimide, acrylic, polyamide, polyimideamide, resist, benzocyclobutene, or a stack of any of these materials is used.

Note that steps after formation of the resin layer 17 are the same as those of Embodiment 1 and therefore are briefly described here.

Then, the second protective insulating layer 18 is formed over the resin layer 17 to a thickness of 50 nm to 400 nm by a PCVD method or a sputtering method under a low power condition (or at a low substrate temperature of 200° C. or lower, preferably from a room temperature to 100° C.). Alternatively, the second protective insulating layer 18 may be formed under a low power condition using a high-density plasma apparatus.

Then, a conductive layer is formed. After that, a photolithography step is performed to form a resist mask over the conductive layer and unnecessary portions are removed by etching so that wirings and electrodes (wirings including the second gate electrode 19 and the like) are formed.

Through the above process, the thin film transistor 31 illustrated in FIG. 3A can be obtained. Note that in the thin film transistor 31, a stack of the channel protective layer 34, the resin layer 17, and the second protective insulating layer 18 functions as the second gate insulating layer.

By making the width of the second gate electrode 19 larger than the width of the first gate electrode 11 and the width of the oxide semiconductor layer 33, gate voltage can be applied from the second gate electrode 19 to the whole oxide semiconductor layer 33. In addition, in the case where a stack of the resin layer 17 and the second protective insulating layer 18 is thick and parasitic capacitance does not cause a problem, the second gate electrode layer may cover a plurality of thin film transistors to be a common second gate electrode in the driver circuit and the area of the second gate electrode layer may be approximately the same as or larger than that of the driver circuit.

In the case where the stack of the resin layer 17 and the second protective insulating layer 18 is thin and the parasitic capacitance causes a problem, in the structure of FIG. 3A, it is preferable that the width of the first gate electrode 11 is set to be smaller than that of the second gate electrode 19 so that an area of the first gate electrode 11 which overlaps with the source electrode layer or the drain electrode layer is reduced, whereby the parasitic capacitance is reduced. Further, the width of the first gate electrode 11 may be set to be smaller than the width of the channel protective layer 34 and the width of the second gate electrode 19 may be set to be smaller than the width of the channel protective layer 34 so that the second gate electrode 19 does not overlap with the source or drain electrode layer, whereby more parasitic capacitance may be reduced.

Figure 3B:
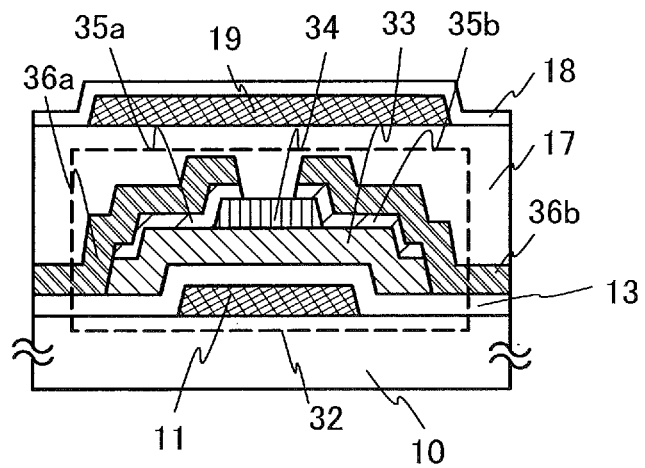

FIG. 3B is partly different from FIG. 3A. In FIG. 3B, the same portions as those of FIG. 3A other than different portions are denoted by the same reference numerals.

FIG. 3B illustrates an example in which the second gate electrode 19 and the second protective insulating layer 18 are formed in an order different from those in FIG. 3A.

As illustrated in FIG. 3B, the second gate electrode 19 of a thin film transistor 32 is formed over and in contact with the resin layer 17 that is the first protective insulating film and provided between the resin layer 17 and the second protective insulating layer 18. In the case where the second gate electrode 19 is provided between the resin layer 17 and the second protective insulating layer 18, the second gate electrode 19 as well as the resin layer 17 has an effect of reducing plasma damage to the oxide semiconductor layer 33.

This embodiment can be implemented in an appropriate combination with any of the structures described in the other embodiments.

(Embodiment 4)

Figure 4A:
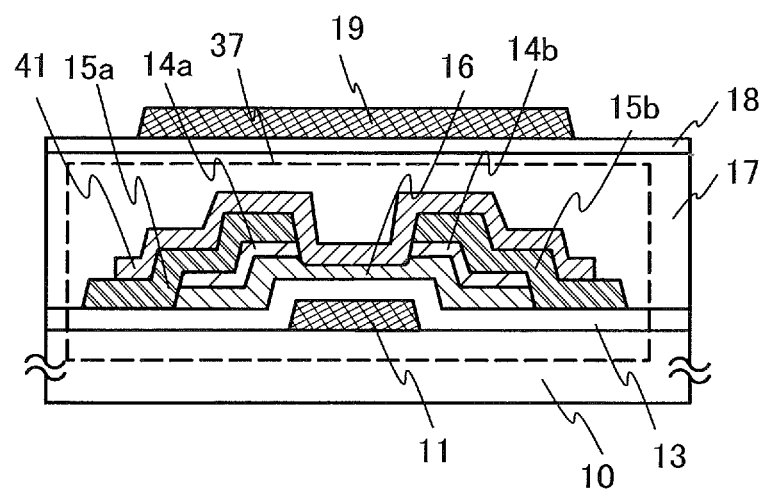
FIGS. 4A and 4B are cross-sectional views of one embodiment of the present invention.

FIG. 4A is an example of a cross-sectional view of a thin film transistor in which an oxide semiconductor layer is sandwiched between two gate electrodes provided over and below the oxide semiconductor layer. This embodiment describes an example of a thin film transistor used for a pixel portion and a driver circuit which are provided over a substrate having an insulating surface.

Note that this embodiment is the same as Embodiment 1 except that an amorphous silicon film is provided in contact with the oxide semiconductor layer 16. Therefore, detailed description is omitted here and the same portions as those of FIG. 1A are denoted by the same reference numerals. Steps are the same as those of Embodiment 1 before forming a region with a small thickness in the oxide semiconductor layer 16 by partly etching the oxide semiconductor layer 16 using the source and the drain electrode layers 15a and 15b as a mask.

According to Embodiment 1, the oxide semiconductor layer 16 including a region with a smaller thickness than a region overlapping with the source electrode layer 15a or the drain electrode layer 15b is formed.

Then, after removing the resist mask, a film of an amorphous semiconductor or a compound thereof, typically amorphous silicon, which is obtained by a sputtering method is formed. Note that a compound of an amorphous silicon film refers to a p-type amorphous silicon film including a p-type impurity element such as boron which is formed by a sputtering method, or an n-type amorphous silicon film including an n-type impurity element such as phosphorus which is formed by a sputtering method.

In order to reduce damage to the oxide semiconductor layer 16 as much as possible, the film is formed under a low power condition or a condition where a substrate temperature is lower than 200° C. In this embodiment, the amorphous silicon film is formed with a substrate temperature set at room temperature and electric power set at 1 kw.

In addition, before formation of the amorphous silicon film, the exposed region having a small thickness of the oxide semiconductor layer 16 may be subjected to oxygen radical treatment. By the oxygen radical treatment, an exposed surface and its vicinity of the oxide semiconductor layer can be modified into an oxygen-excess region. If the amorphous silicon film is formed on the oxygen-excess region formed by the oxygen radical treatment, a thin film of $SiO_X$ (X>0) is formed at an interface, whereby off current can be reduced.

Oxygen radicals may be produced in a plasma generation apparatus with the use of a gas including oxygen, or in an ozone generation apparatus. By exposing a thin film to the produced oxygen radicals or oxygen, the surface of the film can be modified. The radical treatment is not limited to one using oxygen radicals, and may be performed using argon and oxygen radicals. The treatment using argon and oxygen radicals is treatment in which an argon gas and an oxygen gas are introduced to generate plasma, thereby modifying a surface of a thin film.

Next, a photolithography step is performed to form a resist mask over the amorphous silicon film. Then, unnecessary portions are removed by etching and a channel protective layer 41 is formed. Note that an example in which the amorphous silicon film is selectively etched is described in this embodiment without particular limitations. A photolithography step here may be omitted in order to reduce the number of photomasks and steps. The channel protective layer 41 can be used as an interlayer film which blocks moisture, hydrogen ions, OH⁻, and the like. In addition, the channel protective layer 41 formed of the amorphous silicon film functions as a light-blocking layer which blocks incidence of light to the oxide semiconductor layer.

Then, the resin layer 17 is formed with a thickness in the range of 0.5 μm to 3 μm to cover the source and drain electrode layers 15a and 15b and the channel protective layer 41. As a photosensitive or non photosensitive organic material for the resin layer 17, polyimide, acrylic, polyamide, polyimideamide, resist, benzocyclobutene, or a stack of any of these materials is used.

Note that steps after formation of the resin layer 17 are the same as those of Embodiment 1 and therefore are briefly described here.

Then, the second protective insulating layer 18 is formed over the resin layer 17 to a thickness of 50 nm to 400 nm by a PCVD method or a sputtering method under a low power condition (or at a low substrate temperature of 200° C. or lower, preferably from a room temperature to 100° C.).

Alternatively, the second protective insulating layer 18 may be formed under a low power condition using a high-density plasma apparatus.

Then, a conductive layer is formed. After that, a photolithography step is performed to form a resist mask over the conductive layer and unnecessary portions are removed by etching so that wirings and electrodes (wirings including the second gate electrode 19 and the like) are formed.

Through the above process, a thin film transistor 37 illustrated in FIG. 4A can be obtained.

The channel protective layer 41 formed of the amorphous silicon film also functions as a light-blocking layer which blocks incidence of light to the oxide semiconductor layer. In this embodiment, an example is shown in which an amorphous silicon film is used as the channel protective layer 41. If a p-type amorphous silicon film is used as the channel protective layer 41, leakage current in an off state can be reduced and carriers (electrons) generated in the oxide semiconductor layer provided in contact with the p-type amorphous silicon film can be cancelled.

Figure 4B:
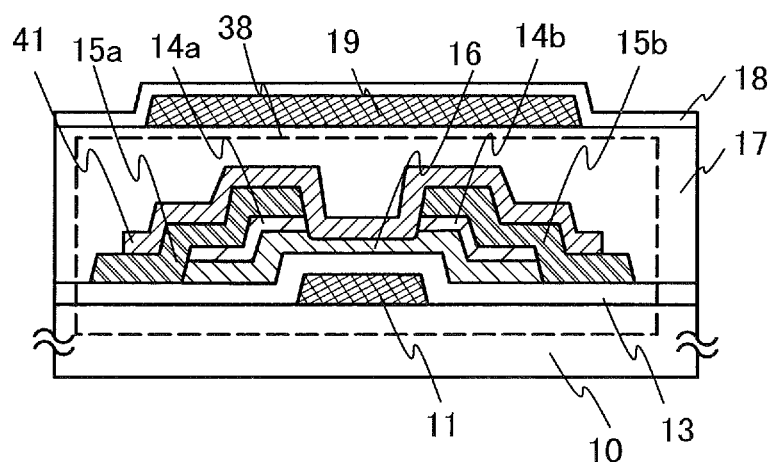

FIG. 4B is partly different from FIG. 4A. In FIG. 4B, the same portions as those of FIG. 4A other than different portions are denoted by the same reference numerals.

FIG. 4B illustrates an example in which the second gate electrode 19 and the second protective insulating layer 18 are formed in an order different from those in FIG. 4A.

As illustrated in FIG. 4B, the second gate electrode 19 of a thin film transistor 38 is formed over and in contact with the resin layer 17 that is the first protective insulating film and provided between the resin layer 17 and the second protective insulating layer 18. In the case where the second gate electrode 19 is provided between the resin layer 17 and the second protective insulating layer 18, the second gate electrode 19 as well as the channel protective layer 41 and the resin layer 17 has an effect of reducing plasma damage to the oxide semiconductor layer 16.

This embodiment can be implemented in an appropriate combination with any of the structures described in the other embodiments.

(Embodiment 5)

Figure 5A:
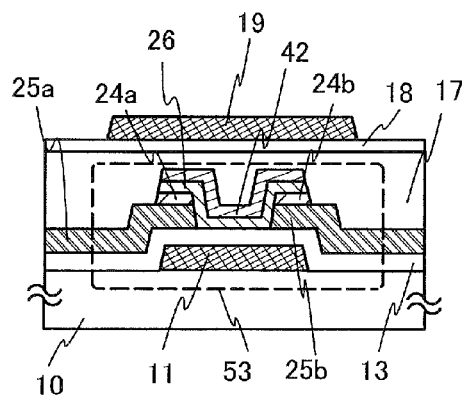
FIGS. 5A to 5D are cross-sectional views of one embodiment of the present invention.

FIG. 5A is an example of a cross-sectional view of a thin film transistor in which an oxide semiconductor layer is sandwiched between two gate electrodes provided over and below the oxide semiconductor layer. This embodiment describes an example of a thin film transistor used for a pixel portion and a driver circuit which are provided over a substrate having an insulating surface.

Note that this embodiment is the same as Embodiment 2 except that an amorphous silicon film is provided in contact with the oxide semiconductor layer 26. Therefore, detailed description is omitted here and the same portions as those of FIG. 2A are denoted by the same reference numerals. Steps are the same as those of Embodiment 2 up to formation of the oxide semiconductor film which is partly in contact with the first gate insulating layer 13.

After forming the oxide semiconductor film according to Embodiment 2, a film of an amorphous semiconductor or a compound thereof, typically amorphous silicon, which is obtained by a sputtering method is formed without exposure to air. Note that a compound of an amorphous silicon film refers to a p-type amorphous silicon film including a p-type impurity element such as boron which is formed by a sputtering method, or an n-type amorphous silicon film including an n-type impurity element such as phosphorus which is formed by a sputtering method.

In order to reduce damage to the oxide semiconductor layer 26 as much as possible, the film is formed under a low power condition or a condition where a substrate temperature is lower than 200° C. In this embodiment, the amorphous silicon film including boron is formed with a substrate temperature set at room temperature and electric power set at 1 kw.

In addition, before formation of the amorphous silicon film including boron, the exposed region of the oxide semiconductor film may be subjected to oxygen radical treatment. By the oxygen radical treatment, a surface and its vicinity of the oxide semiconductor film can be modified into an oxygen-excess region. If the amorphous silicon film is formed on the oxygen-excess region formed by the oxygen radical treatment, a thin film of $SiO_X$ (X>0) is formed at an interface, whereby off current can be reduced.

Oxygen radicals may be produced in a plasma generation apparatus with the use of a gas including oxygen, or in an ozone generation apparatus. By exposing a thin film to the produced oxygen radicals or oxygen, the surface of the film can be modified. The radical treatment is not limited to one using oxygen radicals, and may be performed using argon and oxygen radicals. The treatment using argon and oxygen radicals is treatment in which an argon gas and an oxygen gas are introduced to generate plasma, thereby modifying a surface of a thin film.

Next, a photolithography step is performed to form a resist mask over the amorphous silicon film including boron. Then, unnecessary portions are removed by etching and a channel protective layer 42 is formed. The channel protective layer 42 can be used as an interlayer film which blocks moisture, hydrogen ions, OH⁻, and the like. In addition, the channel protective layer 42 formed of the amorphous silicon film functions as a light-blocking layer which blocks incidence of light to the oxide semiconductor layer. In addition, unnecessary portions of the oxide semiconductor film are removed using the same resist mask and the oxide semiconductor layer 26 is formed. Further, the buffer layer is selectively etched using the same mask and the source and drain regions 24a and 24b are formed.

After the resist mask is removed, heat treatment at 200° C. to 600° C., typically 300° C. to 500° C., is preferably performed. Here, heat treatment is performed in a furnace at 350° C. for 1 hour in a nitrogen atmosphere including oxygen.

Then, the resin layer 17 is formed with a thickness in the range of 0.5 μm to 3 μm to cover the source and drain electrode layers 25a and 25b and the oxide semiconductor layer 26. As a photosensitive or non photosensitive organic material for the resin layer 17, polyimide, acrylic, polyamide, polyimideamide, resist, benzocyclobutene, or a stack of any of these materials is used.

Note that steps after formation of the resin layer 17 are the same as those of Embodiment 2 and therefore, are briefly described here.

Then, the second protective insulating layer 18 is formed over the resin layer 17 to a thickness of 50 nm to 400 nm by a PCVD method or a sputtering method under a low power condition (or at a low substrate temperature of 200° C. or lower, preferably from a room temperature to 100° C.). Alternatively, the second protective insulating layer 18 may be formed under a low power condition using a high-density plasma apparatus.

Then, a conductive layer is formed. After that, a photolithography step is performed to form a resist mask over the conductive layer and unnecessary portions are removed by etching so that wirings and electrodes (wirings including the second gate electrode 19 and the like) are formed.

Through the above process, a thin film transistor 53 illustrated in FIG. 5A can be obtained.

Figure 5B:
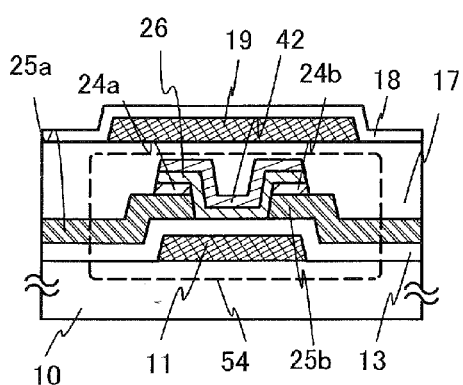

FIG. 5B is partly different from FIG. 5A. In FIG. 5B, the same portions as those of FIG. 5A other than different portions are denoted by the same reference numerals.

FIG. 5B illustrates an example in which the second gate electrode 19 and the second protective insulating layer 18 are formed in an order different from those in FIG. 5A.

As illustrated in FIG. 5B, the second gate electrode 19 of a thin film transistor 54 is formed over and in contact with the resin layer 17 that is the first protective insulating film and provided between the resin layer 17 and the second protective insulating layer 18. In the case where the second gate electrode 19 is provided between the resin layer 17 and the second protective insulating layer 18, the second gate electrode 19 as well as the channel protective layer 42 and the resin layer 17 has an effect of reducing plasma damage to the oxide semiconductor layer 26.

Figure 5C:
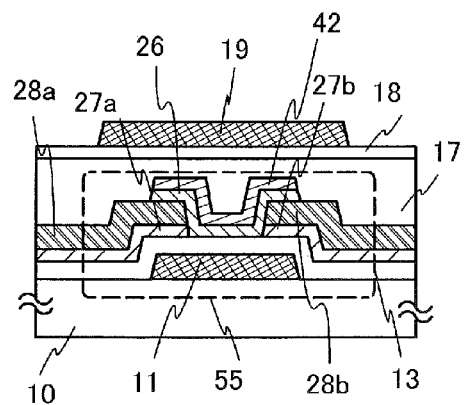

FIG. 5C is partly different from FIG. 5A. In FIG. 5C, the same portions as those of FIG. 5A other than different portions are denoted by the same reference numerals.

FIG. 5C illustrates an example which differs from FIG. 5A in positional relation between the source and drain regions and the source and drain electrode layers. The source region 27a (or the drain region 27b) is provided under the source electrode layer 28a (or the drain electrode layer 28b). The source electrode layer 28a (or the drain electrode layer 28b) has an effect of reducing plasma damage to the source region 27a (or the drain region 27b).

In other words, as a blocking layer for reducing plasma damage to the source and drain regions 27a and 27b, four layers (the source and drain electrode layers 28a and 28b, the resin layer 17, the channel protective layer 42, and the second gate electrode 19) are formed over the source and drain regions 27a and 27b; therefore, plasma damage to the source and drain regions 27a and 27b is further reduced.

As for a thin film transistor 55 illustrated in FIG. 5C, an oxide semiconductor film having low resistance is formed over and in contact with the first gate insulating layer 13 and a conductive film is formed thereover. After that, the oxide semiconductor film having low resistance is etched using the same resist mask as that used for selectively etching the conductive film. Therefore, top surfaces of the source and drain regions 27a and 27b which are formed by etching the oxide semiconductor film having low resistance have approximately the same shape as top surfaces of the source and drain electrode layers 28a and 28b which are formed over the source and drain regions 27a and 27b. The top surfaces and side surfaces of the source and drain electrode layers 28a and 28b are formed in contact with the oxide semiconductor layer 26.

Figure 5D:
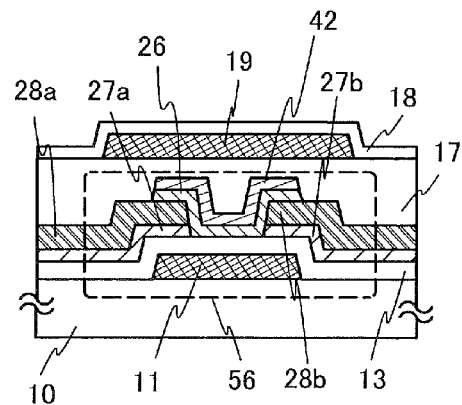

FIG. 5D is partly different from FIG. 5C. In FIG. 5D, the same portions as those of FIG. 5C other than different portions are denoted by the same reference numerals.

FIG. 5D illustrates an example in which the second gate electrode 19 and the second protective insulating layer 18 are formed in an order different from those in FIG. 5C.

As illustrated in FIG. 5D, the second gate electrode 19 of a thin film transistor 56 is formed over and in contact with the resin layer 17 that is the first protective insulating film and provided between the resin layer 17 and the second protective insulating layer 18. In the case where the second gate electrode 19 is provided between the resin layer 17 and the second protective insulating layer 18, the second gate electrode 19 as well as the channel protective layer 42 and the resin layer 17 has an effect of reducing plasma damage to the oxide semiconductor layer 26.

This embodiment can be implemented in an appropriate combination with any of the structures described in the other embodiments.

(Embodiment 6)

Figure 6A:
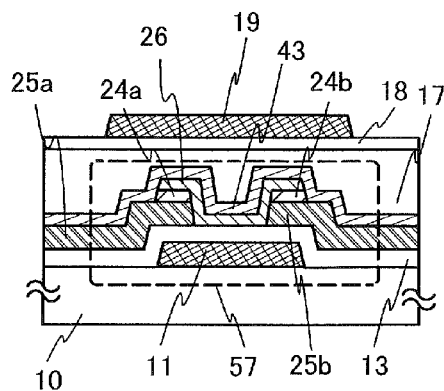
FIGS. 6A to 6D are cross-sectional views of one embodiment of the present invention.

FIG. 6A is an example of a cross-sectional view of a thin film transistor in which an oxide semiconductor layer is sandwiched between two gate electrodes provided over and below the oxide semiconductor layer. This embodiment describes an example of a thin film transistor used for a pixel portion and a driver circuit which are provided over a substrate having an insulating surface.

Note that this embodiment is the same as Embodiment 2 except that an amorphous silicon film is provided in contact with the oxide semiconductor layer 26. Therefore, detailed description is omitted here and the same portions as those of FIG. 2A are denoted by the same reference numerals. Steps are the same as those of Embodiment 2 up to formation of the oxide semiconductor layer 26.

After forming the oxide semiconductor layer 26 according to Embodiment 2, a film of an amorphous semiconductor or a compound thereof, typically amorphous silicon, which is obtained by a sputtering method is formed without exposure to air as a channel protective layer 43 over and in contact with the oxide semiconductor layer 26. Note that a compound of an amorphous silicon film refers to a p-type amorphous silicon film including a p-type impurity element such as boron which is formed by a sputtering method, or an n-type amorphous silicon film including an n-type impurity element such as phosphorus which is formed by a sputtering method.

In order to reduce damage to the oxide semiconductor layer 26 as much as possible, the film is formed under a low power condition or a condition where a substrate temperature is lower than 200° C. In this embodiment, the amorphous silicon film including boron is formed with a substrate temperature set at room temperature and electric power set at 1 kw.

In addition, before formation of the amorphous silicon film including boron, the exposed region of the oxide semiconductor layer may be subjected to oxygen radical treatment. By the oxygen radical treatment, a surface and its vicinity of the oxide semiconductor layer can be modified into an oxygen-excess region. If the amorphous silicon film is formed on the oxygen-excess region formed by the oxygen radical treatment, a thin film of $SiO_X$ (X>0) is formed at an interface, whereby off current can be reduced.

Oxygen radicals may be produced in a plasma generation apparatus with the use of a gas including oxygen, or in an ozone generation apparatus. By exposing a thin film to the produced oxygen radicals or oxygen, the surface of the film can be modified. The radical treatment is not limited to one using oxygen radicals, and may be performed using argon and oxygen radicals. The treatment using argon and oxygen radicals is treatment in which an argon gas and an oxygen gas are introduced to generate plasma, thereby modifying a surface of a thin film.

The channel protective layer 43 can be used as an interlayer film which blocks moisture, hydrogen ions, OH⁻, and the like. In addition, the channel protective layer 43 formed of the amorphous silicon film functions as a light-blocking layer which blocks incidence of light to the oxide semiconductor layer.

Then, heat treatment at 200° C. to 600° C., typically 300° C. to 500° C., is preferably performed. Here, heat treatment is performed in a furnace at 350° C. for 1 hour in a nitrogen atmosphere including oxygen.

Then, the resin layer 17 is formed with a thickness in the range of 0.5 µm to 3 µm to cover the channel protective layer 43. As a photosensitive or non photosensitive organic material for the resin layer 17, polyimide, acrylic, polyamide, polyimideamide, resist, benzocyclobutene, or a stack of any of these materials is used.

Note that steps after formation of the resin layer 17 are the same as those of Embodiment 2 and therefore, are briefly described here.

Then, the second protective insulating layer 18 is formed over the resin layer 17 to a thickness of 50 nm to 400 nm by a PCVD method or a sputtering method under a low power condition (or at a low substrate temperature of 200° C. or lower, preferably from a room temperature to 100° C.). Alternatively, the second protective insulating layer 18 may be formed under a low power condition using a high-density plasma apparatus.

Then, a conductive layer is formed. After that, a photolithography step is performed to form a resist mask over the conductive layer and unnecessary portions are removed by etching so that wirings and electrodes (wirings including the second gate electrode 19 and the like) are formed.

Through the above process, a thin film transistor 57 illustrated in FIG. 6A can be obtained.

Figure 6B:
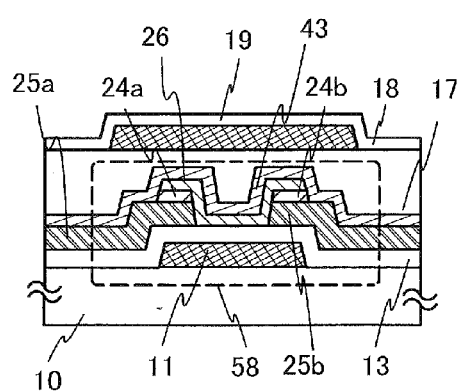

FIG. 6B is partly different from FIG. 6A. In FIG. 6B, the same portions as those of FIG. 6A other than different portions are denoted by the same reference numerals.

FIG. 6B illustrates an example in which the second gate electrode 19 and the second protective insulating layer 18 are formed in an order different from those in FIG. 6A.

As illustrated in FIG. 6B, the second gate electrode 19 of a thin film transistor 58 is formed over and in contact with the resin layer 17 that is the first protective insulating film and provided between the resin layer 17 and the second protective insulating layer 18. In the case where the second gate electrode 19 is provided between the resin layer 17 and the second protective insulating layer 18, the second gate electrode 19 as well as the channel protective layer 43 and the resin layer 17 has an effect of reducing plasma damage to the oxide semiconductor layer 26.

Figure 6C:
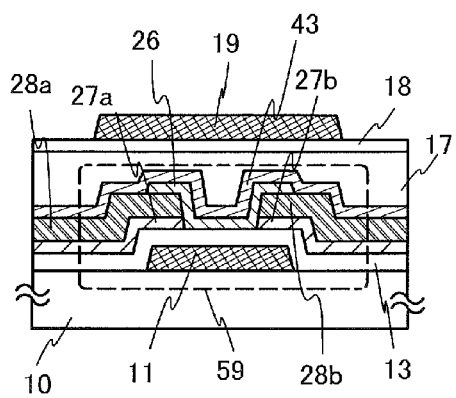

FIG. 6C is partly different from FIG. 6A. In FIG. 6C, the same portions as those of FIG. 6A other than different portions are denoted by the same reference numerals.

FIG. 6C illustrates an example which differs from FIG. 6A in positional relation between the source and drain regions and the source and drain electrode layers. The source region 27a (or the drain region 27b) is provided under the source electrode layer 28a (or the drain electrode layer 28b). The source electrode layer 28a (or the drain electrode layer 28b) has an effect of reducing plasma damage to the source region 27a (or the drain region 27b).

In other words, as a blocking layer for reducing plasma damage to the source and drain regions 27a and 27b, four layers (the source and drain electrode layers 28a and 28b, the resin layer 17, the channel protective layer 42, and the second gate electrode 19) are formed over the source and drain regions 27a and 27b; therefore, plasma damage to the source and drain regions 27a and 27b is further reduced.

As for a thin film transistor 59 illustrated in FIG. 6C, an oxide semiconductor film having low resistance is formed over and in contact with the first gate insulating layer 13 and a conductive film is formed thereover. After that, the oxide semiconductor film having low resistance is etched using the same resist mask as that used for selectively etching the conductive film. Therefore, top surfaces of the source and drain regions 27a and 27b which are formed by etching the oxide semiconductor film having low resistance have approximately the same shape as top surfaces of the source and drain electrode layers 28*a* and 28*b* which are formed over the source and drain regions 27*a* and 27*b*. The top surfaces and side surfaces of the source and drain electrode layers 28*a* and 28*b* are formed in contact with the oxide semiconductor layer 26.

Figure 6D:
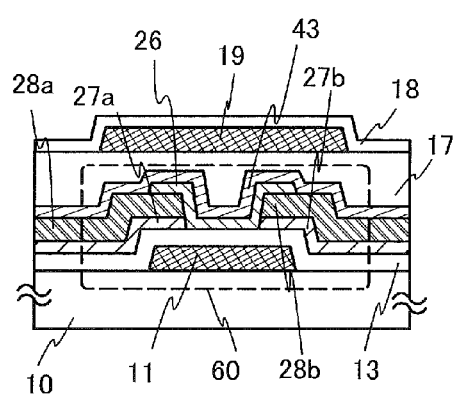

FIG. 6D is partly different from FIG. 6C. In FIG. 6D, the same portions as those of FIG. 6C other than different portions are denoted by the same reference numerals.

FIG. 6D illustrates an example in which the second gate electrode 19 and the second protective insulating layer 18 are formed in an order different from those in FIG. 6C.

As illustrated in FIG. 6D, the second gate electrode 19 of a thin film transistor 60 is formed over and in contact with the resin layer 17 that is the first protective insulating film and provided between the resin layer 17 and the second protective insulating layer 18. In the case where the second gate electrode 19 is provided between the resin layer 17 and the second protective insulating layer 18, the second gate electrode 19 as well as the channel protective layer 43 and the resin layer 17 has an effect of reducing plasma damage to the oxide semiconductor layer 26.

This embodiment can be implemented in an appropriate combination with any of the structures described in the other embodiments.

(Embodiment 7)

In embodiment, an example in which an inverter circuit in a driver circuit is formed using two n-channel thin film transistors is described below. Thin film transistors in FIG. 7A is the same as the thin film transistor 20 in FIG. 1A of Embodiment 1 and thus the same parts are denoted by the same reference numerals.

The driver circuit for driving a pixel portion is formed using an inverter circuit, a capacitor, a resistor, and the like. When two n-channel TFTs are combined to form an inverter circuit, there are following combinations: a combination of an enhancement type transistor and a depletion type transistor (hereinafter, a circuit formed by such a combination is referred to as an EDMOS circuit) and a combination of enhancement type TFTs (hereinafter, a circuit formed by such a combination is referred to as an EEMOS circuit).

Figure 7A:
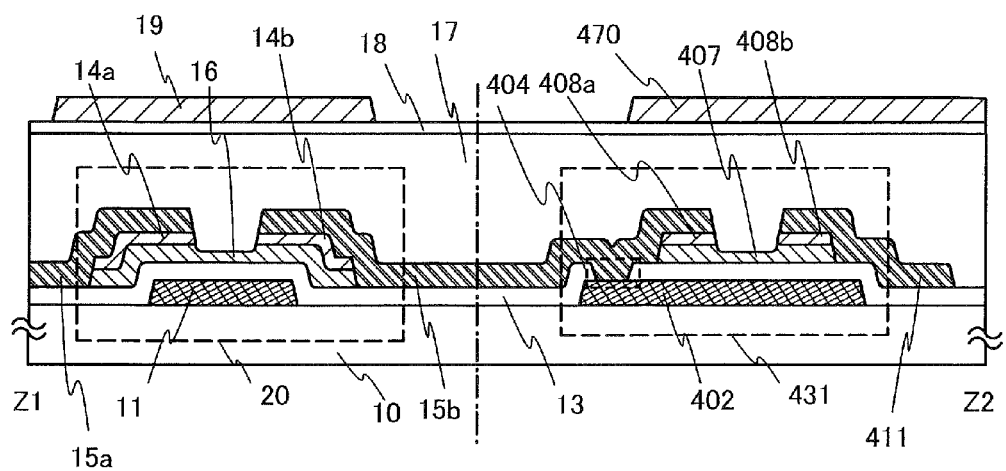
FIGS. 7A and 7B are a cross-sectional view and a top view of one embodiment of the present invention.
Figure 7B:
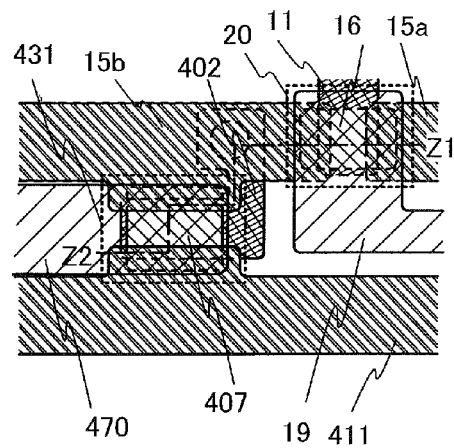

FIG. 7A illustrates a cross-sectional structure of the inverter circuit of the driver circuit. Note that the thin film transistor 20 and a second thin film transistor 431 in FIGS. 7A and 7B are bottom-gate thin film transistors and exemplify a thin film transistor in which a wiring is provided over an oxide semiconductor layer with a source or drain regions interposed therebetween.

In FIG. 7A, the first gate electrode 11 and a third gate electrode 402 are provided over the substrate 10. The first gate electrode 11 and the third gate electrode 402 can be formed to have a single-layer structure or a stacked-layer structure using a metal material such as molybdenum, titanium, chromium, tantalum, tungsten, aluminum, copper, neodymium, or scandium, or an alloy material containing any of these materials as the main component.

Further, over the first gate insulating layer 13 covering the first gate electrode 11 and the third gate electrode 402, the oxide semiconductor layer 16 and a second oxide semiconductor layer 407 are provided.

The electrode layer serving as a first terminal (the source electrode layer 15*a*) and the electrode layer serving as a second terminal (the drain electrode layer 15*b*) are provided over the oxide semiconductor layer 16. The electrode layer serving as the second terminal is directly connected to the third gate electrode 402 through a contact hole 404 formed in the first gate insulating layer 13. In addition, an electrode layer serving as a third terminal 411 is provided over the second oxide semiconductor layer 407.

The thin film transistor 20 includes the first gate electrode 11 and the oxide semiconductor layer 16 overlapping with the first gate electrode 11 with the first gate insulating layer 13 between the first gate electrode 11 and the oxide semiconductor layer 16. The electrode layer serving as the first terminal (the source electrode layer 15*a*) is a power supply line to which negative voltage VDL is applied (a negative power supply line). This power supply line may be a power supply line with a ground potential (a ground potential power supply line). Note that in the inverter circuit, the electrode layer serving as the first terminal is the drain electrode layer and the electrode layer serving as the second terminal is the source electrode layer in some cases, depending on a potential of a wiring connected to the electrode layer serving as the second terminal (the drain electrode layer 15*b*).

The second thin film transistor 431 includes the third gate electrode 402 and the second oxide semiconductor layer 407 overlapping with the third gate electrode 402 with the first gate insulating layer 13 between the third gate electrode 402 and the second oxide semiconductor layer 407. The third terminal 411 is a power supply line to which positive voltage VDH is applied (a positive power supply line). Note that in the inverter circuit, the electrode layer serving as the second terminal is the source electrode layer and the electrode layer serving as the third terminal 411 is the drain electrode layer in some cases, depending on a potential of a wiring connected to the electrode layer serving as the second terminal (the drain electrode layer 15*b*).

A buffer layer 408*a* (also referred to as a source region or a drain region) is provided between the second oxide semiconductor layer 407 and the drain electrode layer 15*b*. A buffer layer 408*b* (also referred to as a drain region or a source region) is provided between the second oxide semiconductor layer 407 and the third terminal 411.

Further, FIG. 7B is a top view of the inverter circuit of the driver circuit. In FIG. 7B, a cross section taken along the chain line Z1-Z2 corresponds to FIG. 7A.

In this embodiment, in order that the thin film transistor 20 can serve as an n-channel enhancement type transistor, a second gate insulating layer (a stack of the resin layer 17 and the second protective insulating layer 18) is provided over the oxide semiconductor layer 16 and the second gate electrode 19 is provided over the second gate insulating layer so that the threshold value of the thin film transistor 20 is controlled by voltage applied to the second gate electrode 19.

Further, in this embodiment, the second gate insulating layer (the stack of the resin layer 17 and the second protective insulating layer 18) is provided over the second oxide semiconductor layer 407 and a fourth gate electrode 470 is provided over the second gate insulating layer so that the threshold value of the second thin film transistor 431 is controlled by voltage applied to the fourth gate electrode 470.

Note that the example in which the electrode layer serving as the second terminal (the drain electrode layer 15*b*) is directly connected to the third gate electrode 402 through the contact hole 404 formed in the first gate insulating layer 13 is illustrated in FIGS. 7A and 7B without particular limitations. The electrode layer serving as the second terminal (the drain electrode layer 15*b*) may be electrically connected to the third gate electrode 402 with a connection electrode separately provided.

Note that this embodiment can be arbitrarily combined with Embodiment 1.

(Embodiment 8)

In this embodiment, a display device is described with reference to a block diagram, a circuit diagram, a waveform diagram showing potential changes of signals, a top view (a layout diagram), and the like.

Figure 8A:
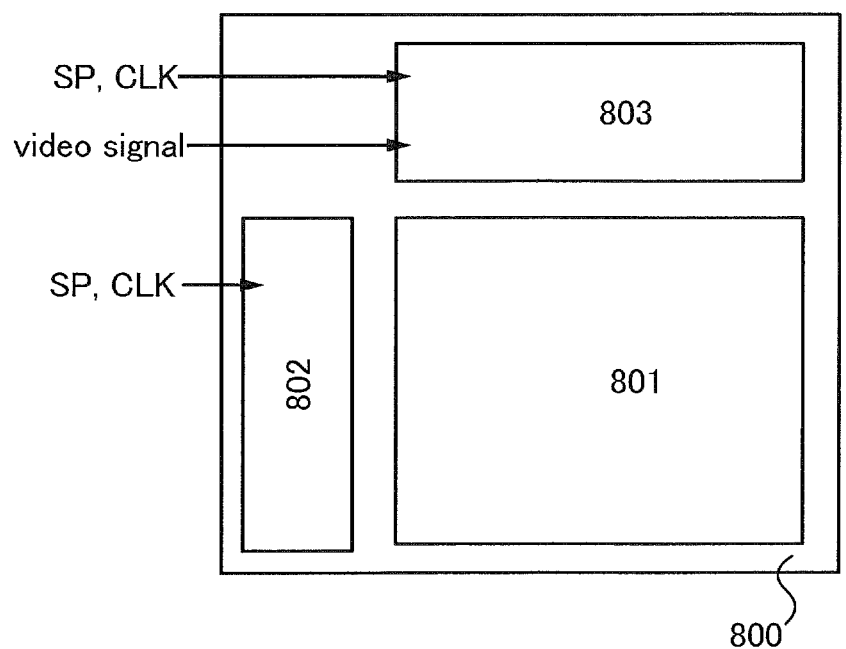
FIGS. 8A and 8B are a block diagram of a display device and a diagram for describing a TFT.
Figure 8B:
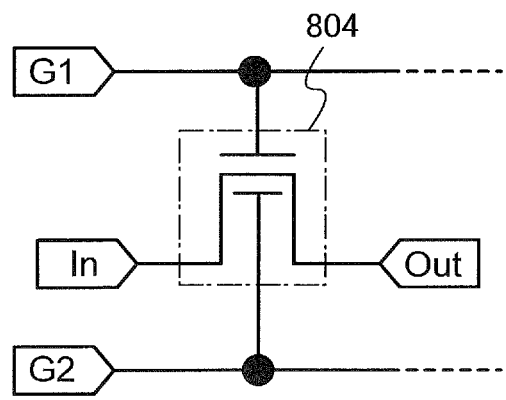

An example of a block diagram of an active matrix liquid crystal display device is illustrated in FIG. 8A. The liquid crystal display device illustrated in FIG. 8A includes, over a substrate 800, a pixel portion 801 including a plurality of pixels each provided with a display element, a scan line driver circuit 802 which controls scan lines connected to gate electrodes of the pixels, and a signal line driver circuit 803 which controls a video signal input to a selected pixel. Each pixel is provided with a thin film transistor (hereinafter, referred to as a TFT) 804 in FIG. 8B. The TFT 804 is an element controlling electric current between an In terminal and an Out terminal with a first control signal G1 and a second control signal G2. Note that a symbol of the TFT 804 in FIG. 8B denotes a TFT controlled with four terminals described in any one of above Embodiments 1 to 6 and is used in other drawings hereinafter.

Note that although a mode in which the scan line driver circuit 802 and the signal line driver circuit 803 are formed in the display device is described here, part of the scan line driver circuit 802 may be mounted over a semiconductor device such as an IC. Further, part of the signal line driver circuit 803 may be mounted over a semiconductor device such as an IC. Still further, a plurality of scan line driver circuits 802 may be provided over the substrate 800.

Figure 9:
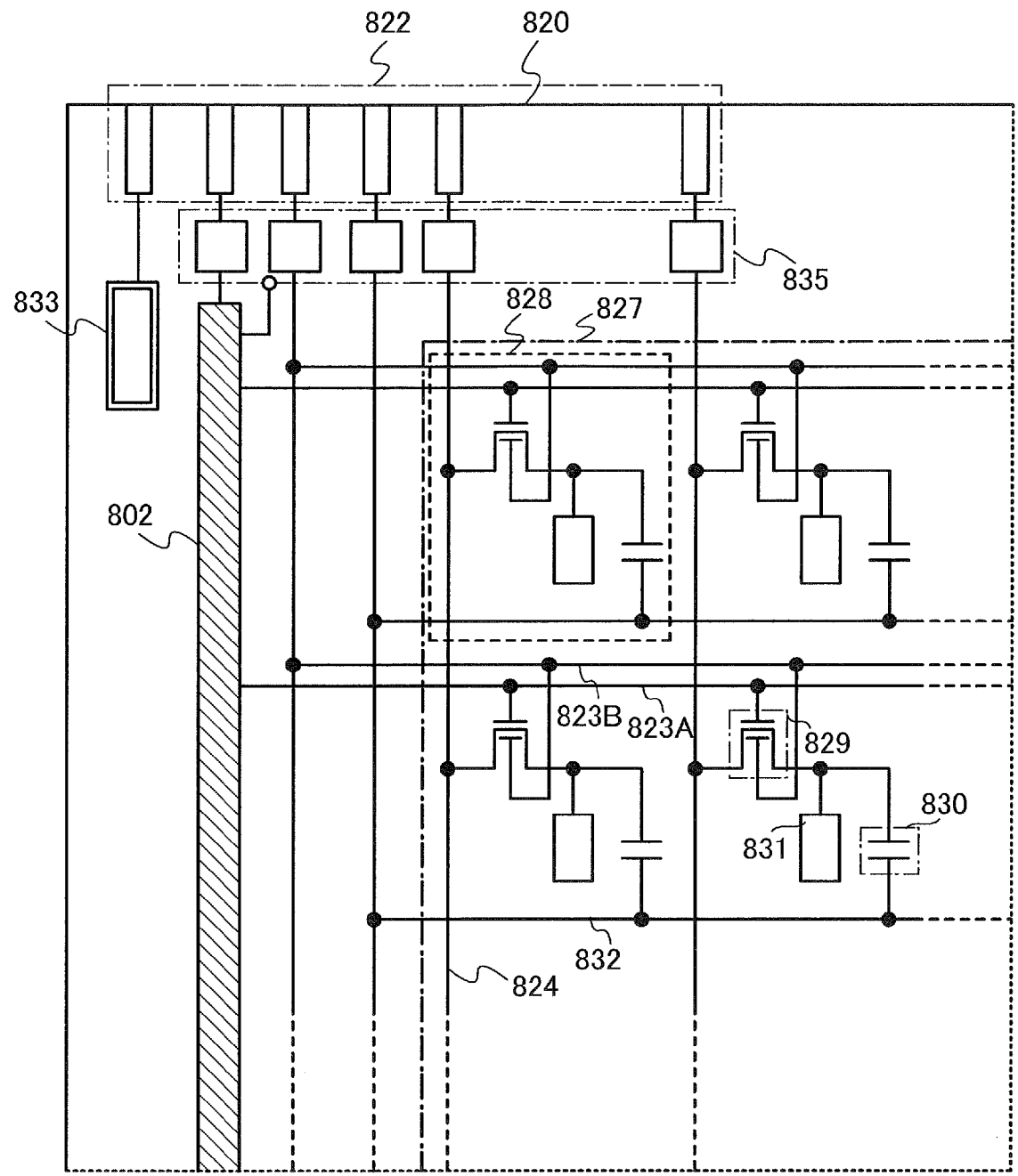
FIG. 9 is a block diagram of a display device.

FIG. 9 illustrates a positional relationship of signal input terminals, scan lines, signal lines, protective circuits including non-linear elements, and a pixel portion in a display device. Over a substrate 820 having an insulating surface, scan lines 823A and control lines 823B intersect with signal lines 824 in a pixel portion 827. The pixel portion 827 corresponds to the pixel portion 801 in FIG. 8A. Note that the control lines 823B may be arranged parallel to the signal line 824.

The pixel portion 827 includes a plurality of pixels 828 arranged in a matrix. The pixel 828 includes a pixel TFT (which may be referred to as a TFT) 829 connected to the scan line 823A, the control line 823B, and the signal line 824, a storage capacitor 830, and a pixel electrode 831.

The pixel structure here illustrates a case where one electrode of the storage capacitor 830 is connected to the pixel TFT 829 and the other electrode of the storage capacitor 830 is connected to a capacitor line 832. The pixel electrode 831 serves as one of electrodes which drive a display element (such as a liquid crystal element, a light-emitting element, or a contrast medium (electronic ink)). The other electrode (also referred to as a counter electrode) of the display element is connected to a common terminal 833. From the common terminal, a common potential is applied to the other electrode of the display element.

The protective circuit 835 is provided between a wiring extended from the pixel portion 827 and the signal line input terminal 822. The protective circuit 835 is also provided between the scan line driver circuit 802 and the pixel portion 827. In this embodiment, a plurality of protective circuits 835 are provided so that the pixel TFTs 829 and the like are not broken when surge voltage due to static electricity or the like is applied to the scan line 823A, the control line 823B, the signal line 824, or the capacitor line 832. Accordingly, the protective circuits 835 are formed so that charge is released into a common wiring when surge voltage is applied.

In this embodiment, an example in which the protective circuits 835 are provided in the vicinity of the signal line input terminals 822 is shown. However, the position of the protective circuits 835 and the presence or absence of the protective circuits 835 is not limited to the example.

The use of the TFT described in any one of above Embodiments 1 to 6 as the pixel TFT 829 in FIG. 9 provides following advantages.

Provision of the TFT described in any one of above Embodiments 1 to 6 allows the threshold voltage of the TFT to be controlled and/or on current of the TFT to be increased.

Figure 18:
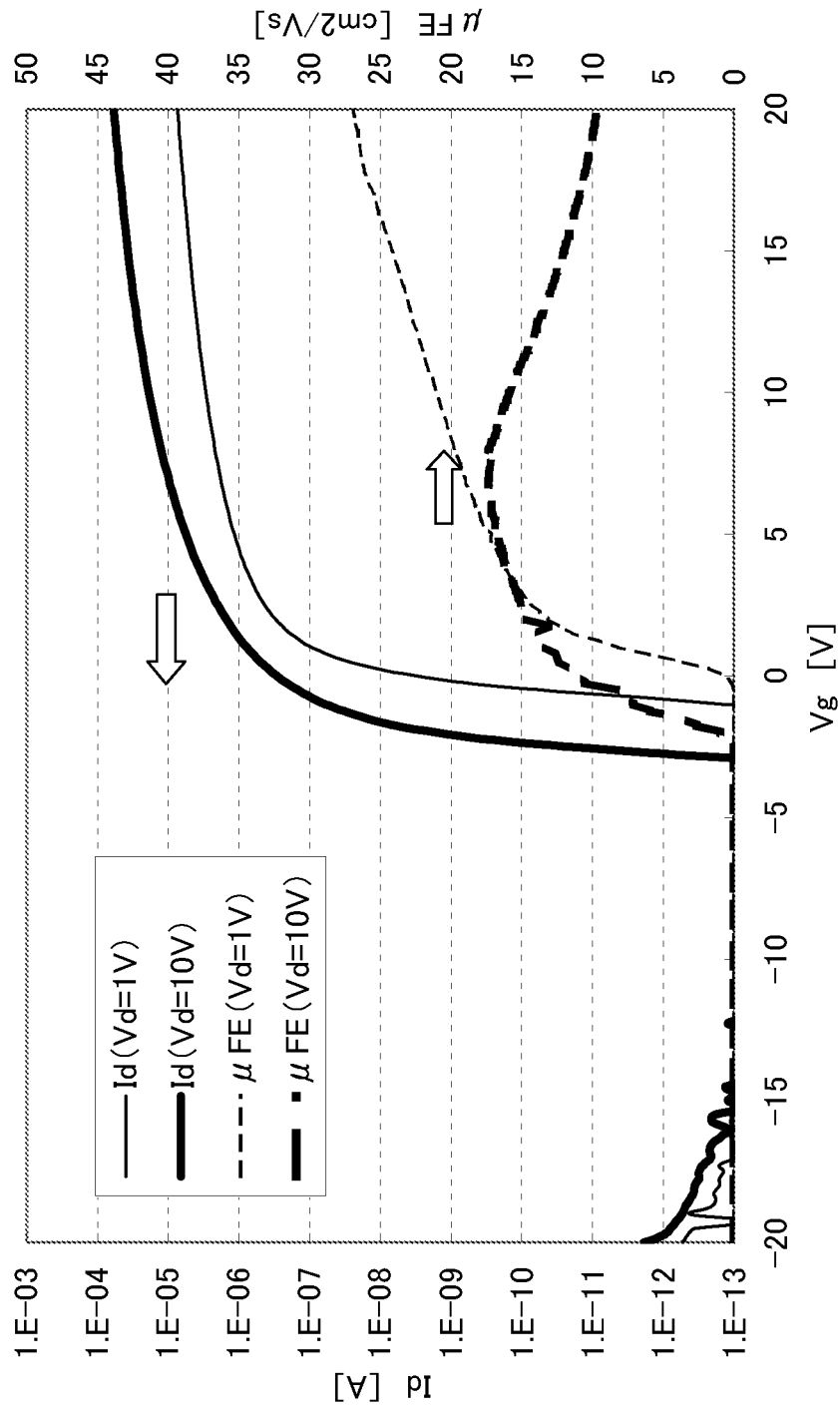
FIG. 18 is a graph showing characteristics of a TFT.
Figure 19:
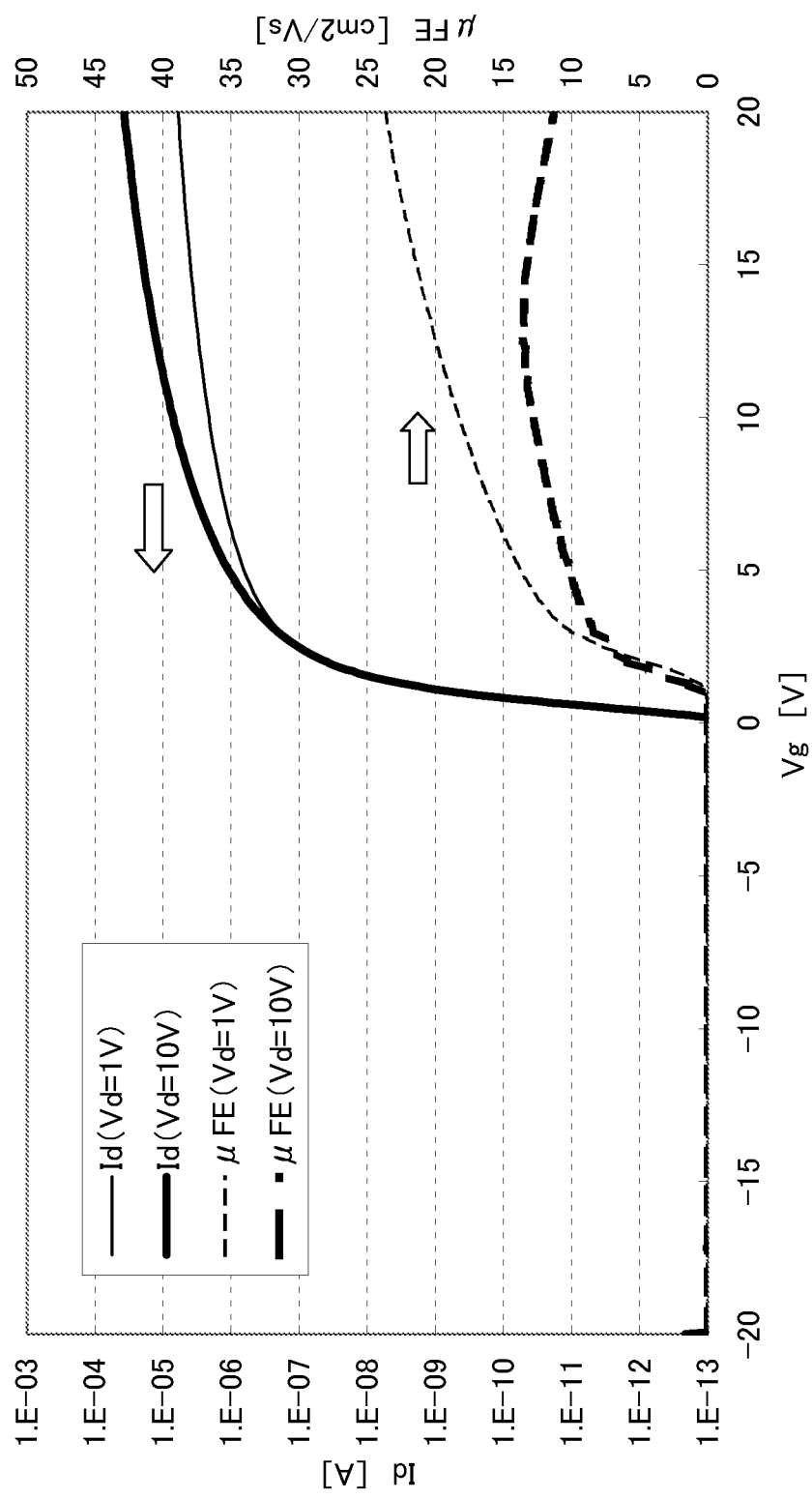
FIG. 19 is a graph showing characteristics of a TFT.
Figure 20:
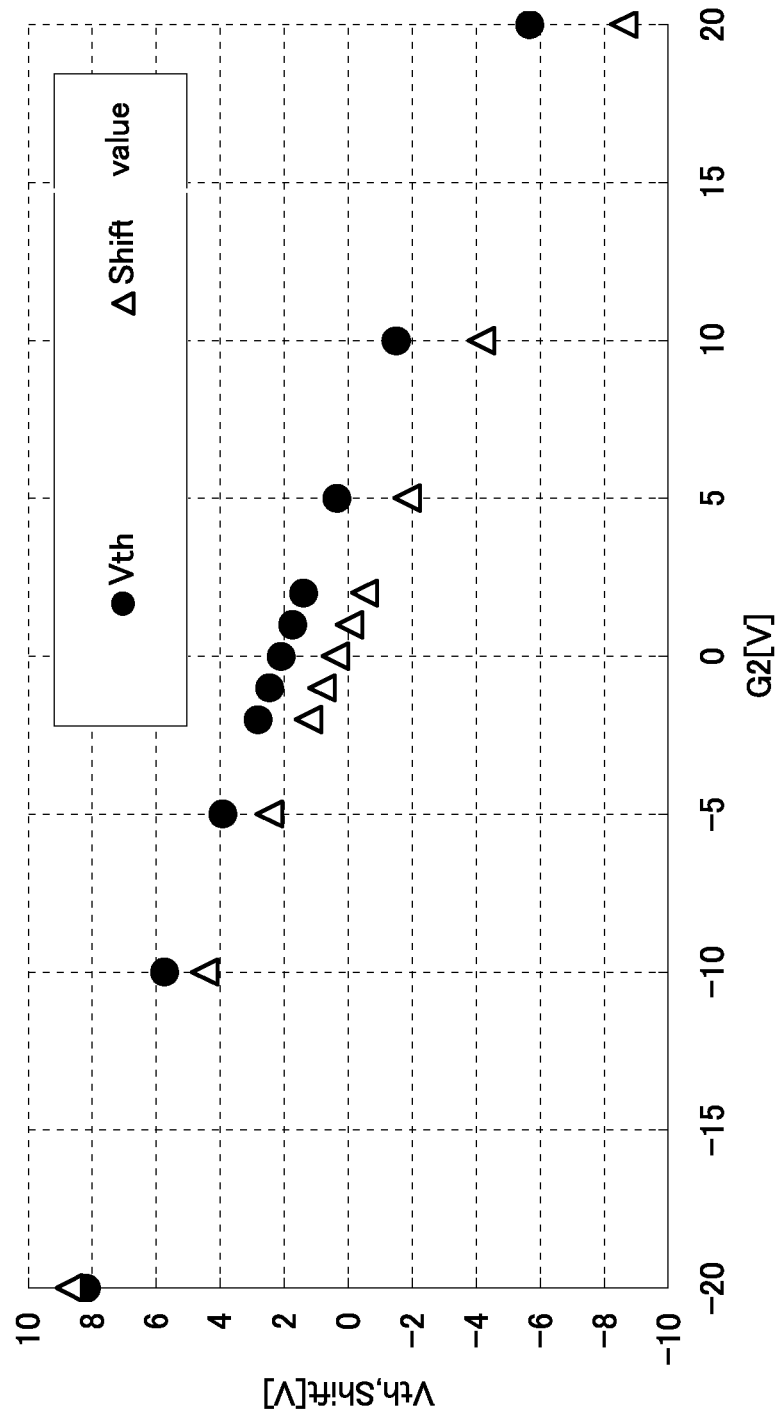
FIG. 20 is a graph showing characteristics of a TFT.

Specific examples of threshold voltage control of a TFT are shown FIGS. 18 to 20. FIG. 18 shows drain current (Id)-gate voltage (Vg) curves and mobility curves of an n-channel TFT in which an oxide semiconductor is used for a semiconductor layer, when a potential of the control line 823B is in a floating state. The n-channel TFT in FIG. 18 is manufactured by the same process as in Embodiment 2. The n-channel TFT has a bottom-contact type structure with a channel length of 20 μm and a channel width of 20 μm. The data in FIG. 18 is obtained by measurement in which a drain voltage (Vd) is 1V (a thin line in the graph) and 10 V (a thick line in the graph). FIG. 19 shows Id-Vg curves and mobility curves of an n-channel TFT in which an oxide semiconductor is used for a semiconductor layer, when a potential of the control line 823B is 0 V. The n-channel TFT in FIG. 19 is manufactured by the same process as in Embodiment 2. The n-channel TFT has a bottom-contact type structure with a channel length of 20 μm and a channel width of 20 μm. The data in FIG. 19 is obtained by measurement in which a drain voltage (Vd) is 1V (a thin line in the graph) and 10 V (a thick line in the graph).

As is apparent from FIGS. 18 and 19, the Id-Vg curves with respect to the drain voltage largely shift in FIG. 18 under a condition where the potential of the control line 823B is in a floating state, whereas the Id-Vg curves with respect to the drain voltage shift less in FIG. 19 under a condition where the potential of the control line 823B is a fixed potential of 0V (GND).

According to FIGS. 18 and 19, it is found that when potential of the control line 823B is set to the fixed potential, the amount of shift of the Id-Vg curve of the TFT with respect to the drain voltage can be reduced.

FIG. 20 shows characteristics of the threshold voltage (Vth) and a rising voltage (a shift value) in the case where the potential G2 of the control line 823B is set to the fixed potential and the fixed potential is varied. As is shown in FIG. 20, by changing the potential G2 of the control line 823B, which is a fixed potential, a rising voltage and a threshold voltage of the TFT can be controlled. Note that although the data of the bottom-contact type structure described in Embodiment 2 is shown in FIGS. 18 to 20, the data is not specific to the structure of the TFT. A rising voltage and a threshold voltage can be controlled in the TFT described in any one of Embodiments 1 and 3 to 6 by changing the potential G2 of the control line 823B which is a fixed potential.

Note that a rising voltage (a shift value) is defined as a voltage value at which a tangent to an Id-Vg curve at the point of greatest slope in the subthreshold characteristic intersects with a horizontal line of $Id=1 \times 10^{-12}$ A.

Figure 10A:
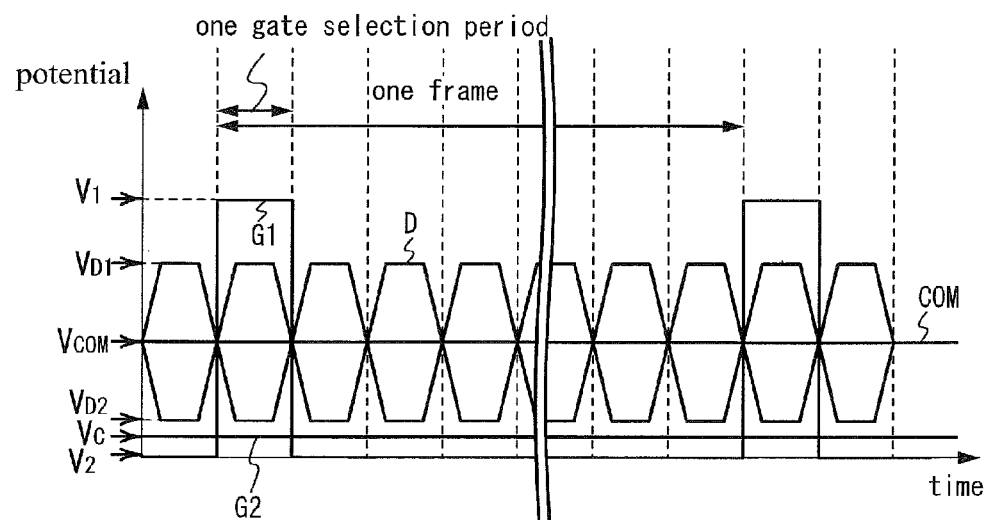
FIGS. 10A and 10B are waveform diagrams showing potential changes.

FIG. 10A is a waveform diagram schematically showing potential changes of signals supplied to the pixel 828. Operation of the pixel 828 is described with reference to FIG. 10A. FIG. 10A shows a waveform of potentials of each of the scan line 823A, the control line 823B, the signal line 824, and the capacitor line 832 which are connected to one pixel. In FIG. 10A, a waveform G1 schematically represents a potential change of the scan line 823A, a waveform G2 schematically represents a potential change of the control line 823B, a waveform D schematically represents a potential change of the signal line 824, and a waveform COM schematically represents a potential change of the capacitor line 832. Changes in those waveforms over time are shown with the horizontal axis representing time and the vertical axis representing potential. Note that a high power supply potential of the waveform G1 is denoted as $V_1$ and a low power supply potential of the waveform G1 is denoted as $V_2$. A potential of the waveform G2 is denoted as $V_c$. A high power supply potential of the waveform D is denoted as $V_{D1}$ and a low power supply potential of the waveform D is denoted as $V_{D2}$. A potential of the waveform COM is denoted as $V_{COM}$. As shown in the diagram, a period of time from when the waveform G1 changes to $V_1$, until the waveform G1 changes to $V_1$ again after changing to $V_2$ corresponds to one frame period. Further, as shown in the diagram, a period of time from when the waveform G1 changes to $V_1$ until the waveform G1 changes to $V_2$ corresponds to one gate selection period.

In FIG. 10A, in one gate selection period in one frame period, that is, in a period of time when the scan line 823A has $V_1$, the storage capacitor 830 in the pixel 828 holds a potential of the signal line 824 in the range of from $V_{D1}$ to $V_{D2}$. In FIG. 10A, a period other than a gate selection period in one frame period, that is, in a period of time when the scan line 823A has $V_2$, the storage capacitor 830 in the pixel 828 holds a potential input in one gate selection period regardless of the potential of the signal line 824, which is in the range of from $V_{D1}$ to $V_{D2}$. Note that the waveform G2 schematically representing a potential change of the control line 823B is preferably kept at a fixed potential in the range in which the 823B does not cause malfunction of the pixel TFT 829 which is controlled on or off by the scan line 823A. By setting the potential $V_c$ of the control line 823B at $V_{D2}$ or lower, preferably in the range of from $V_2$ to $V_{D2}$, malfunction of the pixel TFT 829 which is controlled on or off by the scan line 823A can be prevented.

Figure 10B:
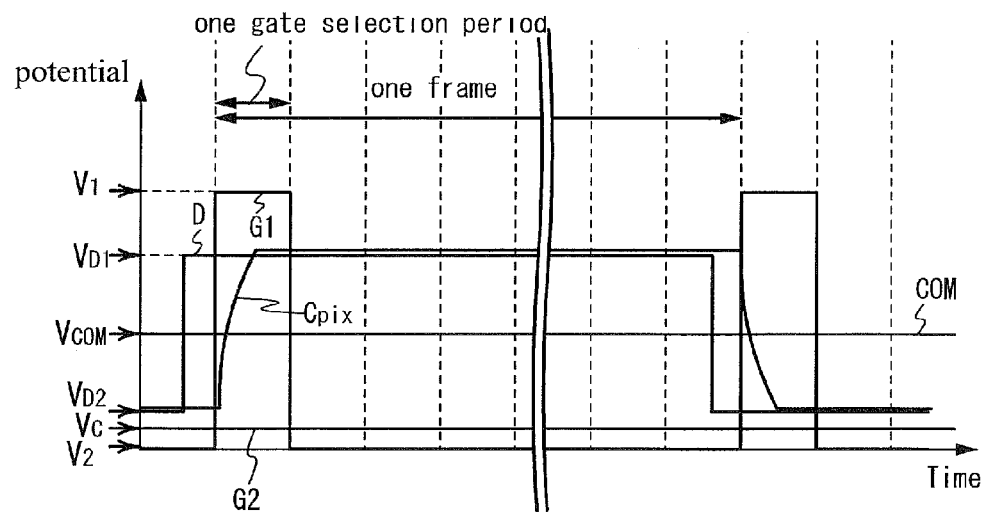

FIG. 10B is another example of a waveform diagram schematically showing potential changes in the case where a potential of the signal line 824 has $V_{D1}$ for a certain period of time. FIG. 10B differs from FIG. 10A in that the waveform D representing a potential change of the signal line 824 is specifically shown, and that a waveform $C_{pix}$ representing a change of a potential held by the storage capacitor 830 in the pixel 828 is shown. In FIG. 10B, before the waveform G1 changes to $V_1$, the waveform D changes to $V_{D1}$ from $V_{D2}$, and then the waveform G1 changes to $V_1$ and a potential of the storage capacitor 830 in the pixel 828, that is, a potential of the waveform $C_{pix}$ rises. In addition, in FIG. 10B, before the waveform G1 changes to $V_1$, the waveform D changes to $V_{D2}$ from $V_{D1}$, and then the waveform G1 changes to $V_1$ and a potential of the storage capacitor 830 in the pixel 828, that is, a potential of the waveform $C_{pix}$ falls. If the waveform D changes to $V_{D1}$ from $V_{D2}$ or $V_{D2}$ from $V_{D1}$ before the waveform G1 changes to $V_1$, malfunction due to signal delay and the like can be reduced. Note that in FIG. 10B, although there is a period in which the waveform D and the waveform $C_{pix}$ are in the same potential, they are separately shown for the sake of clarity.

As shown in FIGS. 10A and 10B, by providing the control line 823B, the threshold voltage of the pixel TFT 829 can be controlled while a similar effect of the TFT described in any one of Embodiments 1 to 6 is obtained. Specifically, by setting a potential of the waveform G2 of the control line 823B at a fixed potential, a TFT with a stable threshold voltage can be obtained, which is preferable.

Note that the waveform diagrams in FIGS. 10A and 10B schematically showing potential changes of signals supplied to the pixel 828 are merely examples and may be combined with another driving method. For example, a driving method such as an inversion drive may be employed, in which the polarity of a voltage applied to the pixel electrode is inverted every certain period in accordance with the common potential of the common electrode. By the inversion drive, uneven display such as flickering of an image and deterioration of a display element such as a liquid crystal material can be suppressed. Note that as an example of the inversion drive, source line inversion drive, gate line inversion drive, dot inversion drive, and the like can be given as well as frame inversion drive. Note that as a display method, a progressive method, an interlace method or the like can be employed. Further, one pixel may include a plurality of subpixels.

FIG. 11 is an example of a layout diagram of the pixel 828 in FIG. 9. FIG. 11 shows an example where a structure of a thin film transistor is a channel-etch type described in Embodiment 1. In FIG. 11, a cross section taken along the chain line A-B corresponds to the cross-sectional view of FIG. 1C. Note that the layout diagram of pixels of FIG. 11 shows an example of a so-called stripe arrangement in which pixels of three colors, RGB (R is red, G is green, and B is blue), are arranged along the scan line 823A. As for the arrangement of the pixels 828, delta or Bayer arrangement may alternatively be employed. Note that without limitation to the three colors of RGB, more than three colors may be used. For example, RGBW (W is white) or RGB with one or more colors of yellow, cyan, or magenta may be used. Note that areas of display regions in pixels may be different between color elements of RGB.

FIG. 11 illustrates a pixel circuit including a first conductive layer 1101 which serves as a wiring serving as the scan line 823A and one electrode of the capacitor line 832, an oxide semiconductor layer 1102 which forms a channel region of the TFT 829, a second conductive layer 1103 which serves as a wiring serving as the signal line 824 and the other electrode of the capacitor line 832, a pixel electrode layer 1104 which serves as the pixel electrode 831, a third conductive layer 1105 which serves as a wiring serving as the control line 823B, and an opening 1106 (referred to as a contact hole) for connection between the second conductive layer 1103 and the pixel electrode 831. Although FIG. 11 shows a structure in which the third conductive layer 1105 parallel to the first conductive layer 1101 is extended over the oxide semiconductor layer 1102, a structure in FIG. 12 in which the third conductive layer 1105 is provided to overlap with the first conductive layer 1101 and the oxide semiconductor layer 1102 may be employed. When the third conductive layer 1105 is formed from a light-blocking conductive material, the third conductive layer 1105 can be more effective as a light-blocking film in the structure in FIG. 12, than in the layout diagram in FIG. 11.

Note that a part of the layout diagrams in FIGS. 11 and 12 may be modified and a source region or drain region of the TFT may have an U-like or C-like shape. In addition, the width in the channel length direction of the first conductive layer 1101 which serves as the first gate electrode is larger than the width of the oxide semiconductor layer 1102. In addition, the width in a channel length direction of the third conductive layer 1105 which serves as the second gate electrode is smaller than the width of the first conductive layer 1101 and the width of the oxide semiconductor layer 1102.

Figure 13:
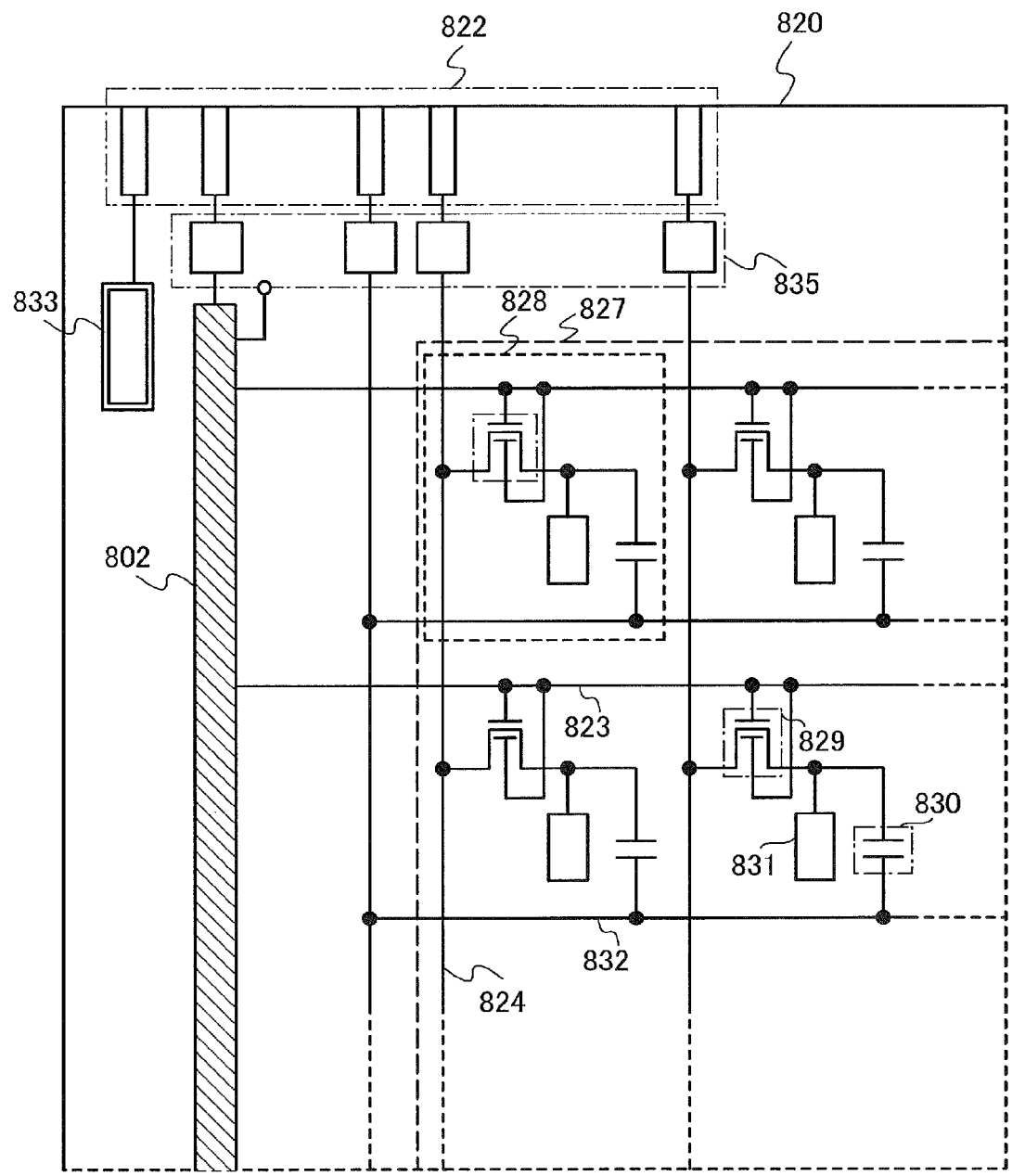
FIG. 13 is a block diagram of a display device.

FIG. 13 illustrates an example in which connection between the pixel TFTs and the scan lines is different from that in FIG. 9. In an example in FIG. 13, the first gate electrode 11 which is a scan line and the second gate electrode 19 which is a control line, which are provided to sandwich the oxide semiconductor layer in the TFT described in any one of Embodiments 1 to 6, have the same potential. Note that the same portions in FIG. 13 as those in FIG. 9 are not repeatedly described.

FIG. 13 illustrates a positional relationship of signal input terminals, scan lines, signal lines, protective circuits including non-linear elements, and a pixel portion in a display device. FIG. 13 is different from FIG. 9 in that the control line 823B is not provided and the scan line 823 which corresponds to the scan line 823A in FIG. 9 is provided. As shown in FIG. 13, by controlling the pixel TFTs with the scan line 823, the control line can be omitted, which can decrease the number of wirings and signal line input terminals 822.

Figure 14:
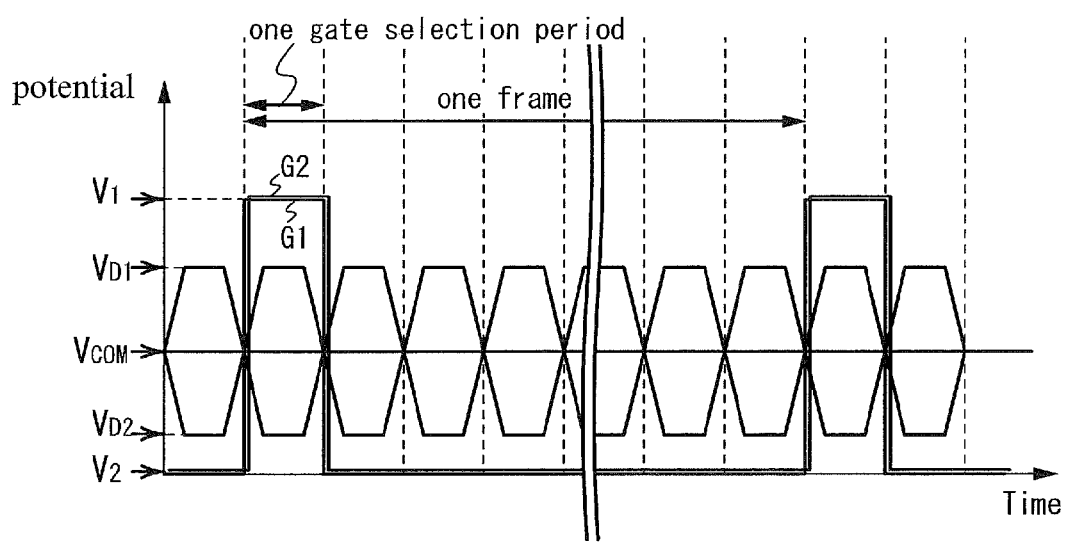
FIG. 14 is a waveform diagram showing potential changes.

FIG. 14 is a waveform diagram schematically showing a potential change of signals supplied to the pixel 828 in FIG. 13. Operation of the pixel 828 in FIG. 13 is described with reference to FIG. 14. FIG. 14 shows a waveform of potentials of each of the scan line 823, the signal line 824, and the capacitor line 832 which are connected to one pixel. Note that in FIG. 14, in order to clarify the difference from FIG. 10A, a potential of the scan line 823 is shown separately as a potential of the first gate electrode and a potential of the second gate electrode, which are provided to sandwich the oxide semiconductor layer in the TFT. In FIG. 14, a waveform G1 schematically represents a potential change of the first gate electrode, a waveform G2 schematically represents a potential change of the second gate electrode, a waveform D schematically represents a potential change of the signal line 824, and a waveform COM schematically represents a potential change of the capacitor line 832. Changes in those waveforms over time are shown with the horizontal axis representing time and the vertical axis representing potential. Note that a high power supply potential of the waveform G1 and the waveform G2 is denoted as $V_1$ and a low power supply potential of the waveform G1 and the waveform G2 is denoted as $V_2$. A high power supply potential of the waveform D is denoted as $V_{D1}$ and a low power supply potential of the waveform D is denoted as $V_{D2}$. A potential of the waveform COM is denoted as $V_{com}$. As shown in the diagram, a period of time from when the waveform G1 changes to $V_1$ until the waveform G1 changes to $V_1$ again after becoming $V_2$ corresponds to one frame period. Further, as shown in the diagram, a period of time from when the waveform G1 changes to $V_1$ until the waveform G1 changes to $V_2$ corresponds to one gate selection period.

In FIG. 14, in one gate selection period in one frame period, that is, in a period of time when the waveforms G1 and G2 have $V_1$, the storage capacitor 830 in the pixel 828 holds a potential of the signal line 824, which is in the range of from $V_{D1}$ to $V_{D2}$. In FIG. 14, a period other than a gate selection period in one frame period, that is, in a period of time when the waveforms G1 and G2 have $V_2$, the storage capacitor 830 in the pixel 828 holds a potential input in one gate selection period regardless of the potential of the signal line 824 in the range of from $V_{D1}$ to $V_{D2}$. Note that in FIG. 14, although the waveform G1 and the waveform G2 are in the same potential, they are separately shown for the sake of clarity.

Figure 15:
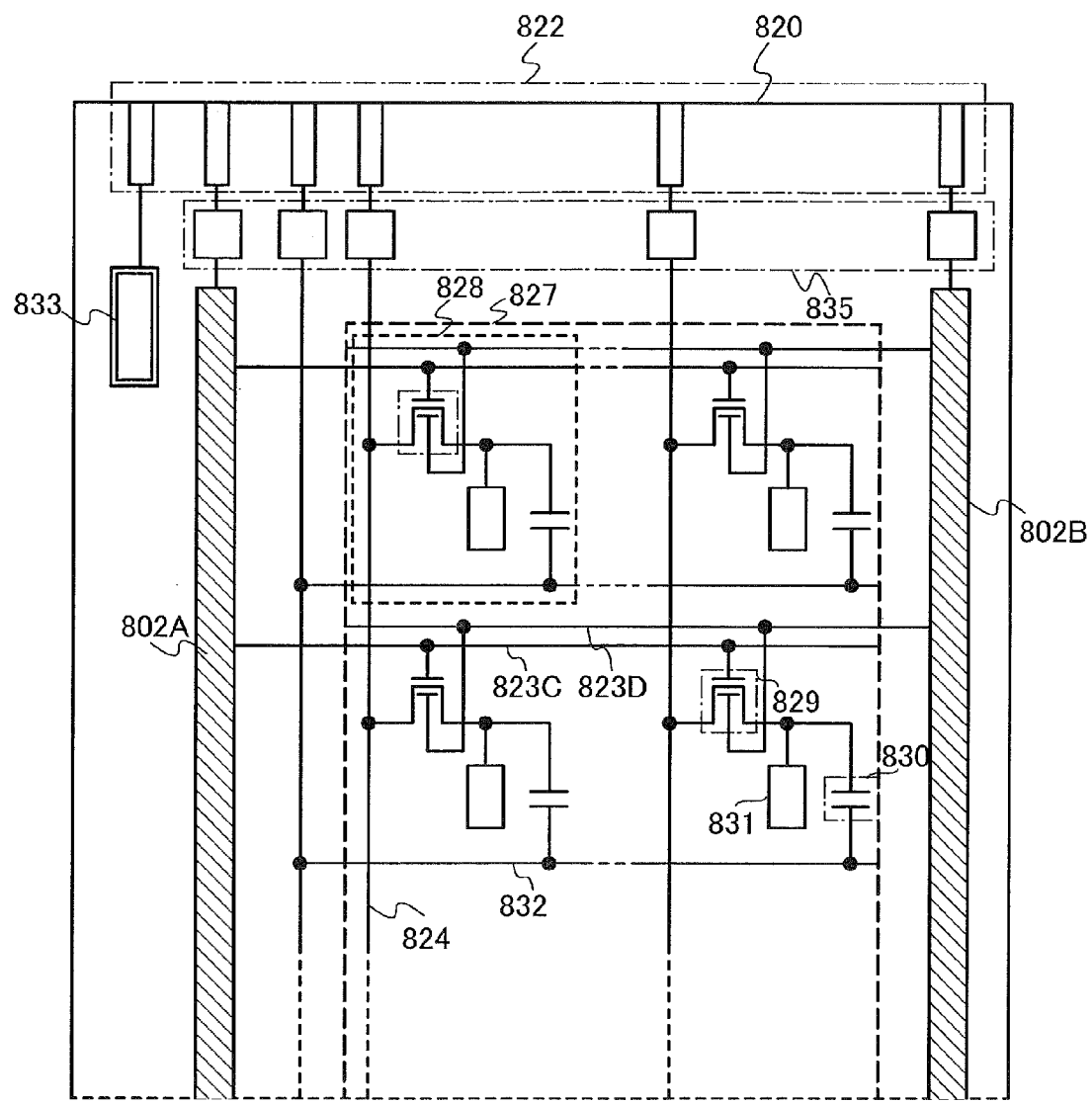
FIG. 15 is a block diagram of a display device.

By driving the TFT 829 in a manner in which the waveform G1 and the waveform G2 are in the same potential as shown in FIG. 14, an area which becomes a channel in the pixel TFT 829 can be increased. Thus, an amount of current flowing through the pixel TFT 829 is increased, whereby high response speed of the display element can be realized. As a structure in which the pixel TFT 829 is driven in a manner in which the waveform G1 and the waveform G2 are in the same potential, a structure provided with a first scan line driver circuit 802A and a second scan line driver circuit 802B shown in FIG. 15 can be given. In the display device in FIG. 15, TFTs are controlled by the first scan line driver circuit 802A and the second scan line driver circuit 802B which supply first scan signals and second scan signals through the first scan line 823C and the second scan line 823D, respectively, to the TFTs.

Note that the waveform diagram in FIG. 14 schematically showing potential changes is one example similarly to the waveform diagrams in FIGS. 10A and 10B and may be combined with another driving method. For example, a driving method such as an inversion drive may be employed, in which the polarity of a voltage applied to the pixel electrode is inverted every certain period in accordance with the common potential of the common electrode. By the inversion drive, uneven display such as flickering of an image and deterioration of a display element such as a liquid crystal material can be suppressed. Note that as an example of the inversion drive, source line inversion drive, gate line inversion drive, dot inversion drive, and the like can be given as well as frame inversion drive. Note that as a display method, a progressive method, an interlace method or the like can be employed. Further, one pixel may include a plurality of subpixels.

FIG. 16 is an example of a layout diagram of the pixel 828 in FIG. 13. Note that the layout diagram of pixels of FIG. 16 shows an example of a so-called stripe arrangement in which pixels of three colors, RGB (R is red, G is green, and B is blue), are arranged along the scan line 823A. As for the arrangement of the pixels 828, delta or Bayer arrangement may alternatively be employed. Note that without limitation to the three colors of RGB, more than three colors may be used. For example, RGBW (W is white) or RGB with one or more colors of yellow, cyan, or magenta may be used. Note that areas of display regions in pixels may be different between color elements of RGB.

FIG. 16 illustrates a pixel circuit including the first conductive layer 1101 which serves as a wiring serving as the scan line 823 and one electrode of the capacitor line 832, the oxide semiconductor layer 1102 which forms a channel region of the TFT 829, the second conductive layer 1103 which serves as a wiring serving as the signal line 824 and the other electrode of the capacitor line 832, the pixel electrode layer 1104 which serves as the pixel electrode 831, the third conductive layer 1105 which is connected to the first conductive layer 1101, and the openings 1106 (referred to as contact holes) for connection between the second conductive layer 1103 and the pixel electrode 831 or between the first conductive layer 1101 and the third conductive layer 1105. Although FIG. 16 shows a structure in which the third conductive layer 1105 is provided over the oxide semiconductor layer 1102 for each TFT 829, a structure in FIG. 17 in which the third conductive layer 1105 is provided to overlap with the first conductive layer 1101 and the oxide semiconductor layer 1102 may be employed. When the third conductive layer 1105 is formed from a light-blocking conductive material, the third conductive layer 1105 can be more effective as a light-blocking film in the structure in FIG. 17, than in the layout diagram in FIG. 16.

Figure 17:
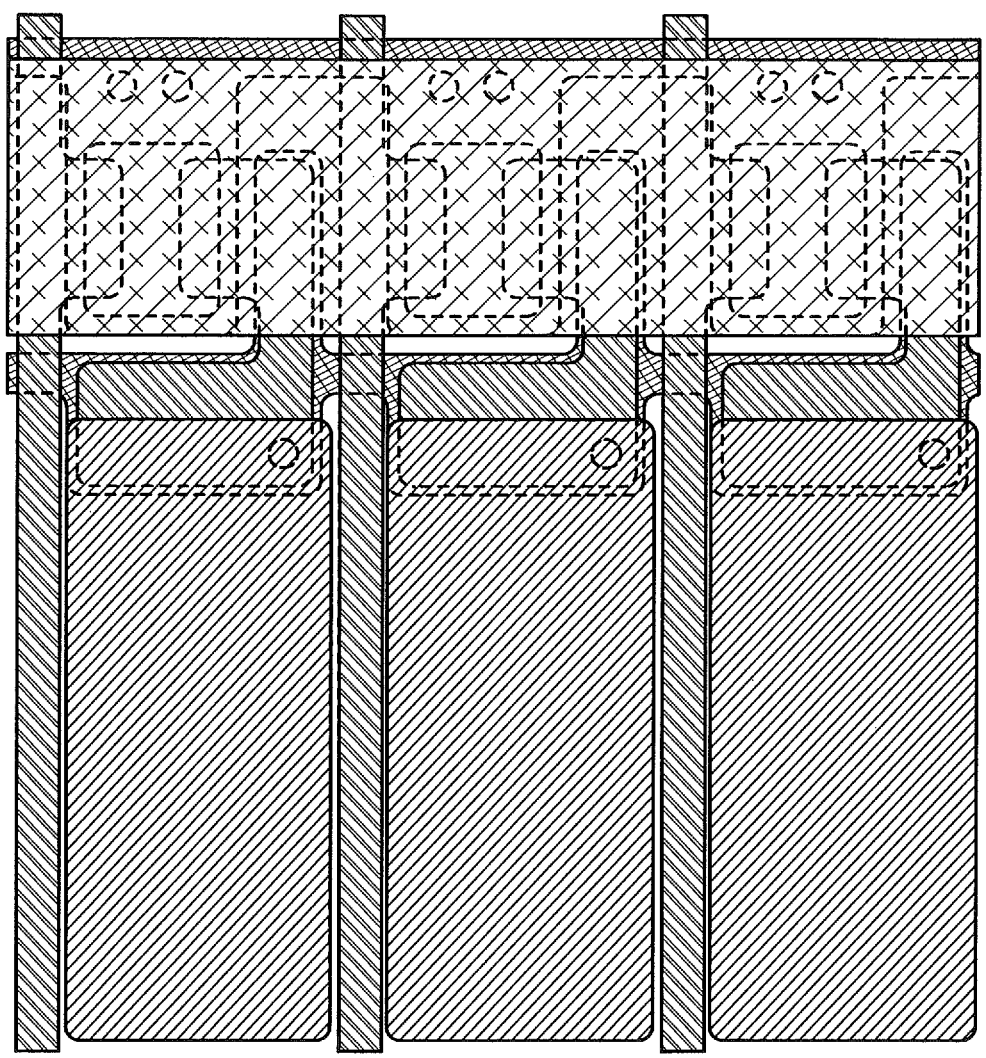
FIG. 17 shows a layout of pixels.

Note that a part of the layout diagrams in FIGS. 16 and 17 may be modified and a source region or drain region of the TFT may have an U-like or C-like shape. In addition, in FIG. 17, the width in the channel length direction of the first conductive layer 1101 which serves as the first gate electrode is larger than the width of the oxide semiconductor layer 1102. Further in addition, the width in a channel length direction of the third conductive layer 1105 which serves as the second gate electrode is larger than the width of the first conductive layer 1101 and is larger than the width of the oxide semiconductor layer 1102.

As is described thus far, by employing the TFT structure described in any one of above Embodiments 1 to 6, the threshold voltage can be controlled while an effect described in the above embodiments can be obtained.

Note that description on each drawing in this embodiment can be arbitrary combined or replaced with a description in another embodiment as appropriate.

(Embodiment 9)

In this embodiment, an example of a light-emitting display device is described as a display device including the transistor described in any one of above Embodiments 1 to 6. As a display element of the display device, here, a light-emitting element utilizing electroluminescence is described. Light-emitting elements utilizing electroluminescence are classified according to whether a light emitting material is an organic compound or an inorganic compound. The former is referred to as an organic EL element and the latter is referred to as an inorganic EL element.

In an organic EL element, by application of voltage to a light-emitting element, electrons and holes are separately injected from a pair of electrodes into a layer containing a light-emitting organic compound, and current flows. Then, those carriers (i.e., electrons and holes) are recombined, and thus, the light-emitting organic compound is excited. When the light-emitting organic compound returns to a ground state from the excited state, light is emitted. Owing to such a mechanism, this light-emitting element is referred to as a current-excitation light-emitting element.

The inorganic EL elements are classified according to their element structures into a dispersion type inorganic EL element and a thin-film type inorganic EL element. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 21:
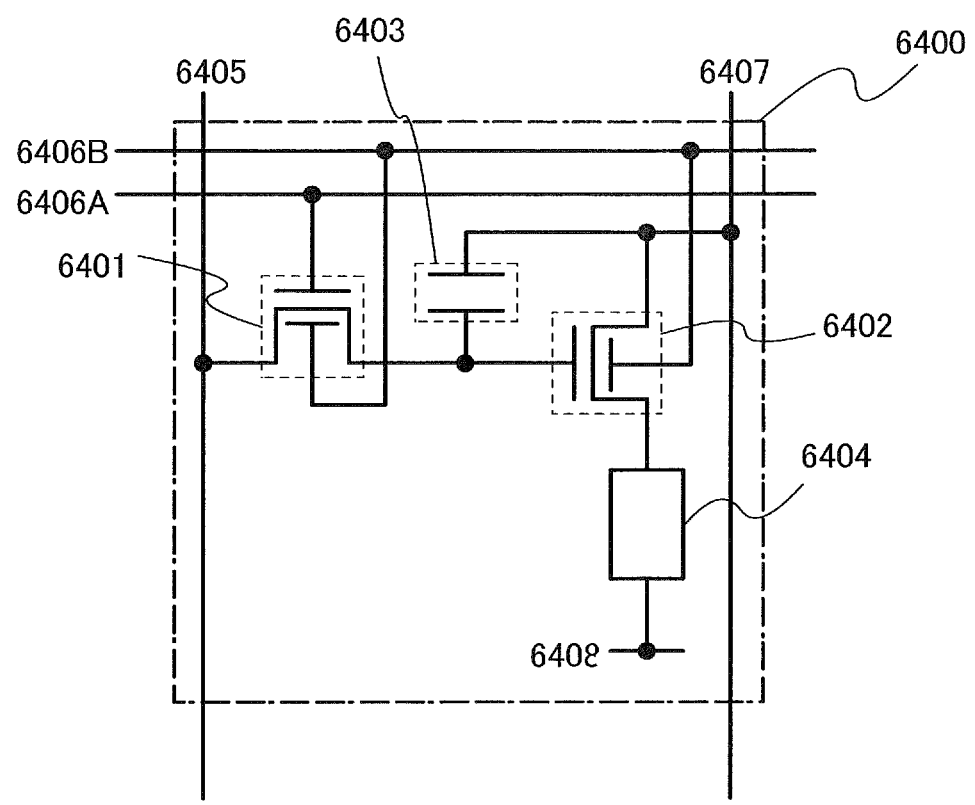
FIG. 21 shows an equivalent circuit of a pixel of a semiconductor device of an embodiment of the present invention.

FIG. 21 shows an example of a pixel in a light-emitting display device including the transistor described in any one of above Embodiments 1 to 6.

A structure and an operation of the pixel in the light-emitting display device are described. In this example, one pixel includes two n-channel transistors in each of which an oxide semiconductor layer (typically, an In—Ga—Zn—O-based non-single-crystal film) is used in a channel formation region.

A pixel 6400 includes a switching transistor 6401 (also referred to as a first transistor), a driver transistor 6402 (also referred to as a second transistor), a light-emitting element 6404, and a capacitor 6403. The switching transistor 6401 has a first gate electrode connected to a scan line 6406A, a second gate electrode connected to a control line 6406B, a first electrode (one of a source electrode layer and a drain electrode layer) connected to a signal line 6405, and a second electrode (the other of the source electrode layer and the drain electrode layer) connected to a gate of the driver transistor 6402. The driver transistor 6402 has a first gate electrode connected to a power supply line 6407 through the capacitor 6403, a second gate electrode connected to the control line 6406B, a first electrode connected to the power supply line 6407, and a second electrode connected to a first electrode (a pixel electrode) of the light-emitting element 6404. A second electrode of the light-emitting element 6404 corresponds to a common electrode 6408. The common electrode 6408 is electrically connected to a common potential line provided over the same substrate, and the connection portion may be used as a common connection portion.

Note that the second electrode (the common electrode 6408) of the light-emitting element 6404 is set to a low power supply potential. The low power supply potential is a potential smaller than a high power supply potential when the high power supply potential set to the power supply line 6407 is a reference. As the low power supply potential, GND, 0 V, or the like may be employed, for example. A potential difference between the high power supply potential and the low power supply potential is applied to the light-emitting element 6404 to make current flow through the light-emitting element 6404, so that the light-emitting element 6404 emits light. Thus, each of the potentials is set so that the potential difference between the high power supply potential and the low power supply potential is equal to or higher than the forward threshold voltage of the light-emitting element 6404.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of performing analog grayscale driving, voltage equal to or higher than the sum of the forward voltage of the light-emitting element 6404 and the threshold voltage of the driver transistor 6402 is applied to the gate of the driver transistor 6402. The forward voltage of the light-emitting element 6404 indicates voltage at which a desired luminance is obtained, and includes at least a forward threshold voltage. By inputting a video signal to allow the driver transistor 6402 to operate in a saturation region, current can flow through the light-emitting element 6404. In order to allow the driver transistor 6402 to operate in the saturation region, the potential of the power supply line 6407 is set higher than the gate potential of the driver transistor 6402. When an analog video signal is used, current can be flow through the light-emitting element 6404 in accordance with the video signal and analog grayscale driving can be performed.

As shown in FIG. 21, by providing the control line 6406B, the threshold voltage of the switching transistor 6401 and the driver transistor 6402 can be controlled as in the TFT described in any one of Embodiments 1 to 6. Specifically, in the driver transistor 6402, a video signal is input so that the driver transistor 6402 operates in the saturation region. Therefore, by controlling the threshold voltage by a potential of the control line 6406B, a deviation between an input video signal and luminance of the light-emitting element due to threshold voltage shift can be reduced. As a result, display quality of the display device can be improved.

Note that the switching transistor 6401 serves as a switch and a potential of the second gate is not always required to be controlled by the control line 6406B.

Note that the pixel structure is not limited to that shown in FIG. 21. For example, a switch, a resistor, a capacitor, a transistor, a logic circuit, or the like may be added to the pixel shown in FIG. 21.

In the case of digital grayscale driving in stead of analog grayscale driving, a video signal is input to the gate of the driver transistor 6402 so that the driver transistor 6402 is either completely turned on or completely turned off. That is, the driver transistor 6402 operates in a linear region. Since the driver transistor 6402 operates in a linear region, voltage higher than the voltage of the power supply line 6407 is applied to the gate of the driver transistor 6402. Note that voltage which is equal to or higher than the sum of the voltage of the power supply line and the Vth of the driver transistor 6402 is applied to the signal line 6405. In this case, the same structure as in FIG. 21 can be employed.

Next, structures of a light-emitting element are described with reference to FIGS. 22A to 22C. A cross-sectional structure of a pixel is described here by taking an n-channel driver TFT as an example. TFTs 7001, 7011, and 7021 serving as driver TFTs used for semiconductor devices illustrated in FIGS. 22A to 22C can be formed by a method similar to the method for forming the thin film transistor 20 described in Embodiment 1. The TFTs 7001, 7011, and 7021 each include an oxide semiconductor layer for a channel formation region.

In order to extract light emitted from the light-emitting element, at least one of an anode and a cathode should be transparent. There are following structures of a light-emitting element which is formed over the same substrate as a thin film transistor: a top-emission structure in which light is extracted through the surface opposite to the substrate, a bottom-emission structure in which light is extracted through the surface of the substrate, and a dual-emission structure in which light is extracted through the surface opposite to the substrate and the surface of the substrate. The pixel structure can be applied to a light-emitting element having any of these emission structures.

A light-emitting element with a top-emission structure is described with reference to FIG. 22A.

Figure 22A:
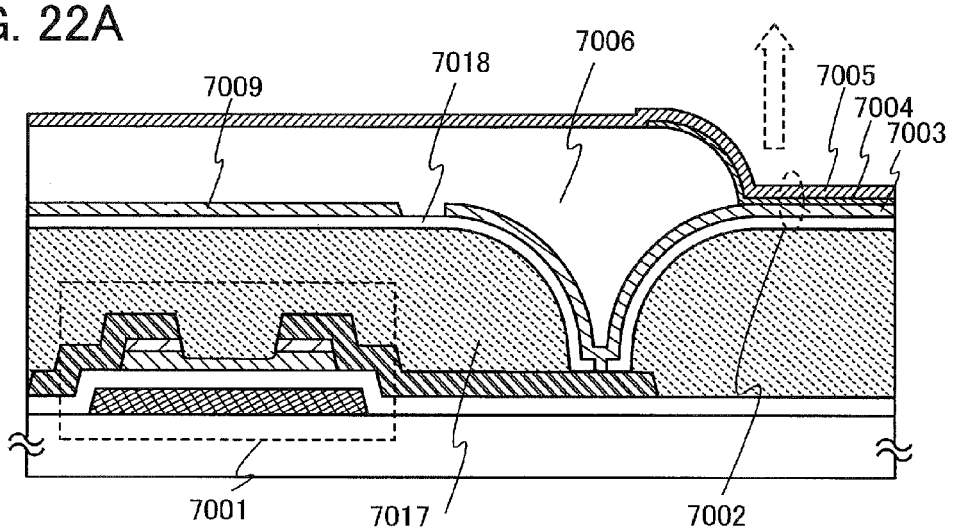
FIGS. 22A to 22C are cross-sectional views of a semiconductor device of an embodiment of the present invention.

FIG. 22A is a cross-sectional view of a pixel in which the TFT 7001 formed by a method of manufacturing a thin film transistor described in Embodiment 1 is provided as a driver TFT in the pixel and light emitted from a light-emitting element 7002 electrically connected to the TFT 7001 goes out through an anode 7005. The TFT 7001 is covered with a resin layer 7017 over which a second protective insulating layer 7018 formed of a silicon nitride film is provided. An In—Zn—O-based oxide semiconductor is used for the oxide semiconductor layer in the TFT 7001. In FIG. 22A, a cathode 7003 of the light-emitting element 7002 is electrically connected to the TFT 7001 serving as a driver TFT, and a light-emitting layer 7004 and the anode 7005 are stacked in this order over the cathode 7003. The cathode 7003 can be formed using any of conductive materials which have a low work function and a conductive film of which reflects light. For example, Ca, Al, MgAg, AlLi, or the like is preferably used.

In FIG. 22A, a second gate electrode 7009 which is formed from the same material as the cathode 7003 overlaps with the oxide semiconductor layer to shield the oxide semiconductor layer from light. In addition, the second gate electrode 7009 controls the threshold value of the TFT 7001. By forming the cathode 7003 and the second gate electrode 7009 from the same material, the number of steps can be reduced.

In addition, a partition 7006 formed of an insulating material is provided in order to prevent short circuit of the second gate electrode 7009 and the cathode 7003. The light-emitting layer 7004 is provided so as to overlap with both of a part of the partition 7006 and an exposed part of the cathode 7003.

The light-emitting layer 7004 may be formed using a single layer or a stack of plural layers. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film formed from a light-transmitting conductive material such as indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the pixel illustrated in FIG. 22A, light is emitted from the light-emitting element 7002 and goes out through the anode 7005 as indicated by an arrow.

Next, a light-emitting element having a bottom-emission structure is described with reference to FIG. 22B. FIG. 22B is a cross-sectional view of a pixel in which a TFT formed by a method of manufacturing a thin film transistor described in Embodiment 1 is provided as a driver TFT 7011 in the pixel and light emitted from a light-emitting element 7012 electrically connected to the driver TFT 7011 goes out through a cathode 7013. The TFT 7011 is covered with the resin layer 7017 over which the second protective insulating layer 7018 formed of a silicon nitride film is provided. An In—Ga—Zn—O-based oxide semiconductor is used for the oxide semiconductor layer in the TFT 7011. In FIG. 22B, the cathode 7013 of the light-emitting element 7012 is formed over a conductive film 7010 having a light-transmitting property which is electrically connected to the driver TFT 7011, and a light-emitting layer 7014 and an anode 7015 are stacked in this order over the cathode 7013. Note that a blocking film 7016 for reflecting or blocking light may be formed so as to cover the anode 7015 when the anode 7015 has a light-transmitting property. For the cathode 7013, any of conductive materials which have a low work function can be used as in the case of FIG. 22A. Note that the cathode 7013 is formed to have a thickness with which the cathode 7013 transmits light (preferably, approximately from 5 nm to 30 nm). For example, an aluminum film with a thickness of 20 nm can be used as the cathode 7013. The light-emitting layer 7014 may be formed of a single layer or a stack of plural layers as in the case of FIG. 22A. The anode 7015 is not required to transmit light, but can be formed using a light-transmitting conductive material as in the case of FIG. 22A. For the blocking film 7016, metal or the like that reflects light can be used; however, it is not limited to a metal film. For example, a resin or the like to which black pigment is added can be used.

Figure 22B:
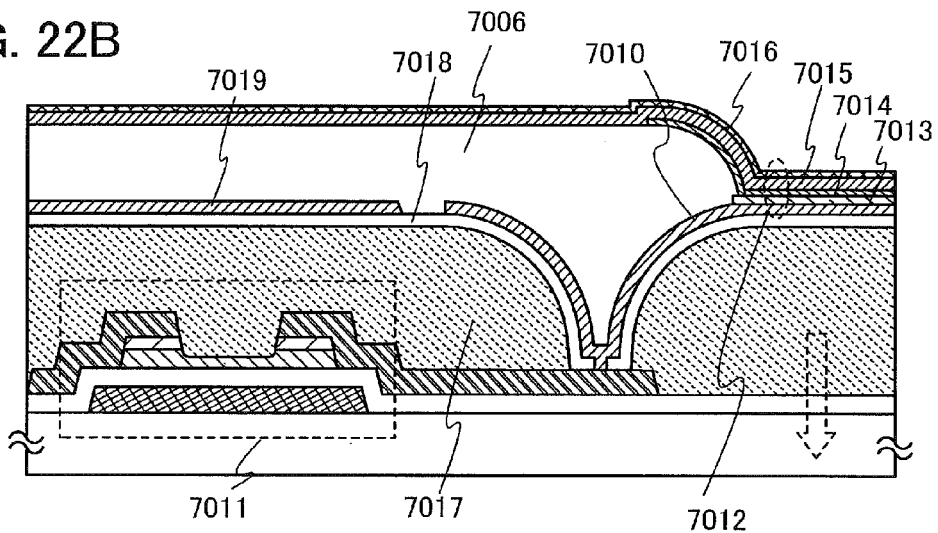

In FIG. 22B, a second gate electrode 7019 which is formed from the same light-transmitting conductive material as the conductive film 7010 having a light-transmitting property overlaps with the oxide semiconductor layer. In this embodiment, indium tin oxide including $SiO_x$ is used as a material for the second gate electrode 7019. In addition, the second gate electrode 7019 controls the threshold value of the TFT 7011. By forming the conductive film 7010 having a light-transmitting property and the second gate electrode 7019 from the same material, the number of steps can be reduced. Further, the oxide semiconductor layer in the TFT 7011 is shielded from light by the blocking film 7016 provided over the second gate electrode 7019.

The light-emitting element 7012 corresponds to a region where the cathode 7013 and the anode 7015 sandwich the light-emitting layer 7014. In the pixel illustrated in FIG. 22B, light is emitted from the light-emitting element 7002 and goes out through the cathode 7013 as indicated by an arrow.

Next, a light-emitting element having a dual-emission structure is described with reference to FIG. 22C. FIG. 22C is a cross-sectional view of a pixel in which the TFT 7021 formed by a method of manufacturing a thin film transistor described in Embodiment 1 is provided as a driver TFT in the pixel and light emitted from a light-emitting element 7022 electrically connected to the TFT 7021 goes out through both of an anode 7025 and an cathode 7023. The TFT 7021 is covered with the resin layer 7017 over which the second protective insulating layer formed of a silicon nitride film is provided. A Zn—O-based oxide semiconductor is used for the oxide semiconductor layer in the TFT 7021.

In addition, the cathode 7023 of the light-emitting element 7022 is formed over a conductive film 7027 having a light-transmitting property which is electrically connected to the TFT 7021 via a connection electrode 7028. A light-emitting layer 7024 and the anode 7025 are stacked in this order over the cathode 7023. For the cathode 7023, any of conductive materials which have a low work function can be used as in the case of FIG. 22A. Note that the cathode 7023 is formed to have a thickness with which the cathode 7023 transmits light. For example, an Al film with a thickness of 20 nm can be used as the cathode 7023. The light-emitting layer 7024 may be formed of a single layer or a stack of plural layers as in the case of FIG. 22A. The anode 7025 can be formed using a light-transmitting conductive as in the case of FIG. 22A.

The light-emitting element 7022 corresponds to a region where the cathode 7023 and the anode 7025 sandwich the light-emitting layer 7024. In the pixel illustrated in FIG. 22C, light is emitted from the light-emitting element 7022 and goes out through both of the anode 7025 and the cathode 7023 as indicated by an arrow.

Figure 22C:
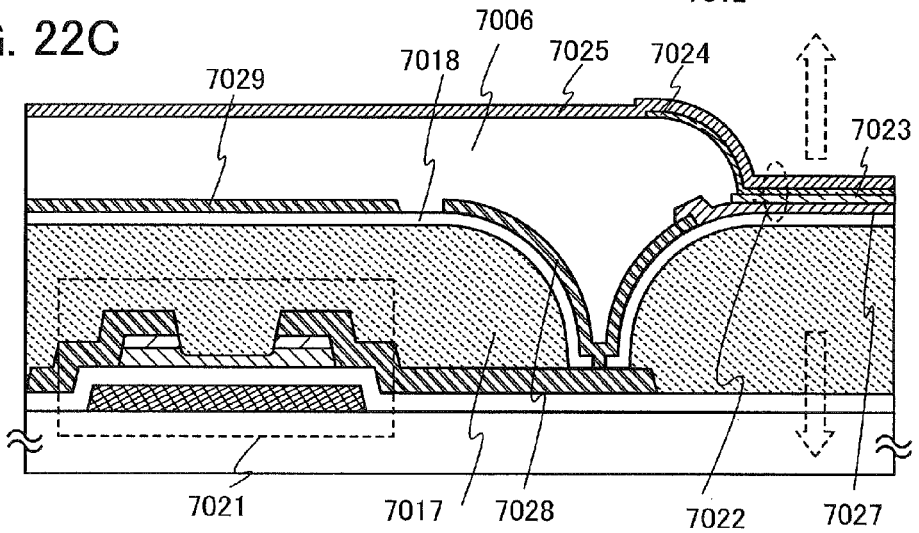

In FIG. 22C, a second gate electrode 7029 overlaps with the oxide semiconductor layer. As a material for the second gate electrode 7029, a light-transmitting conductive material (such as titanium, titanium nitride, aluminum nitride, or tungsten) is used. In this embodiment, a titanium film is used as a material for the second gate electrode 7029. In addition, the second gate electrode 7029 controls the threshold value of the TFT 7021. The oxide semiconductor layer in the TFT 7021 is shielded from light by the second gate electrode 7029. The same Ti film as that for the second gate electrode 7029 is used for the connection electrode 7028 electrically connected to the TFT 7021.

Although an organic EL element is described here as a light-emitting element, an inorganic EL element can alternatively be provided as a light-emitting element.

Note that this embodiment describes an example in which a thin film transistor (a driver TFT) which controls the driving of a light-emitting element is electrically connected to the light-emitting element, but a structure may be employed in which a current control TFT is connected between the driver TFT and the light-emitting element.

Figure 23A:
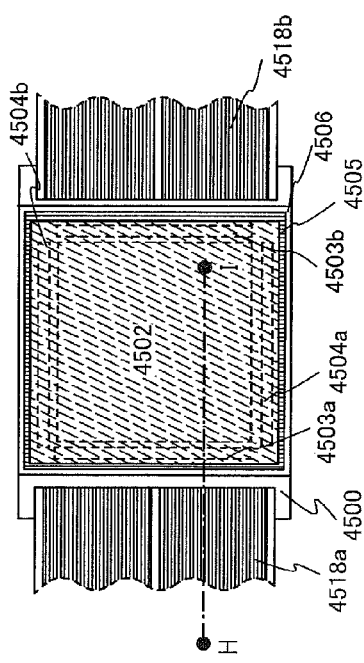
FIGS. 23A and 23B are a top view and a cross-sectional view of a semiconductor device of one embodiment of the present invention.
Figure 23B:
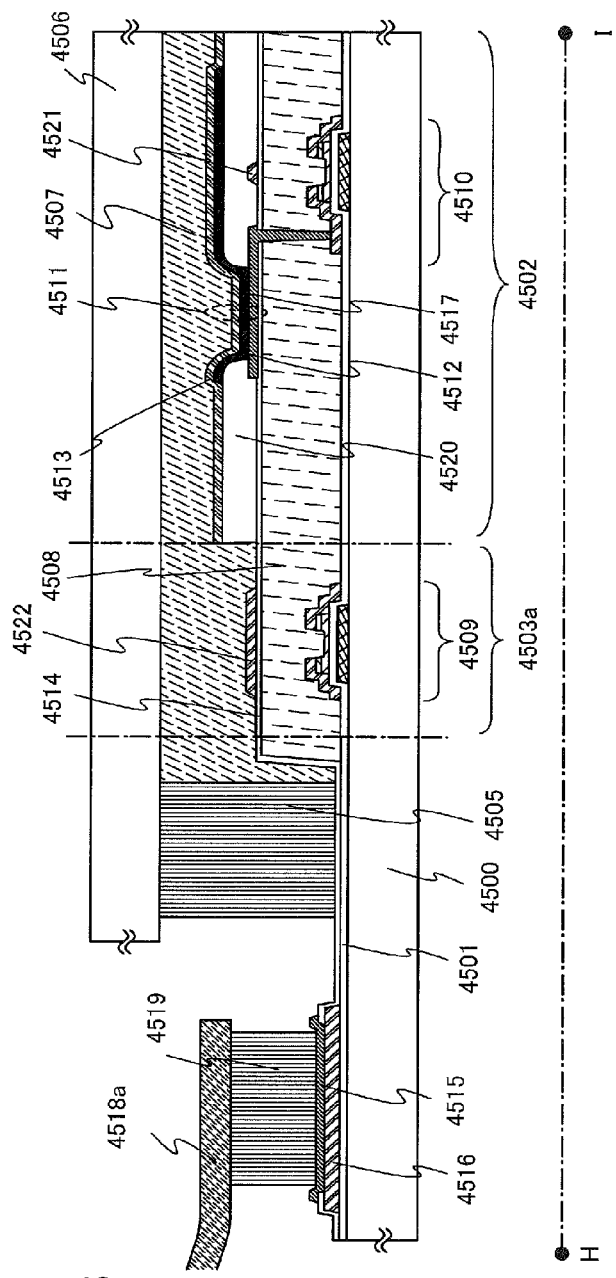

Next, an appearance and across section of a light-emitting display panel (also referred to as a light-emitting panel) which is one mode of a semiconductor device is described with reference to FIGS. 23A and 23B. FIG. 23A is a top view of a panel in which a thin film transistor and a light-emitting element over a first substrate are sealed with a sealant between the first substrate and a second substrate. FIG. 23B is a cross-sectional view along H-I of FIG. 23A.

A sealant 4505 is provided so as to surround a pixel portion 4502, signal line driver circuits 4503a and 4503b, and scan line driver circuits 4504a and 4504b, which are provided over a first substrate 4500. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4500, the sealant 4505, and the second substrate 4506. In this manner, it is preferable that the light-emitting display panel be packaged (sealed) with a protective film (such as an attachment film or an ultraviolet curable resin film) or a cover material with high air-tightness and little degasification so as not to be exposed to external air.

The pixel portion 4502, the signal line driver circuits 4503a and 4503b, and the scan line driver circuits 4504a and 4504b which are formed over the first substrate 4500 each include a plurality of thin film transistors. A thin film transistor 4510 included in the pixel portion 4502 and a thin film transistor 4509 included in the signal line driver circuit 4503a are illustrated as an example in FIG. 23B.

The thin film transistors 4509 and 4510 include a Zn—O-based oxide semiconductor. In this embodiment, the thin film transistors 4509 and 4510 are n-channel thin film transistors. The thin film transistors 4509 and 4510 are covered with a resin layer 4508 which is in contact with the oxide semiconductor layers and covered with a second protective insulating layer 4514 over the resin layer 4508. The second protective insulating layer 4514 formed of a silicon nitride film is formed to cover the top and side surfaces of the resin layer and is in contact with the first gate insulating layer 4501 for sealing outside the pixel portion. A conductive layer 4522 serving as a second gate electrode is provided over the thin film transistor 4509. In addition, a conductive layer 4521 serving as a second gate electrode is provided over the thin film transistor 4510. The conductive layer 4521 and the conductive layer 4522 not only control the threshold values of the thin film transistors, but also serve as protective layers of the oxide semiconductor layers.

The width of the conductive layer 4522 is larger than that of the gate electrode of the thin film transistor 4509 and gate voltage can be applied to the entire oxide semiconductor layer from the second gate electrode. In the case where a light-blocking conductive film is used as the conductive layer 4522, the oxide semiconductor layer of the thin film transistor 4509 can be shielded from light. In the case where the conductive layer 4522 having a light-blocking property is used as the second gate electrode, changes in electric characteristics of the thin film transistor due to photosensitivity of the oxide semiconductor can be prevented and thus the electric characteristics can be stabilized.

Further, the width of the conductive layer 4521 is different from that of the conductive layer 4522 and is smaller than that of the gate electrode of the thin film transistor 4510. By making the width of the conductive layer 4521 smaller than that of the gate electrode of the thin film transistor 4510, an area in which the conductive layer 4521 overlaps with the source electrode layer or the drain electrode layer is reduced, whereby a parasitic capacitance can be reduced. The width of the conductive layer 4521 is smaller than that of the oxide semiconductor layer of the thin film transistor 4510; thus, only part of the oxide semiconductor layer is shielded from light, but a second electrode layer 4513 is provided over the conductive layer 4521 to shield the entire part of the oxide semiconductor layer from light.

Moreover, reference numeral 4511 denotes a light-emitting element. A first electrode layer 4517 which is a pixel electrode included in the light-emitting element 4511 is electrically connected to a source or drain electrode layer of the thin film transistor 4510. Note that although the light-emitting element 4511 has a stacked structure of the first electrode layer 4517, an electroluminescent layer 4512, and a second electrode layer 4513 in this embodiment, the structure of the light-emitting element 4511 is not limited thereto. The structure of the light-emitting element 4511 can be changed as appropriate depending on a direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material to have an opening on the first electrode layer 4517 so that a sidewall of the opening is formed as an inclined surface with a continuous curvature.

The electroluminescent layer 4512 may be formed using a single layer or a stack of plural layers.

In order to prevent entry of oxygen, hydrogen, moisture, carbon dioxide, or the like into the light-emitting element 4511, a protective film may be formed over the second electrode layer 4513 and the partition 4520. As the protective film, a silicon nitride film, a silicon nitride oxide film, a DLC film, or the like can be formed.

In addition, a variety of signals and potentials are supplied from FPCs 4518a and 4518b to the signal line driver circuits 4503a and 4503b, the scan line driver circuits 4504a and 4504b, or the pixel portion 4502.

In this embodiment, a connecting terminal electrode 4515 is formed using the same conductive film as the first electrode layer 4517 included in the light-emitting element 4511. A terminal electrode 4516 is formed using the same conductive film as the source and drain electrode layers included in the thin film transistors 4509 and 4510.

The connecting terminal electrode 4515 is electrically connected to a terminal included in the FPC 4518a via an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element. Further, the polarizing plate or the circularly polarizing plate may be provided with an anti-reflection film. For example, anti-glare treatment by which reflected light is diffused by depressions and projections of the surface so as to reduce the glare can be performed.

As the signal line driver circuits 4503a and 4503b and the scan line driver circuits 4504a and 4504b, driver circuits formed by using a single crystal semiconductor film or a polycrystalline semiconductor film over a substrate separately prepared may be mounted. In addition, only the signal line driver circuits or part thereof, or only the scan line driver circuits or part thereof may be separately formed and then mounted. This embodiment is not limited to the structure shown in FIGS. 23A and 23B.

Through the above steps, a highly reliable light-emitting device (a display panel) as a semiconductor device can be manufactured.

This embodiment can be implemented in an appropriate combination with any of the structures described in the other embodiments.

(Embodiment 10)

Thin film transistors including an oxide semiconductor layer which is described in any one of Embodiments 1 to 6 can be manufactured and a liquid crystal display device having a display function can be manufactured using the thin film transistors not only in a driver circuit but also in a pixel portion. Further, part or the whole of the driver circuit using the thin film transistors is formed over the same substrate as the pixel portion, whereby a system-on-panel can be obtained.

The liquid crystal display device includes a liquid crystal element (also referred to as a liquid crystal display element) as a display element.

In addition, the liquid crystal display device includes a panel in which a display element is sealed, and a module in which an IC and the like including a controller are mounted on the panel. The liquid crystal display device also includes one mode of an element substrate before the display element is completed in a manufacturing process of the liquid crystal display device, and the element substrate is provided with a means to supply a current to the display element in each of a plurality of pixels. Specifically, the element substrate may be in a state after only a pixel electrode of the display element is formed, a state after a conductive film to be a pixel electrode is formed but before the conductive film is etched to be the pixel electrode, or any other states.

A liquid crystal display device in this specification refers to an image display device, a display device, or a light source (including a lighting device). Further, the liquid crystal display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module in which an integrated circuit (IC) is directly mounted on a display element by a chip-on-glass (COG) method.

An appearance and a cross section of a liquid crystal display panel, which is one embodiment of liquid crystal display device, will be described with reference to FIGS. 24A1, 24A2, and 24B. FIGS. 24A1 and 24A2 are top views of panels in which a liquid crystal element 4013 is sealed with a sealant 4005 between a first substrate 4001 and a second substrate 4006. FIG. 24B is a cross-sectional view taken along M-N of FIGS. 24A1 and 24A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 as well as a liquid crystal layer 4008 are sealed with the sealant 4005 between the first substrate 4001 and the second substrate 4006. A blue-phase liquid crystal material is used for the liquid crystal layer 4008 in this embodiment without particular limitation. A liquid crystal material exhibiting a blue phase has a short response time of 1 millisecond or less from the state of applying no voltage to the state of applying voltage, whereby short-time response is possible. A blue-phase liquid crystal material includes liquid crystal and a chiral agent. The chiral agent is employed to align the liquid crystal in a helical structure and to make the liquid crystal exhibit a blue phase. For example, a liquid crystal material into which a chiral agent is mixed at 5 wt % or more may be used for the liquid crystal layer. As a liquid crystal, a thermotropic liquid crystal, a low molecular liquid crystal, a high molecular liquid crystal, a ferroelectric liquid crystal, an anti-ferroelectric liquid crystal, or the like is used.

In FIG. 24A1, a signal line driver circuit 4003 that is formed using a single crystal semiconductor film or a polycrystalline semiconductor film over a substrate separately prepared is mounted in a region that is different from the region surrounded by the sealant 4005 over the first substrate 4001. In contrast, FIG. 24A2 illustrates an example in which part of a signal line driver circuit is formed over the first substrate 4001. In FIG. 24A2, a signal line driver circuit 4003b is formed over the first substrate 4001 and a signal line driver circuit 4003a that is formed using a single crystal semiconductor film or a polycrystalline semiconductor film over the substrate separately prepared is mounted on the first substrate 4001.

Note that there is no particular limitation on a connection method of the driver circuit which is separately formed, and a COG method, a wire bonding method, a TAB method, or the like can be used. FIG. 24A1 illustrates an example in which the signal line driver circuit 4003 is mounted by a COG method and FIG. 24A2 illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 24B illustrates the thin film transistor 4010 included in the pixel portion 4002 and the thin film transistor 4011 included in the scan line driver circuit 4004. A resin layer 4021 is provided over the thin film transistors 4010 and 4011. As the thin film transistors 4010 and 4011, the thin film transistor which is described in any one of Embodiments 1 to 6 can be employed. In this embodiment, the thin film transistors 4010 and 4011 are n-channel thin film transistors each include an oxide semiconductor layer for a channel formation region.

The thin film transistors 4010 and 4011 are covered with the resin layer 4021, which is a first protective insulating layer, and a second protective insulating layer 4022. The resin layer 4021, which is the first protective insulating layer, is provided over and in contact with the oxide semiconductor layers of the thin film transistors 4010 and 4011 and a first gate insulating layer 4020.

The resin layer 4021 which can be used as a planarizing insulating film can be formed from an organic material having heat resistance, such as polyimide, acrylic, benzocyclobutene, polyamide, or epoxy. As an alternative to such organic materials, it is possible to use a low-dielectric constant material (a low-k material), a siloxane-based resin, phosphosilicate glass (PSG), borophosphosilicate glass (BPSG), or the like. Note that the planarizing insulating film may be formed by stacking a plurality of insulating films formed of any of these materials.

The method for the formation of the stacked insulating films is not limited to a particular method and the following method can be used depending on the material: a sputtering method, an SOG method, spin coating, dip coating, spray coating, a droplet discharging method (e.g., an ink jetting method, screen printing, or offset printing), a doctor knife, a roll coater, a curtain coater, a knife coater, or the like.

Note that the second protective insulating layer 4022 is provided to prevent entry of impurities floating in air, such as an organic substance, a metal substance, or moisture, and is preferably a dense film. The protective film may be formed using a single layer or a stack of layers of a silicon oxide film, a silicon nitride film, a silicon oxynitride film, a silicon nitride oxide film, an aluminum oxide film, an aluminum nitride film, an aluminum oxynitride film, or an aluminum nitride oxide film by a PCVD method or a sputtering method.

The resin layer 4021 is a light-transmitting resin layer and a photosensitive polyimide resin is used in this embodiment. Further, the second protective insulating layer 4022 is a silicon nitride film obtained under a low power condition by a PCVD method. Further, a base insulating layer 4007 which is a silicon nitride film and the second protective insulating layer 4022 are in contact with each other outside the pixel portion to surround the resin layer 4021. Thus, by encapsulating the thin film transistors 4010 and 4011 with silicon nitride films, reliability of the thin film transistors 4010 and 4011 is improved.

Further, a second gate electrode 4028 is formed over the second protective insulating layer 4022 and in a position overlapping with the oxide semiconductor layer of the thin film transistor 4011. A second gate electrode 4029 is formed over the second protective insulating layer 4022 and in a position overlapping with the oxide semiconductor layer of the thin film transistor 4010.

In addition, a pixel electrode layer 4030 and a common electrode layer 4031 are provided over the first substrate 4001. The pixel electrode layer 4030 is electrically connected to the thin film transistor 4010. The second gate electrodes 4028 and 4029 can have the same potential as the common electrode layer 4031. The second gate electrodes 4028 and 4029 can be formed in the same step as the common electrode layer 4031. Further, if the second gate electrodes 4028 and 4029 are formed using a light-blocking conductive film, they can also serve as light-blocking layers shielding the oxide semiconductor layers of the thin film transistors 4011 and 4010 from light.

Alternatively, the second gate electrodes 4028 and 4029 can have a different potential from the common electrode layer 4031. In this case, a control line electrically connected to the second gate electrodes 4028 and 4029 is provided and the threshold voltage of the thin film transistors 4011 and 4010 are controlled with a potential of the control line.

The liquid crystal element 4013 includes the pixel electrode layer 4030, the common electrode layer 4031, and the liquid crystal layer 4008. In this embodiment, a method is used in which grayscale is controlled by generating an electric field which is substantially parallel to a substrate (i.e., in a lateral direction) to move liquid crystal molecules in a plane parallel to the substrate. In such a method, an electrode structure used in an in plane switching (IPS) mode or a fringe field switching (FFS) mode can be used. Note that polarizing plates 4032 and 4033 are provided on outer sides of the first substrate 4001 and the second substrate 4006, respectively.

As the first substrate 4001 and the second substrate 4006, glass, plastic, or the like having a light-transmitting property can be used. As plastic, a fiberglass-reinforced plastics (FRP) plate, a polyvinyl fluoride (PVF) film, a polyester film, or an acrylic resin film can be used. Alternatively, a sheet in which aluminum foil is sandwiched by PVF films or polyester films can be used.

Reference numeral 4035 denotes a columnar spacer obtained by selective etching of an insulating film and is provided in order to control the thickness (a cell gap) of the liquid crystal layer 4008. Note that a spherical spacer may be used. The columnar spacer 4035 is located to overlap with the second gate electrode 4029.

FIGS. 24A1, 24A2, and 24B illustrate examples of liquid crystal display devices in which a polarizing plate is provided on the outer side (the view side) of a substrate; however, the polarizing plate may be provided on the inner side of the substrate. The position of the polarizing plate may be determined as appropriate depending on the material of the polarizing plate and conditions of the manufacturing process. Further, a light-blocking layer serving as a black matrix may be provided.

In FIGS. 24A1, 24A2, and 24B, a light-blocking layer 4034 is provided on the second substrate 4006 to overlap with the thin film transistors 4010 and 4011. By providing the light-blocking layer 4034, further improvement in contrast and in stabilization of the thin film transistors can be achieved.

When the light-blocking layer 4034 is provided, the intensity of incident light on the semiconductor layers of the thin film transistors can be attenuated. Accordingly, electric characteristics of the thin film transistors can prevented from being varied due to photosensitivity of the oxide semiconductor and can be stabilized.

The pixel electrode layer 4030, the common electrode layer 4031, the second gate electrodes 4028 and 4029 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can also be used for the pixel electrode layer 4030, the common electrode layer 4031, and the second gate electrodes 4028 and 4029.

A variety of signals and potentials are supplied from an FPC 4018 to the signal line driver circuit 4003 which is formed separately, the scan line driver circuit 4004, and the pixel portion 4002.

Further, since the thin film transistor is easily broken by static electricity and the like, a protective circuit for protecting the driver circuits is preferably provided over the same substrate for a gate line or a source line. The protective circuit is preferably formed using a nonlinear element in which an oxide semiconductor is used.

In FIGS. 24A1, 24A2, and 24B, a connection terminal electrode 4015 is formed using the same conductive film as that of the pixel electrode layer 4030, and a terminal electrode 4016 is formed using the same conductive film as that of a source and drain electrode layers of the thin film transistors 4010 and 4011.

The connection terminal electrode 4015 is electrically connected to a terminal included in the FPC 4018 via an anisotropic conductive film 4019.

FIGS. 24A1, 24A2, and 24B illustrate an example in which the signal line driver circuit 4003 is formed separately and mounted on the first substrate 4001 without limitation. The scan line driver circuit may be formed separately and then mounted, or only part of the signal line driver circuit or part of the scan line driver circuit may be formed separately and then mounted.

Figure 25:
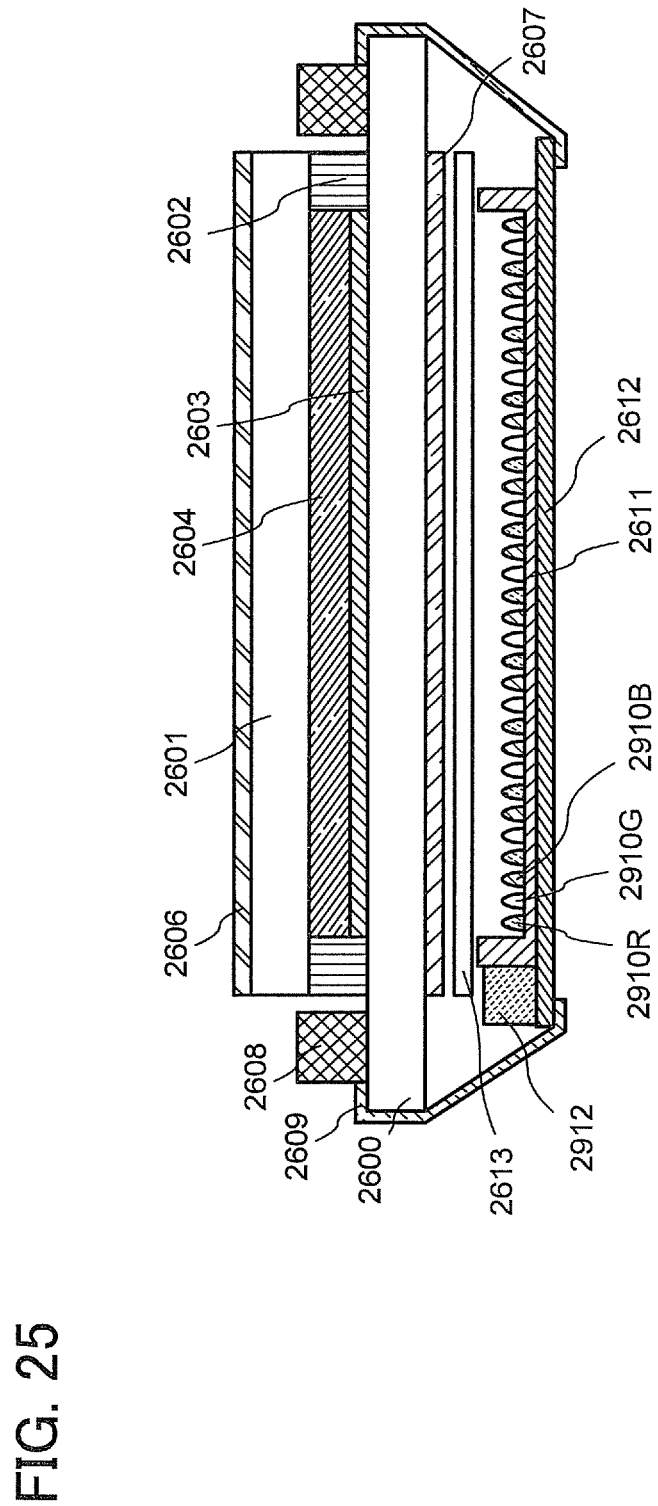
FIG. 25 is a cross-sectional view of a semiconductor device of one embodiment of the present invention.

FIG. 25 illustrates an example of a cross-sectional structure of a liquid crystal display device in which an element substrate 2600 and a counter substrate 2601 are attached to each other with a sealant 2602, and an element layer 2603 including a TFT or the like and a liquid crystal layer 2604 are provided between the substrates.

In the case where color display is performed, light-emitting diodes which emit light of plural colors are arranged in a backlight portion. In the case of an RGB mode, a red light-emitting diode 2910R, a green light-emitting diode 2910G, and a blue light-emitting diode 2910B are disposed in each of the regions into which a display area of the liquid crystal display device is divided.

A polarizing plate 2606 is provided on the outer side of the counter substrate 2601, and a polarizing plate 2607 and an optical sheet 2613 are provided on the outer side of the element substrate 2600. A light source is formed using the red light-emitting diode 2910R, the green light-emitting diode 2910G, the blue light-emitting diode 2910B, and a reflective plate 2611. An LED control circuit 2912 provided for a circuit substrate 2612 is connected to a wiring circuit portion 2608 of the element substrate 2600 via a flexible wiring board 2609 and further includes an external circuit such as a control circuit or a power source circuit.

This embodiment describes a field-sequential liquid crystal display device in which the LEDs are individually made to emit light by this LED control circuit 2912 without particular limitation. It is also possible to use a cold cathode fluorescent lamp or a white LED as a light source of the backlight and to provide a color filter.

Further, this embodiment employs an electrode structure used in an in plane switching (IPS) mode without particular limitation. A twisted nematic (TN) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

This embodiment can be implemented in an appropriate combination with any of the structures described in the other embodiments.

(Embodiment 11)

In this embodiment, an example of an electronic paper is described as a semiconductor device which includes a plurality of thin film transistors including an oxide semiconductor layer.

Figure 26A:
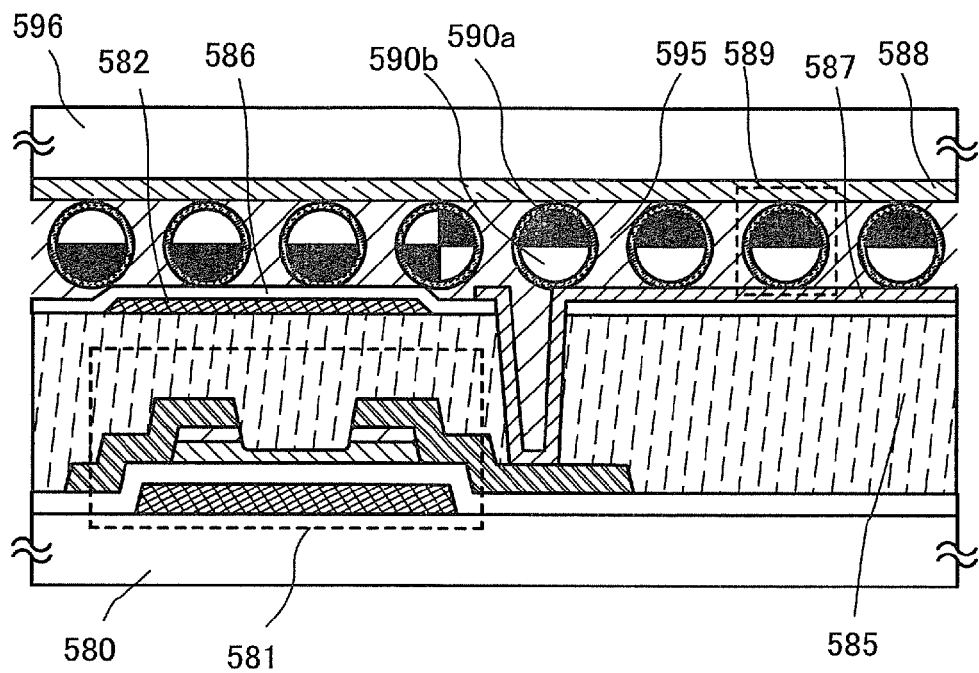
FIGS. 26A and 26B are a cross-sectional view of a semiconductor device and an external view of an electronic appliance of one embodiment of the present invention.

FIG. 26A is a cross-sectional view illustrating an active matrix electronic paper. As a thin film transistor 581 used in a display portion of the semiconductor device, the thin film transistor which is described in any one of Embodiments 1 to 6 can be employed.

The electronic paper of FIG. 26A is an example of a display device in which a twisting ball display system is employed. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 sealed between a substrate 580 and a substrate 596 has a bottom-gate structure. A first electrode layer 587 is electrically connected to a source or drain electrode layer through an opening formed in a resin layer 585 and a second protective insulating layer 586. Between the first electrode layer 587 and a second electrode layer 588, spherical particles 589 each having a black region 590*a*, a white region 590*b*, and a cavity filled with liquid around the regions are provided. A space around the spherical particles 589 is filled with a filler 595 such as a resin (see FIG. 26A).

A second gate electrode 582 is formed over the resin layer 585 covering the thin film transistor 581. In addition, the second protective insulating layer 586 is formed to cover the second gate electrode 582. An oxide semiconductor layer of the thin film transistor 581 is protected by the resin layer 585 serving as a first protective insulating layer, the second gate electrode 582, and the second protective insulating layer 586.

In this embodiment, the first electrode layer 587 corresponds to a pixel electrode, and the second electrode layer 588 corresponds to a common electrode. The second electrode layer 588 is electrically connected to a common potential line provided over the same substrate 580 as the thin film transistor 581. With the use of a common connection portion, the second electrode layer 588 can be electrically connected to the common potential line via conductive particles provided between the pair of substrates 580 and 596.

Instead of the twisting ball, an electrophoretic element can be used. A microcapsule having a diameter of about 10 µm to 200 µm in which transparent liquid, positively-charged white microparticles, and negatively-charged black microparticles are encapsulated is used. In the microcapsules which are provided between the first electrode layer and the second electrode layer, when an electric field is applied by the first electrode layer and the second electrode layer, the white microparticles and the black microparticles move to opposite sides from each other, so that white or black can be displayed. A display element using this principle is an electrophoretic display element and is called an electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

By using the thin film transistor manufactured by the process described in any one of Embodiments 1 to 6 as a switching element, an electronic paper can be manufactured as a semiconductor device at low cost. An electronic paper can be used for electronic appliances of a variety of fields for displaying information. For example, an electronic paper can be used for an electronic book reader (an e-book reader), posters, advertisement in vehicles such as trains, or displays of various cards such as credit cards. An example of such electronic appliances are illustrated in FIG. 26B.

Figure 26B:
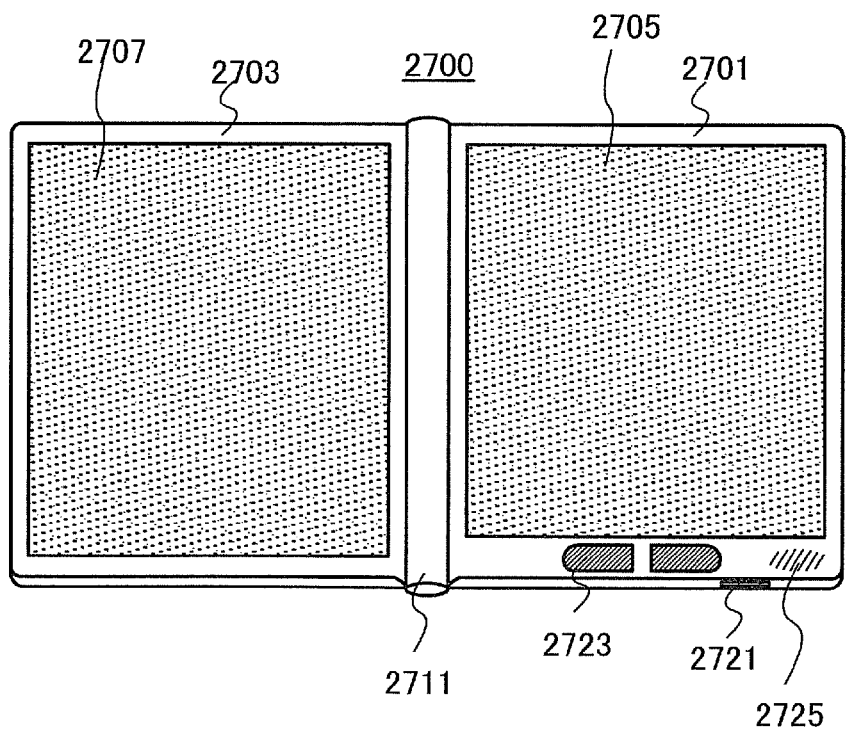

FIG. 26B illustrates an example of an electronic book reader 2700. For example, the electronic book reader 2700 includes two housings 2701 and 2703. The housings 2701 and 2703 are combined with a hinge 2711 so that the electronic book reader 2700 can be opened and closed along the hinge 2711. With such a structure, the electronic book reader 2700 can be handled like a paper book.

A display portion 2705 is incorporated in the housing 2701 and a display portion 2707 is incorporated in the housing 2703. The display portion 2705 and the display portion 2707 may display one image or different images. In the structure where different images are displayed on the display portion 2705 and the display portion 2707, for example, the right display portion (the display portion 2705 in FIG. 26B) can display text and the left display portion (the display portion 2707 in FIG. 26B) can display images.

FIG. 26B illustrates an example in which the housing 2701 is provided with an operation portion and the like. For example, the housing 2701 is provided with a power supply switch 2721, an operation key 2723, a speaker 2725, and the like. The page can be turned with the operation key 2723. Note that a keyboard, a pointing device, and the like may be provided on the same plane as the display portion of the housing. Further, a rear surface or a side surface of the housing may be provided with an external connection terminal (an earphone terminal, a USB terminal, a terminal which can be connected with a variety of cables such as an AC adapter or a USB cable, and the like), a storage medium inserting portion, or the like. Moreover, the electronic book reader 2700 may have a function of an electronic dictionary.

Further, the electronic book reader 2700 may send and receive data wirelessly. Desired book data or the like can be purchased and downloaded from an electronic book server wirelessly.

This embodiment can be implemented in an appropriate combination with any of the structures described in the other embodiments.

(Embodiment 12)

A semiconductor device which has a thin film transistor manufactured by the process described in any one of Embodiments 1 to 6 can be applied to a variety of electronic appliances (including game machines). Examples of electronic appliances are a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio playback device, a large-sized game machine such as a pachinko machine, and the like.

Figure 27A:
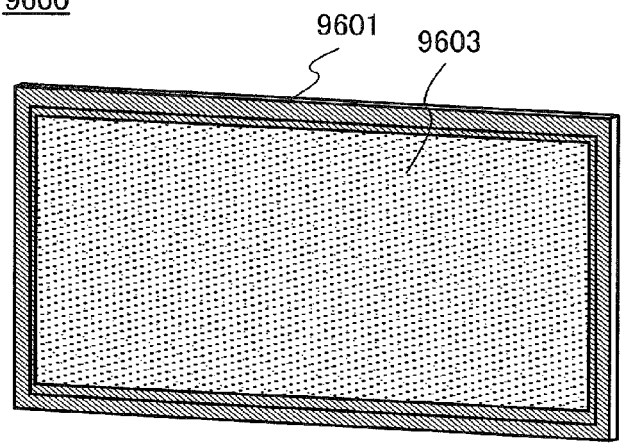

FIG. 27A illustrates an example of a television device 9601. A display portion 9603 is incorporated in a housing of the television device 9601. The display portion 9603 can display images. Here, the back of the housing is supported so that the television device 9601 is fixed to a wall 9600.

The television device 9601 can be operated with an operation switch of the housing or a separate remote control 9610. The channel and volume can be controlled with operation keys 9609 of the remote control 9610 and images displayed on the display portion 9603 can be controlled. Moreover, the remote control 9610 may have a display portion 9607 on which the information outgoing from the remote control 9610 is displayed.

Note that the television device 9601 is provided with a receiver, a modem, and the like. With the receiver, general television broadcasting can be received. Moreover, when the display device is connected to a communication network with or without wires via the modem, one-way (from a sender to a receiver) or two-way (e.g., between a sender and a receiver or between receivers) information communication can be performed.

FIG. 27B illustrates a portable game console including a housing 9881 and a housing 9891 which are jointed with a connector 9893 so as to be opened and closed. A display portion 9882 and a display portion 9883 are incorporated in the housing 9881 and the housing 9891, respectively. The portable game console illustrated in FIG. 27B additionally includes a speaker portion 9884, a storage medium inserting portion 9886, an LED lamp 9890, an input means (operation keys 9885, a connection terminal 9887, a sensor 9888 (having a function of measuring force, displacement, position, speed, acceleration, angular speed, rotational frequency, distance, light, liquid, magnetism, temperature, chemical substance, sound, time, hardness, electric field, current, voltage, electric power, radiation, flow rate, humidity, gradient, vibration, smell, or infrared ray), and a microphone 9889), and the like. Needless to say, the structure of the portable game console is not limited to the above, and may be any structure which is provided with at least a semiconductor device. The portable game console may include other accessory equipment as appropriate. The portable game console illustrated in FIG. 27B has a function of reading a program or data stored in a storage medium to display it on the display portion, and a function of sharing information with another portable game console via wireless communication. The portable game console of FIG. 27B can have a variety of functions other than those above.

Figure 28A:
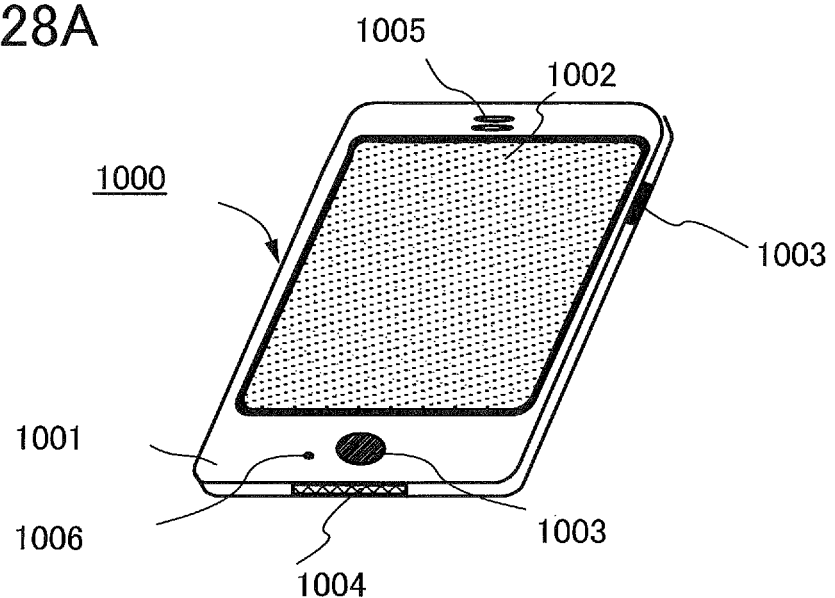
FIGS. 28A and 28B illustrate electronic appliances of one embodiment of the present invention.

FIG. 28A illustrates an example of a cellular phone 1000. The cellular phone 1000 includes a housing 1001 in which a display portion 1002 is incorporated, an operation button 1003, an external connection port 1004, a speaker 1005, a microphone 1006, and the like.

Information can be input to the cellular phone 1000 illustrated in FIG. 28A by touching the display portion 1002 with a finger or the like. Moreover, users can make a call or write an e-mail by touching the display portion 1002 with their fingers or the like.

There are mainly three screen modes of the display portion 1002. The first mode is a display mode mainly for displaying images. The second mode is an input mode mainly for inputting information such as text. The third mode is a display-and-input mode in which two modes of the display mode and the input mode are combined.

For example, in the case of making a call or writing an e-mail, the display portion 1002 is set to a text input mode mainly for inputting text, and characters displayed on a screen can be input. In this case, it is preferable to display a keyboard or number buttons on almost the entire area of the screen of the display portion 1002.

When a detection device including a sensor for detecting inclination, such as a gyroscope or an acceleration sensor, is provided inside the cellular phone 1000, display on the screen of the display portion 1002 can be automatically switched by detecting the direction of the cellular phone 1000 (whether the cellular phone 1000 is placed horizontally or vertically for a landscape mode or a portrait mode).

Further, the screen modes are switched by touching the display portion 1002 or operating the operation button 1003 of the housing 1001. Alternatively, the screen modes can be switched depending on kinds of images displayed on the display portion 1002. For example, when a signal for an image displayed on the display portion is data of moving images, the screen mode is switched to the display mode. When the signal is text data, the screen mode is switched to the input mode.

Further, in the input mode, a signal is detected by an optical sensor in the display portion 1002 and if input by touching the display portion 1002 is not performed for a certain period, the screen mode may be controlled so as to be switched from the input mode to the display mode.

The display portion 1002 can also function as an image sensor. For example, an image of a palm print, a fingerprint, or the like is taken by touching the display portion 1002 with the palm or the finger, whereby personal authentication can be performed. Moreover, when a backlight or sensing light source which emits near-infrared light is provided in the display portion, an image of finger veins, palm veins, or the like can be taken.

Figure 28B:
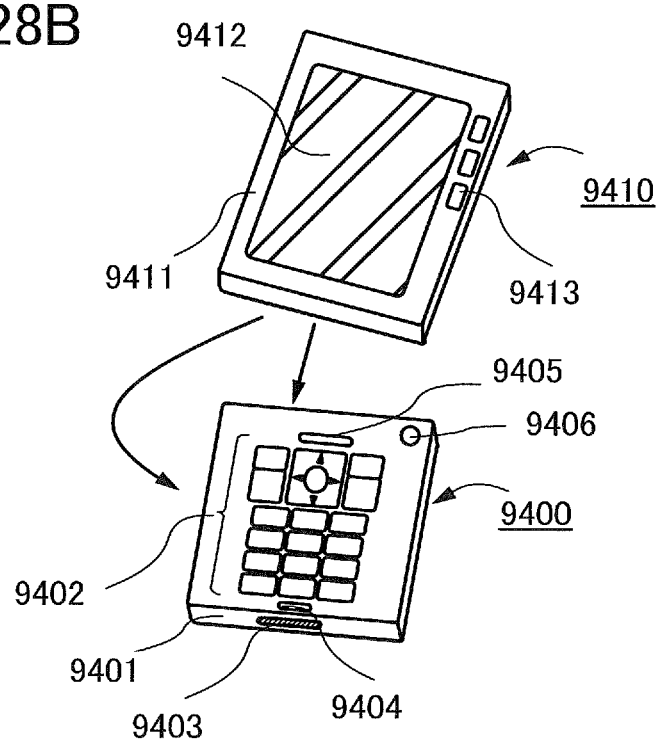

FIG. 28B illustrates another example of a cellular phone. The cellular phone in FIG. 28B has a display device 9410 provided with a housing 9411 including a display portion 9412 and operation buttons 9413, and a communication device 9400 provided with a housing 9401 including operation buttons 9402, an external input terminal 9403, a microphone 9404, a speaker 9405, and a light-emitting portion 9406 that emits light when a phone call is received. The display device 9410 which has a display function can be detachably attached to the communication device 9400 which has a phone function in two directions represented by the arrows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

This embodiment can be implemented in an appropriate combination with any of the structures described in the other embodiments.

This application is based on Japanese Patent Application serial no. 2009-080202 filed with Japan Patent Office on Mar. 27, 2009, the entire contents of which are hereby incorporated by reference.

What is claimed is:
1. A semiconductor device comprising:
a first gate electrode;
a gate insulating layer over the first gate electrode;
an oxide semiconductor layer over the gate insulating layer;
a first electrode layer and a second electrode layer in contact with the oxide semiconductor layer;
a first insulating layer over the first electrode layer and the second electrode layer;
a second insulating layer over the first insulating layer; and
a second gate electrode over the second insulating layer,
wherein the first insulating layer is a resin layer, and
wherein the second insulating layer comprises one compound selected from the group consisting of silicon nitride, silicon oxynitride, and silicon nitride oxide.

2. The semiconductor device according to claim 1, wherein a width of the second gate electrode is larger than a width of the oxide semiconductor layer in a channel width direction of the oxide semiconductor layer.

3. The semiconductor device according to claim 1, wherein the first electrode layer and the second electrode layer are over the oxide semiconductor layer.

4. The semiconductor device according to claim 3, further comprising:
 a first buffer layer between the oxide semiconductor layer and the first electrode layer, and
 a second buffer layer between the oxide semiconductor layer and the second electrode layer.

5. The semiconductor device according to claim 3, further comprising:
 a cathode electrically connected to the first electrode layer or the second electrode layer;
 a light-emitting layer over the cathode; and
 an anode over the light-emitting layer.

6. A semiconductor device comprising:
 a first gate electrode;
 a gate insulating layer over the first gate electrode;
 an oxide semiconductor layer over the gate insulating layer;
 a first electrode layer and a second electrode layer in contact with the oxide semiconductor layer;
 a first insulating layer over the first electrode layer and the second electrode layer;
 a second insulating layer over the first insulating layer; and
 a second gate electrode over the second insulating layer,
 wherein the first insulating layer is a resin layer,
 wherein the second insulating layer comprises one compound selected from the group consisting of silicon nitride, silicon oxynitride, and silicon nitride oxide, and
 wherein both the first gate electrode and the second gate electrode extend beyond side edges of the oxide semiconductor layer in a channel width direction of the oxide semiconductor layer.

7. The semiconductor device according to claim 6, wherein the second gate electrode overlaps with the oxide semiconductor layer and the first gate electrode.

8. The semiconductor device according to claim 6, wherein a width of the second gate electrode is larger than a width of the first gate electrode in a channel length direction of the oxide semiconductor layer.

9. The semiconductor device according to claim 6, wherein a width of the second gate electrode is larger than a width of the oxide semiconductor layer in a channel length direction of the oxide semiconductor layer.

10. The semiconductor device according to claim 6, wherein the second gate electrode is in a floating state.

11. The semiconductor device according to claim 6, wherein the second gate electrode is a fixed potential of 0V.

12. The semiconductor device according to claim 6, wherein the first gate electrode and the second gate electrode have the same potential.

13. The semiconductor device according to claim 6, wherein the second gate electrode is electrically connected to the first gate electrode.

14. The semiconductor device according to claim 6, wherein the first electrode layer and the second electrode layer are over the oxide semiconductor layer.

15. The semiconductor device according to claim 14, wherein one of the first electrode layer and the second electrode layer is in direct contact with the oxide semiconductor layer and the second gate electrode.

16. The semiconductor device according to claim 14, further comprising:
 a first buffer layer between the oxide semiconductor layer and the first electrode layer, and
 a second buffer layer between the oxide semiconductor layer and the second electrode layer.

17. The semiconductor device according to claim 14 further comprising:
 a cathode electrically connected to the first electrode layer or the second electrode layer;
 a light-emitting layer over the cathode; and
 an anode over the light-emitting layer.

18. A semiconductor device comprising:
 a first gate electrode;
 a second gate electrode;
 a first insulating layer over the first gate electrode and the second gate electrode;
 a first oxide semiconductor layer and a second oxide semiconductor layer over the first insulating layer;
 a first electrode layer and a second electrode layer in contact with the first oxide semiconductor layer, the second electrode layer being electrically connected to the second gate electrode;
 a second insulating layer over the first oxide semiconductor layer, the second oxide semiconductor layer, the first electrode layer, and the second electrode layer;
 a third insulating layer over the second insulating layer;
 a third gate electrode overlapping with the first oxide semiconductor layer with the third insulating layer interposed therebetween; and
 a fourth gate electrode overlapping with the second oxide semiconductor layer with the third insulating layer interposed therebetween,
 wherein the second insulating layer is a resin layer,
 wherein the third insulating layer comprises one compound selected from the group consisting of silicon nitride, silicon oxynitride, and silicon nitride oxide, and
 wherein both the first gate electrode and the third gate electrode extend beyond side edges of the first oxide semiconductor layer in a channel width direction of the first oxide semiconductor layer.

19. The semiconductor device according to claim 18, wherein both the second gate electrode and the fourth gate electrode extend beyond side edges of the second oxide semiconductor layer in a channel width direction of the second oxide semiconductor layer.

20. The semiconductor device according to claim 18, wherein a width of the third gate electrode is larger than a width of the first oxide semiconductor layer in a channel length direction of the first oxide semiconductor layer.

21. The semiconductor device according to claim 18, wherein the second electrode layer is in contact with the second oxide semiconductor layer and the second gate electrode.

22. The semiconductor device according to claim 18, further comprising:
 a first buffer layer between the first oxide semiconductor layer and the first electrode layer, and
 a second buffer layer between the first oxide semiconductor layer and the second electrode layer.

23. The semiconductor device according to claim 18, wherein a width of the third gate electrode is larger than a width of the first gate electrode in a channel length direction of the first oxide semiconductor layer.

24. The semiconductor device according to claim 18, wherein a width of the third gate electrode is larger than a width of the first oxide semiconductor layer in a channel length direction of the first oxide semiconductor layer.

25. The semiconductor device according to claim 18, wherein the third gate electrode is in a floating state.

26. The semiconductor device according to claim 18, wherein the third gate electrode is a fixed potential of 0V.

27. The semiconductor device according to claim 18, wherein the first gate electrode and the third gate electrode have the same potential.

* * * * *